(12) United States Patent
Sato et al.

(10) Patent No.: US 6,427,197 B1
(45) Date of Patent: Jul. 30, 2002

(54) SEMICONDUCTOR MEMORY DEVICE OPERATING IN SYNCHRONIZATION WITH A CLOCK SIGNAL FOR HIGH-SPEED DATA WRITE AND DATA READ OPERATIONS

(75) Inventors: Yasuharu Sato; Tadao Aikawa; Shinya Fujioka; Waichiro Fujieda; Hitoshi Ikeda; Hiroyuki Kobayashi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/394,891

(22) Filed: Sep. 13, 1999

(30) Foreign Application Priority Data

| Sep. 16, 1998 | (JP) | 10-261959 |
| Sep. 24, 1998 | (JP) | 10-269615 |
| Jul. 9, 1999 | (JP) | 11-195431 |

(51) Int. Cl.[7] .................................................. G11C 8/00
(52) U.S. Cl. ......................... 711/169; 711/167; 365/233; 365/194
(58) Field of Search ............................ 365/233, 189.05, 365/230.06, 230.08, 194; 711/169, 167

(56) References Cited

U.S. PATENT DOCUMENTS 6,064,627 A  *  5/2000  Sakurai ...................... 365/233
6,260,128 B1 * 7/2001 Ohshima et al. ............ 711/169
6,279,116 B1 * 8/2001 Lee ............................. 713/601

* cited by examiner

Primary Examiner—Jack A. Lane
(74) Attorney, Agent, or Firm—Arent Fox Kintner Plotkin & Kahn, PLLC

(57) ABSTRACT

The present invention is a memory circuit for writing prescribed numbers of bits of write data, determined according to the burst length, in response to write command, comprising: a first stage for inputting, and then holding, row addresses and column addresses simultaneously with the write command; a second stage having a memory core connected to the first stage via a pipeline switch, wherein the row addresses and column addresses are decoded, and word line and sense amps are activated; a third stage for inputting the write data serially and sending the write data to the memory core in parallel; and a serial data detection circuit for generating write-pipeline control signal for making the pipeline switch conduct, after the prescribed number of bits of write data has been inputted. According to the present invention, in an FCRAM exhibiting a pipeline structure, the memory core in the second stage can be activated after safely fetching the write data in the burst length. When writing successively or reading successively, moreover, the command cycle can made short irrespective of the burst length.

17 Claims, 30 Drawing Sheets

FIG. 1 Conventional DDR-SDRAM, FCRAM

Read Operation of Conventional DDR-SDRAM

Write Operation of Conventional DDR-SDRAM

Read Operation (Burst Length BL=4) of Conventional FCRAM

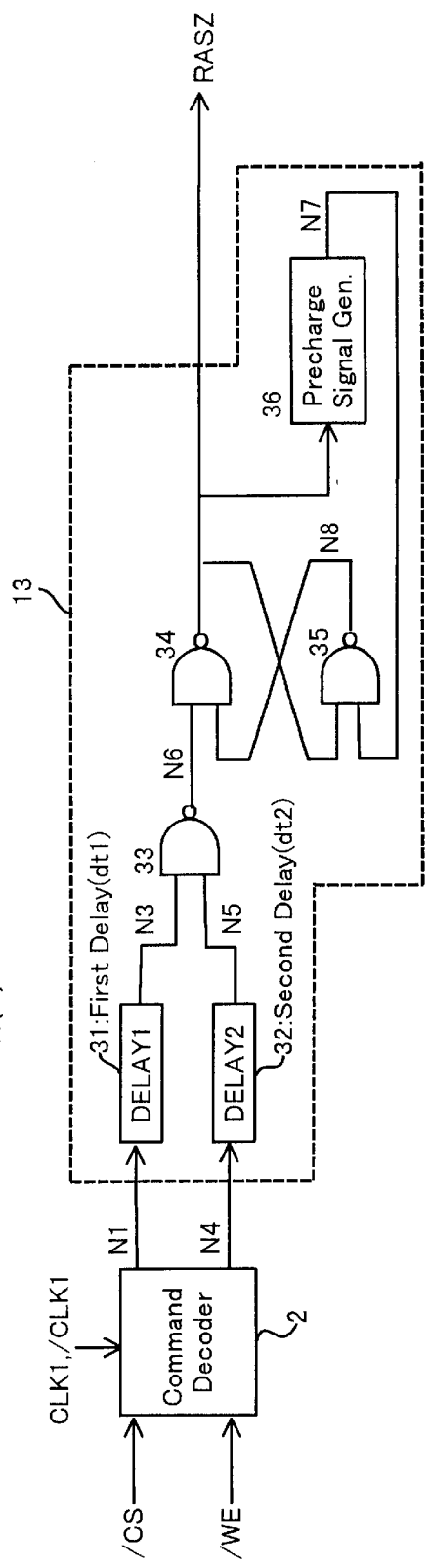
FIG. 6A RAS Generator Unit(1)
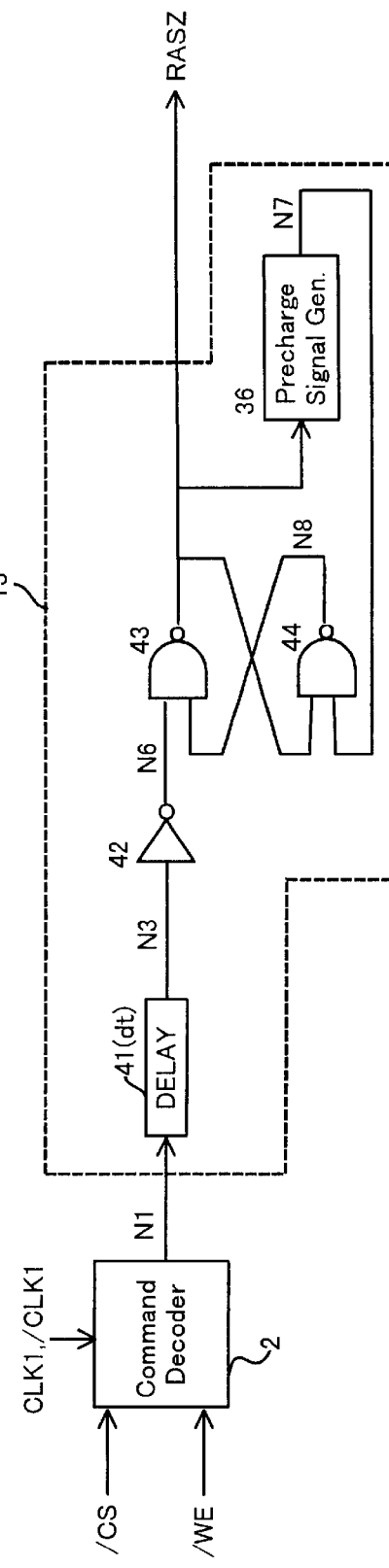
FIG. 6B RAS Generator Unit(2)
First Embodiment

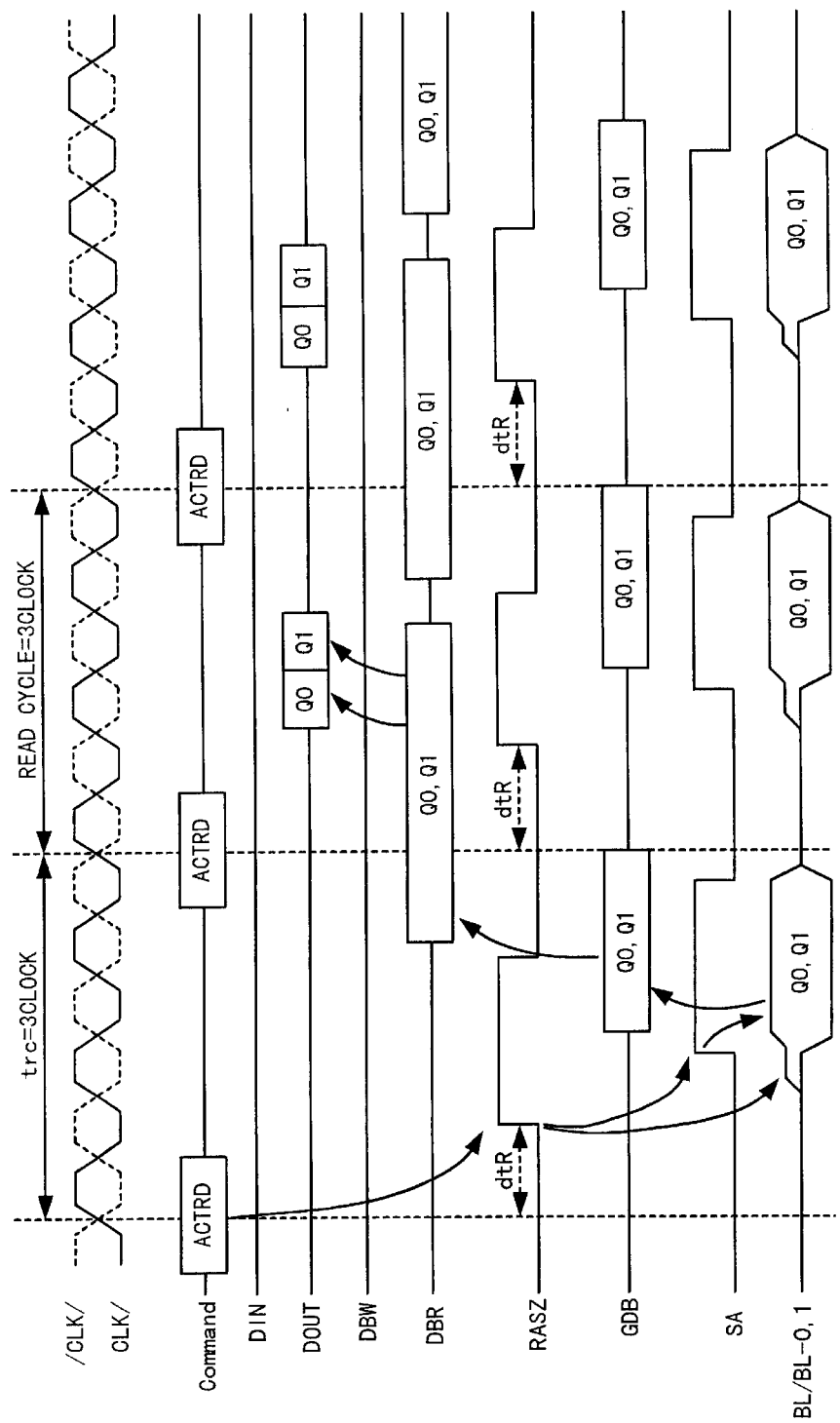

Operation Timing of First Embodiment
(Data Write-Data Read, Burst Length BL=2 fixed)

Operation Timing of First Embodiment
(Data Write-Data Write, Burst Length BL=2 fixed)

Operation Timing of RAS Generator Unit(1) of First Embodiment

Operation Timing of RAS Generator Unit(2) of First Embodiment

RAS Generator Unit of Second Embodiment

Operation Timing of Second Embodiment
(Data Write-Data Read, Variable Burst Length)

Operation Timing of RAS Generator Unit of Second Embodiment

Operation Timing of Second Embodiment (Burst Length is variable) Successive Write Operation Operation Timing of Third Embodiment
(Data Write-Data Read, Burst Length is variable)

Operation Timing of RAS Generator Unit of Third Embodiment

FIG. 18A RAS Generator Unit
FIG. 18B Mode Register

RAS Generator Unit of Fourth Embodiment

FIG. 19 Operation Timing of Sense Amplifier for each Embodiments

Basic Operation of Seial-Parallel Converter Circuit
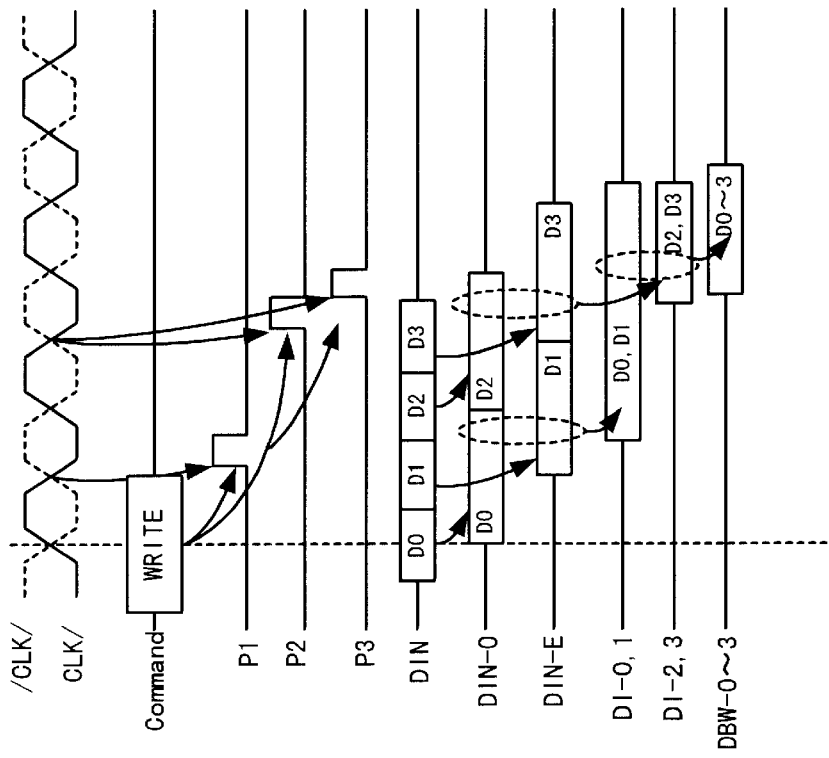
FIG. 21A(BL=2)
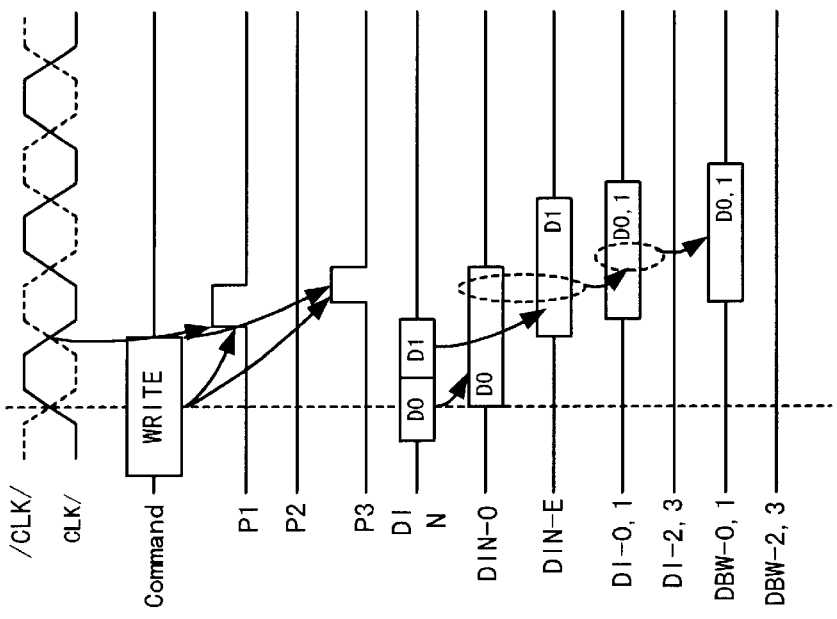
FIG. 21B(BL=4)

Serial-Parallel Converter Circuit

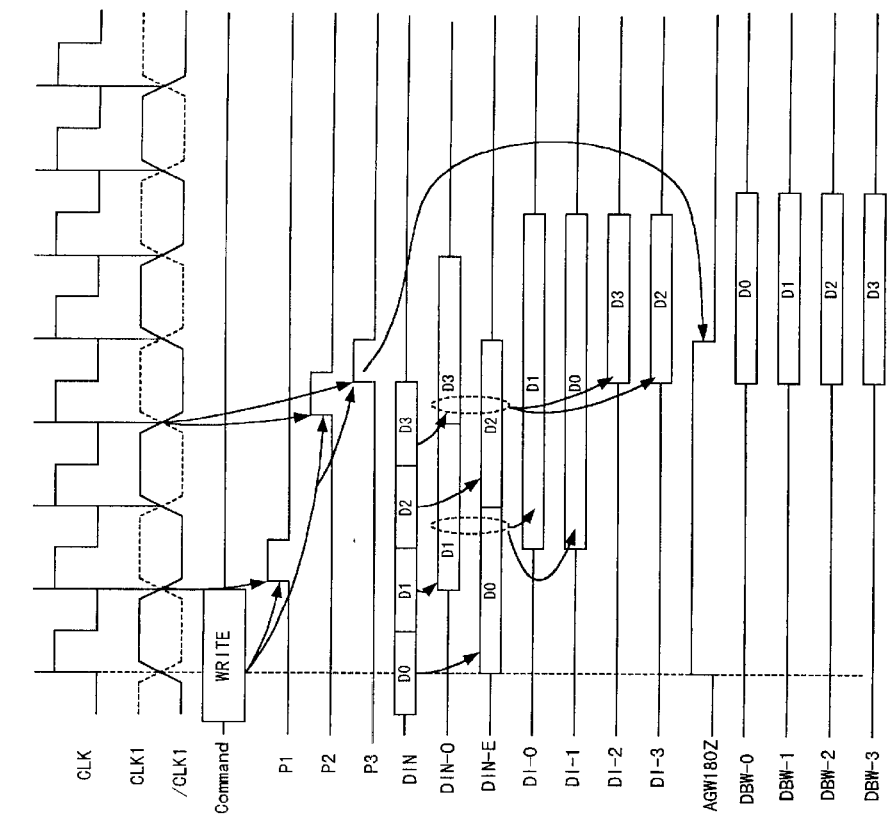
FIG. 23A(CLK1)
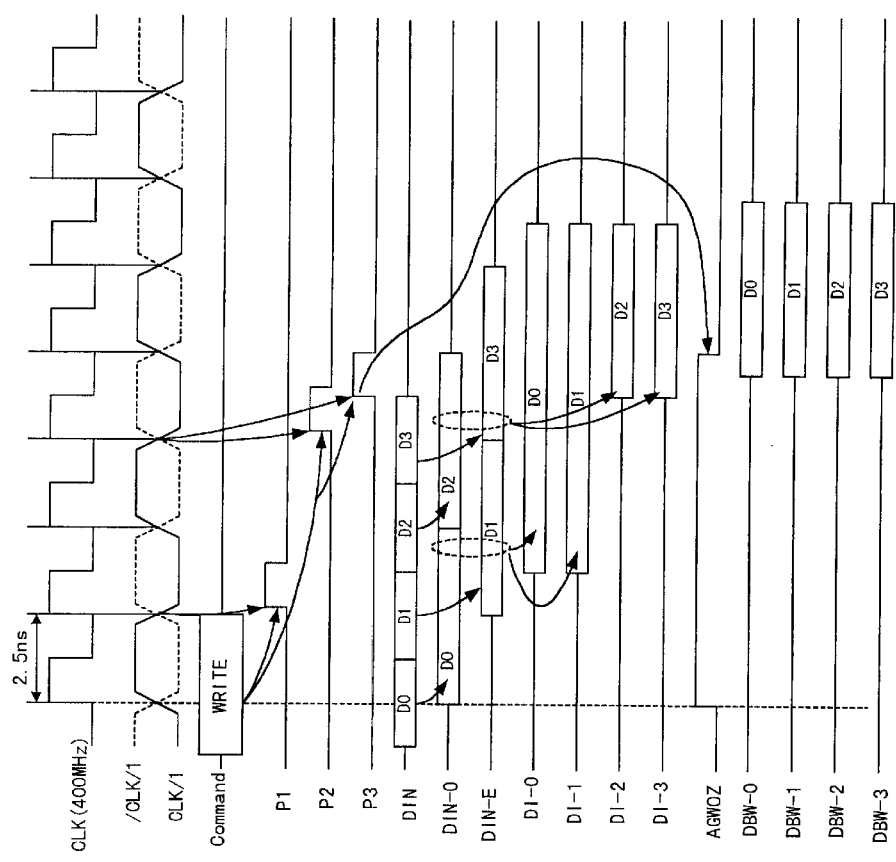
FIG. 23B(/CLK1)
Operation Timing of Serial Parallel Converter Circuit Memory Device of Modified Embodiment Timing Chart of Fig. 24

Timing Chart of Fig. 26

RAS, CAS Logic Circuit

Serial Data Detector

Pipeline Switch

SEMICONDUCTOR MEMORY DEVICE OPERATING IN SYNCHRONIZATION WITH A CLOCK SIGNAL FOR HIGH-SPEED DATA WRITE AND DATA READ OPERATIONS

BACKGROUND OF THE INVENTION

1. Field of the Invention

This invention relates to a general semiconductor memory device, and particularly to a semiconductor memory device that operates in synchronization with a clock signal.

In recent years, as CPUs have become faster, the demand has arisen for semiconductor memory devices such as the DRAM (dynamic random access memory) wherein data signals are input and output at higher signal frequencies, making them capable of sustaining faster data transfer rates.

Examples of semiconductor memory devices responsive to this demand are the SDRAM (synchronous dynamic random access memory) and FCRAM (fast cycle random access memory) which achieve high-speed operations by operating in synchronization with an externally supplied clock signal.

2. Description of the Related Art

Conventional semiconductor memory devices are now described. These descriptions relate to the operations of FCRAMs and DDR-SDRAMs (double data rate synchronous random access memories) which achieve higher speeds by performing data I/O in synchronization with the rising and falling edges of the clock signal.

In FIG. 1 is diagrammed one example configuration for the memory-cell peripheral circuitry of a DDR-SDRAM and an FCRAM. The circuit diagrammed in FIG. 1 comprises a capacitor 201, NMOS transistors 202 to 212, 223, and 224, and PMOS transistors 213, 221, and 222. The PMOS transistors 221 and 222 and the NMOS transistors 223 and 224 configure a sense amp 220. In the capacitor 201, which is a memory cell, 1 bit of data is stored.

FIG. 2 is a timing chart representing a data read operation in a DDR-SDRAM having the memory-cell peripheral circuitry diagrammed in FIG. 1. Data read timing control is now described with reference to FIG. 1 and FIG. 2.

When data are being read out, a sequence of commands is input to the SDRAM, namely a precharge command PRE for precharging the bit lines BL and /BL to a prescribed voltage, a /RAS command (corresponding to the active command ACTV in FIG. 2) for row access, and a /CAS command (corresponding to the read command READ in FIG. 2) for column access. The /RAS command selects one row-system memory cell block from the core circuitry in the SDRAM, that is, a specific word line. The /CAS command selects a specific column from the selected word line, that is, a sense amp 220. The core circuitry is such that the memory cells 201 are deployed in an array structure as respecting the row and column directions, with a sense amp 220 provided for each column. Accordingly, memory cell data corresponding to the selected word line are fetched to the sense amps 220.

When an active command ACTV that is a control signal corresponding to the /RAS signal is input, the signal RASZ, which is an internal RAS signal, is generated (i.e. goes high). The signal RASZ is a signal for activating the memory core.

The signal RASZ, moreover, is a signal that causes the level of the word lines to rise, as the memory core is activated, and then activates the sense amps. For that reason, when the active command ACTV is input, in the memory core, the levels of the word lines rise in response to the signal RASZ, and the sense amp is activated. In FIG. 1 a shared sense amp is represented. When an address is input to select a word line SW, from the precharge state wherein the bit line transfer signals BLT0 and BLT1 are high, the one bit line transfer signal BLT0 will go low, and the bit lines BL and /BL in the block on the opposite side will be cut off from the sense amp 220. Meanwhile, the other bit line transfer signal BLT1 will stay high, the transistors 203 and 204 will continue to conduct, and the bit lines BL and /BL on the right side will remain connected to the sense amp. At the same time, the precharge signal PR becomes low, and the reset states of the bit lines BL and /BL are released. When in this status the sub-word line SW is selected, the NMOS transistor 202 functioning as a cell gate conducts, and data in the capacitor 201 are read on the bit line BL (corresponding to BL-0, 1 in FIG. 2).

Next, sense amp drive signals SA1 and SA2 (corresponding to SA in FIG. 2) for driving the sense amps 220 become active (going low and high, respectively), and both the NMOS transistor 212 and PMOS transistor 213 conduct. In this state, the data on the bit lines BL and /BL are read into the sense amps 220 via the NMOS transistors 203 and 204. The sense amps 220 thus drives the bit lines BL, /BL so that the data on the bit lines BL and /BL are amplified. Thereupon, data in all memory cells corresponding to selected word line are fetched to the sense amps throughout the whole SDRAM.

Next, when a read command READ that is a control signal corresponding to the /CAS command is input, the column line selection signal CL becomes high with suitable timing in the SDRAM, and a specific column is selected. Thereupon, the NMOS transistors 210 and 211 that are the selected column gates conduct, and the amplified data on the bit lines BL and /BL are read on global data busses GDB and /GDB (corresponding to GDB-0, 1 in FIG. 2). Thereupon, the parallel data read on data busses DB and /DB (not shown in FIG. 1) (corresponding to DB-0, 1 in FIG. 2) via read buffers are converted to serial data and output as data DQ.

After that, when the precharge command PRE is input, the precharge signal PR goes high, the NMOS transistors 207, 208, and 209 conduct, and the bit lines BL and /BL are precharged to a prescribed voltage VPR. Thus, with a conventional SDRAM, the bit lines BL and /BL can be reset in preparation for the next control signal (data write or data read).

With a conventional SDRAM, therefore, the cycle from the input of the first control signal (data read) until it becomes possible to input the next control signal (data write or data read) requires 8 clocks, as indicated in the data read operation diagrammed in FIG. 2.

FIG. 3 is a timing chart representing a data write operation in a DDR-SDRAM having the memory-cell peripheral circuitry diagrammed in FIG. 1, as described earlier. The timing control for this data write operation is now described with reference to FIG. 1 and FIG. 3.

When the active command ACTV is input, as in the data read operation described above, a signal RASZ (high) that is an internal RAS signal is generated, and, internally, the memory core is activated, the levels of the word lines rise, and the sense amps are activated. When the memory core is activated, the NMOS transistor 202 conducts, and the data in the capacitor 201 are read on the bit line BL (corresponding to BL-0, 1 in FIG. 3). The operation of the peripheral circuitry diagrammed in FIG. 1 was described earlier and so is not repeated further here.

Next, the sense amp drive signals SA1 and SA2 (corresponding to SA in FIG. 3) for driving the sense amps 220 become active (going low and high, respectively), and both the NMOS transistor 212 and the PMOS transistor 213 conduct. In this state, the data on the bit lines BL and /BL are provided to the sense amps 220 via the NMOS transistors 203 and 204. By driving the sense amps 220, the data on the bit lines BL and /BL are amplified.

Next, when a write command WRITE is input, the serial data simultaneously input from the outside as the data signal DQ are converted to parallel data and output on data busses DB and /DB (corresponding to DB-0, 1 in FIG. 3). Thereupon, the parallel data output on the global data busses GDB and /GDB (corresponding to GDB-0, 1 in FIG. 3) via write buffers are written to the sense amps 220 with the timing wherewith the column line selection signal CL represented in FIG. 1 goes high, and those data are furthermore stored in the capacitor 201 via the bit line BL.

After that, when the precharge command PRE is input, the precharge signal PR goes high with suitable timing, the NMOS transistors 207, 208, and 209 conduct, and the bit lines BL and /BL are precharged to a prescribed potential VPR. Thus, in a conventional SDRAM, the bit lines BL and /BL can be reset in preparation for the next control signal (data write or data read).

Accordingly, with a conventional SDRAM, the cycle from the input of the first control signal (data write) until it becomes possible to input the next control signal (data write or data read) requires 9 clocks, as indicated in the data read operation diagrammed in FIG. 3.

With a conventional SDRAM which performs such operations (data read and data write) as described in the foregoing, when successively reading out data at the same row address (same word line), data at different column addresses can be read out sequentially by sequentially selecting different columns. More specifically, because a sense amp 220 is provided for each of a plurality of columns, these sense amps 220 accommodate data having the same row address but different column addresses. That being so, if different columns are sequentially selected and data already accommodated by the sense amps 220 are read out, data read operations can be performed successively. Similarly, when data are being written via sense amps while the same word line is selected, if different columns are sequentially selected for writing, data write operations can be performed successively.

With conventional SDRAMs, however, when data are to be successively read out from different row addresses (different word lines), or when data are to be successively written to different row addresses (that is, when random access is performed), it is necessary to newly read the data in the memory cells selected by different word lines onto the bit lines BL and /BL. And, in order to read these new data onto the bit lines BL and /BL, it is necessary first to precharge the bit lines BL and /BL. Accordingly, intervals of 8 clocks and 9 clocks, respectively, are produced from the input of the first control signal until it becomes possible to input the next control signal, as is evident from FIG. 2 and FIG. 3. This production of such large time intervals constitutes an obstacle to the implementation of high-speed data read operations and high-speed data write operations.

This state of affairs has led to the development of the FCRAM as a semiconductor memory device wherewith to realize higher speeds in the random access operations described in the foregoing. The differences between the FCRAM and the SDRAM, and the control of data read timing in the FCRAM, will now be described. The configuration of the memory-cell peripheral circuitry in the FCRAM is the same as the circuit configuration diagrammed in FIG. 1.

A first difference with the SDRAM is that, in the FCRAM, data are read out from the sense amps 220 in parallel by selecting a plurality of columns at one time. Therefore, it is sufficient to drive the sense amps 220 only for a fixed time interval, wherefore the sense amp driving time can be made constant irrespective of the burst length BL (so that, for example, the sense amp driving time is the same with both BL=1 and BL=4), so that smooth row-system pipeline action can be effected.

A second difference is that, in the FCRAM, reset operations are executed automatically by an internal precharge signal (corresponding to PRE in the SDRAM). More specifically, using the fact that sense amp operations are performed in the same period, precharging is executed with optimal timing immediately after data are read from the sense amps 220. Thus data read operations can be executed in high-speed cycles near the operating limits of the sense amps 220.

A third difference is that, with the FCRAM, in the random access read cycle, when the burst length BL=4, for example, the 4 bits of parallel data read out together from the sense amps are converted to serial data, whereupon successive, uninterrupted data read out operations are realized.

FIG. 4 shows a timing chart representing the data read operation of an FCRAM having the memory-cell peripheral circuitry diagrammed in FIG. 1 and described earlier. The data read timing control is described with reference to FIG. 1 and 4, assuming a data burst length BL=4.

When an active command ACTV (ACTVREAD in FIG. 4) is input, the FCRAM generates a signal RASZ to activate the memory core selected internally. In response thereto, in the core, word line selection signals MW and SW, a bit line transfer signal BLT, and sense amp drive signals SA1 and SA2 (corresponding to SA in FIG. 4) are generated with suitable timing. This causes data in the memory cells 201 to appear on the bit line BL (corresponding to BL, /BL in FIG. 4), to be fetched into the sense amps 220, and then to be amplified in the sense amps 220. Furthermore, in the FCRAM, an internal precharge signal PRE is automatically generated by the low level of the signal RASZ, after a prescribed time has elapsed since the receipt of the signal RASZ.

In response to the input of a read command READ (ACTVREAD in FIG. 4), moreover, the column line selection signal CL selected by the column address goes high, and data in the sense amps 220 are read out on the global data busses GDB and /GDB (corresponding to GDB in FIG. 4). The data so read are 4-bit data. These data are output to data busses DB and /DB (corresponding to DB in FIG. 4) via data read buffers, converted to serial data, and output to the outside as read data DQ (corresponding to DQ in FIG. 4).

The precharge signal PRE generated internally resets the bit line transfer signal BLT and the word line selection signals MW and SW, in an operation like that in the SDRAM when the precharge signal PRE is input from the outside, and also precharges the bit lines BL and /BL to a prescribed potential. This precharge operation resulting from the precharge signal PRE is timed to occur immediately after data are read out from the sense amps 220 by the column line selection signal CL. In the FCRAM, moreover, the active command ACTV and read command READ are input as an active read command ACTVREAD.

When the data read operation described above is executed repeatedly, the random access read cycle is shorter in the FCRAM than in the SDRAM, and, as diagrammed in FIG. 4, the cycle from the input of the first control signal ACTV until it becomes possible to input the next control signal ACTV can be significantly reduced. Thus data read operations can be done at higher speeds with the FCRAM than with the SDRAM.

With the conventional FCRAM, as described in the foregoing, all data in memory cells selected by word lines can be fetched to corresponding sense amps by generating a memory core activation signal RASZ based on the command signal input timing, and thus high-speed data read operations are realized.

However, when the memory core activation signal RASZ is generated based on the command signal input timing, the time from when a command signal is fetched until when the memory core activation signal RASZ becomes active is fixed. As a consequence, the following problems occur during data write operations.

Given a burst length of BL=4, for example, even though it is possible to write data accurately when data write operations are executed in synchronization with a clock signal of a certain frequency, there are cases where accurate write operations cannot be done with a clock signal having a lower frequency than that certain frequency. A problem arises, in other words, in that the memory core activation signal RASZ automatically becomes active after a prescribed time has elapsed, even though the data fetching frequency is low, whereupon the write operation to the sense amps begins before all the data in the burst length can be fetched, so that the remaining data are not written. Depending on the frequency of the synchronizing clock signal, moreover, this problem can arise in data write operations at all burst lengths other than BL=1.

Another problem arises in that one of the characteristics of the FCRAM, namely that the operation cycle (or command cycle) is short even in cases of random access, may be lost, depending on the burst length during write operations. Cases are conceivable, for example, where the operating frequency becomes low despite the fact that the burst length is long, in which cases it will become very difficult to effectively fetch all write data in a short operation cycle.

SUMMARY OF THE INVENTION

An object of the present invention is to provide a semiconductor memory device for effecting high-speed data write processing and data read processing, capable of accurately writing all data of settable burst lengths.

Another object of the present invention is to provide a memory circuit wherewith read operations and write command cycles can be shortened even if by limiting the freedom allowed to the burst length.

Another object of the present invention is to provide a memory device wherein the command cycle is shortened during write operations performed by random access.

Another object of the present invention is to provide a memory device wherein row addresses and column addresses are input simultaneously, and the write command cycle is shortened.

Another object of the present invention is to provide a memory device capable of effectively operating with different burst lengths, wherein the write command cycle is shortened.

Thereupon, in order to resolve the problems described in the foregoing, a first aspect of the present invention is a semiconductor memory device operating in synchronization with a clock signal, having a burst length setting circuit for setting burst length, and a control signal generator circuit for generating a control signal for activating a memory core, in response to fetched command signal; wherein the control signal generator circuit outputs the control signal in response to the timing wherewith the command signals are fetched, during data read and data write operations, with substantially the same timing irrespective of the burst length.

According to the invention described above, during read and write operations, memory core activation signals are generated, after command signal input, with equal timing unrelated to the burst length. Accordingly, a memory circuit can be provided which operates with the same command cycle during successive read operations, successive write operations, and when read and write operations are being performed alternately.

The semiconductor memory device of the present invention defines a maximum value for the burst length that can be set by the burst length setting circuit, in accordance with the frequency of the clock signal for fetching serial write data. That is, it is guaranteed that all serial data will be fetched into the device from the timing wherewith a command signal is fetched until a control signal is generated a certain interval of time thereafter and the memory core is activated. In order thereto, a maximum value of the burst length settable by the burst length setting circuit is defined that is compatible with the clock frequency. That being so, the semiconductor memory device of the present invention can accurately write all data of the set burst length, even if a memory core activation signal is generated, with equal timing that is unrelated to the burst length.

Furthermore, in a preferred embodiment of the first aspect of the present invention, the interval from the timing wherewith a write command signal is fetched until the timing wherewith the next read command signal is fetched is made the same as the interval from the timing wherewith a read command signal is fetched until the timing wherewith the next read command signal is fetched. Here the command cycle Trc, which is the interval at which command signals are input, is always constant at the minimum value. That is, the input intervals from read command to read command, from write command to write command, from read command to write command, and from write command to read command are always constant. As a consequence, a memory device can be provided wherein the command cycle is constant and short.

In another preferred embodiment of the first aspect of the present invention, when the command signal noted in the foregoing is a read command signal, the time from the timing wherewith that read command signal is fetched until data are read out is longer than the interval noted in the foregoing. Here, the memory core and a command decoder constitute a pipeline configuration, for example, in order to effect high-speed data read and data write operations.

Next, a second aspect of the present invention is a semiconductor memory device operating in synchronization with a clock signal, having a control signal generator circuit for generating a control signal for activating a memory core, based on fetched command signals; wherein the control signal generator circuit, when the command signal is read command signal, outputs the control signal in response to the timing wherewith the read command signal is fetched, and when the command signal is write command signal, outputs the control signal in response to the timing wherewith the n'th write datum in a sequence of write data in the burst length is fetched.

According to the invention described above, all data in a settable burst length can be accurately written, whereupon high-speed data write processing and data read processing is realized. The variable n noted here is an integer the maximum value whereof is the burst length. This integer may be smaller than the burst length.

In the semiconductor memory device in the second aspect of the present invention, described in the foregoing, all sererg danside the device, and the control signal generator circuit is controlled so that a control signal is generated after a certain time has elapsed since that condition was attained. Accordingly, the semiconductor memory device of the present invention can write all data in a set burst length irrespective of the clock frequency. In other words, high-speed data write processing and data read processing are realized without placing limitations on either the settable burst length or the clock frequency wherewith write data are fetched.

A preferred embodiment of the second aspect of the present invention, described above, has a burst length setting circuit (corresponding to a mode register 4 in a second and third embodiment described below) for setting the burst length for read data and write data, wherein the contator circuit outputs the control signal based on the burst length set. An example of a specific configuration for setting a discretionary burst length is here indicated.

In a preferred embodiment of the second aspect of the present invention, described above, when all the bits of the write data in a set burst length can be fetched within a specific time, the control signal generator circuit outputs the control signal in response to the timing wherewith the first bit thereof is fetched. One example of a method for generating control signal in a control signal generator circuit is here defined.

A preferred embodiment of the second aspect of the present invention, described in the foregoing, has a burst counter (corresponding to a burst counter 51 in the second and third embodiments described below) for counting the number of bits of write data fetched, and the control signal generator circuit comprised therein, when all bits in the write data of a set burst length can not be fetched within a specific time, outputs the control signal in response to the timing wherewith the n'th write datum of the write data in the burst length is fetched. Another example of a method for generating control signal in a control signal generator circuit is here defined.

In a preferred embodiment of the second aspect of the present invention, described above, the interval from the timing wherewith the write command signal is fetched to the timing wherewith the next read command signal is fetched is made the same as the interval from the timing wherewith a read command signal is fetched until the timing wherewith the next read command signal is fetched. Here, the command cycle Trc, which is the interval at which command signals are input, is defined to be a minimum value that is constant.

In a preferred embodiment of the second aspect of the present invention, described above, when the command signal is a read command signal, the time from the timing wherewith the read command signal is fetched until the timing wherewith the data are read is made longer than the interval noted in the foregoing (command cycle). It is here indicated that pipeline processing is performed in order to realize high-speed data read and data write operations.

A third aspect of the present invention is a semiconductor memory device operating in synchronization with a clock signal, having a control signal generator circuit for generating a control signal for activating a memory core, in response to fetched command signal, and a burst length setting circuit for setting burst length; wherein the control signal generator circuit has a first circuit for outputting the control signal during data read and data write operations in response to the timing wherewith the command signal is fetched, with timing unrelated to the burst length, and a second circuit for outputting the control signal during data read operation in response to the timing wherewith the command signal is fetched, and for outputting the control signal during data write operation in response to the timing wherewith the n'th write datum in a sequence of write data is fetched; and wherein the first circuit and the second circuit are switched according to the frequency of the clock signal and the set burst length.

According to the third aspect described above, all the data in a settable burst length can be accurately written, and a third specific configuration example is defined for realizing high-speed data write processing and data read processing. The variable n noted here is an integer the maximum value whereof is the burst length. This integer may be smaller than the burst length.

In the semiconductor memory device of the present invention, when operating with the first circuit, for example, a maximum value for the settable burst length is defined, for each clock frequency, in the burst length setting circuit, so that all serial data are fetched into the device by the time that a control signal is generated after a specific time has elapsed since the timing wherewith the command signal was fetched and the data in the memory cells have been read into the sense amps. Accordingly, all data in the set burst length can be accurately written. When operating with the second circuit, on the other hand, the control signal generator circuit is controlled so that all serial data are fetched into the device, and a control signal is generated after a certain time has elapsed since that state. Accordingly, in this case also, all the data in the set burst length can be accurately written in, irrespective of the frequency of the clock signal.

A fourth aspect of the present invention is a memory circuit having a prescribed burst length and operating in synchronization with a clock signal, having a memory core having a plurality of memory cells and a sense amp group connected to those memory cells via bit lines, and a control signal generator circuit for generating a control signal for activating the memory core in response to fetched command signal; wherein the control signal generator circuit, during data read and data write operations, outputs the control signal in response to the timing wherewith the command signal is fetched, after a fixed delay time, irrespective of the burst length; and the command cycle is a constant number of clocks when the data read and data write operations are performed in random fashion.

According to the fourth aspect described above, by limiting the burst length to some degree, the command cycle can be made as short as possible even when read and write operations are performed in random fashion, thus facilitating high-speed random access.

A fifth aspect of the present invention is a memory circuit having a prescribed burst length and operating in synchronization with a clock signal, comprising: a first stage for decoding command signal; a second stage, including a memory core having a plurality of memory cells and a sense amp group connected to those memory cells via bit lines, for performing pipeline operation with the first stage; and a control signal generator circuit for generating control signal for activating the memory core, based on fetched command signal; wherein the control signal generator circuit, when the command signal is a read command signal, outputs the control signal after a certain delay time following the fetching of that read command signal, and, when the command signal is a write command signal, outputs the control signals after a delay time determined according to the burst length, following the fetching of that write command signal.

A sixth aspect of the present invention is a memory circuit for writing prescribed numbers of bits of write data, determined according to the burst length, in response to write command, comprising: a first stage for inputting, and then holding, row addresses and column addresses simultaneously with the write command; a second stage having a memory core connected to the first stage via a pipeline switch, wherein the row addresses and column addresses are decoded, and word line and sense amps are activated; a third stage for inputting the write data serially and sending the write data to the memory core in parallel; and a serial data detection circuit for generating write-pipeline control signal for making the pipeline switch conduct, after the prescribed number of bits of write data has been inputted.

According to the sixth aspect of the present invention, in an FCRAM exhibiting a pipeline structure, the memory core in the second stage can be activated after safely fetching the write data in the burst length. When writing successively or reading successively, moreover, the command cycle can made short irrespective of the burst length.

BRIEF DESCRIPTION OF THE DRAWINGS

FIG. 6A diagrams an example circuit for an RAS generator unit (1) and FIG. 6B diagrams an example circuit for an RAS, generator unit (2) in a first embodiment;

FIG. 7 diagrams operation timing (data read to data write timing with fixed burst length BL=2) in the first embodiment;

FIG. 21A and FIG. 21B diagram basic operations in a series-parallel converter circuit;

FIG. 23A and FIG. 23B diagram operation timing for a series-parallel converter circuit;

DESCRIPTION OF THE PREFERRED EMBODIMENTS

Embodiments of the present invention are now described with reference to the drawings. It should be noted, however, that the present invention is not limited to or by the following embodiments.

Figure 5:
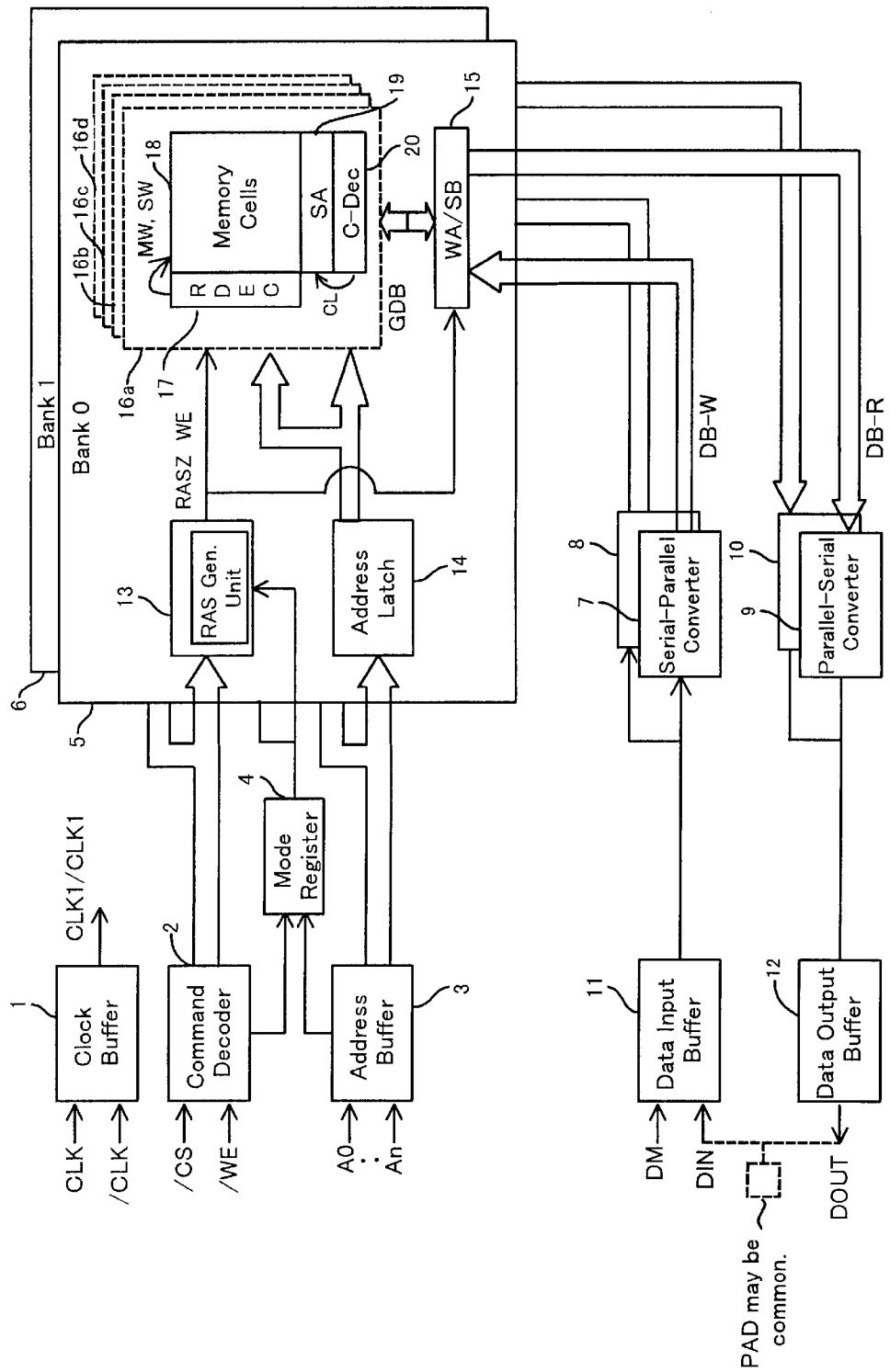
FIG. 5 diagrams an example configuration of a semiconductor memory device of the present invention.

FIG. 5 diagrams an example configuration of a semiconductor memory device of the present invention which operates in synchronization with clock signals CLK1 and /CLK1, specifically diagramming an FCRAM of the present invention.

The semiconductor memory device of the present invention, as diagrammed in FIG. 5, comprises a clock buffer 1, command decoder 2, address buffer 3, mode register 4, bank-0 circuit 5, bank-1 circuit 6, bank-0 serial-parallel converter circuit 7, bank-1 serial-parallel converter circuit 8, bank-0 parallel-serial converter circuit 9, bank-1 parallel-serial converter circuit 10, data input buffer 11, and data output buffer 12. Comprised internally in the bank-0 circuit 5 and bank-1 circuit 6, moreover, are multiple memory cell blocks (memory cell blocks 16a, 16b, 16c, and 16d being indicated, hereinafter simply called blocks) each comprising memory cells 18 arrayed in a matrix, a row decoder 17, a sense amp 19, and a column decoder 20, together with an RAS generator unit 13, address latch 14, and write amp/sense buffer 15.

The FCRAM has a first stage configured with the block buffer 1, command decoder 2, address buffer 3, and mode register 4, a second stage configured with the bank circuits 5 and 6 (memory core), and a third stage configured with the serial-parallel circuits 7 and 8, parallel-serial circuits 9 and 10, data input buffer 11, and data output buffer 12. These stages perform pipeline operations. Between these stages are provided pipeline gates which are opened with prescribed timing.

In the semiconductor memory device of the present invention configured as described in the foregoing, bank interleaving operations are automatically performed internally, multiple blocks are selectively activated, and higher speeds are realized therein in terms both of the speed of reading data stored in the blocks and of the speed of writing data to those blocks.

In the semiconductor memory device of the present invention, furthermore, a cell matrix (core circuit) covered with memory cells in a matrix configuration is divided into a plurality of bank units (diagrammed in the drawings as the bank-0 circuit 5 and the bank-1 circuit 6). The cell matrix thus divided into banks also forms blocks 16a, 16b, 16c, and 16d wherein multiple memory cells are deployed in the row and column directions. Each block has a sense amp 19 in each column unit. The semiconductor memory device of the present invention diagrammed in FIG. 5 is represented in a two-bank configuration, but the bank configuration in the device is not limited thereby.

The functions of the components making up the semiconductor memory device of the present invention, as described above, are now described. The clock buffer 1 has input thereto a clock signal CLK from the outside and supplies a synchronizing clock signal CLK1, /CLK1 to the components configuring the device. To the command decoder 2 are input, from the outside, command signals such as a write enable signal WE and chip select signal /CS. The command decoder 2 decodes these command signals and supplies corresponding control signals (described below) to the bank circuits. Signals are negative-logic signals if denoted by a / (slash) mark; otherwise they are positive-logic signals. The address buffer 3 receives memory address signals A0–An from the outside, those address signals being decoded so as to select banks to be accessed. In the present embodiment, either the bank-0 circuit 5 or the bank-1 circuit 6 is selected. The variable n for input address signals is an integer determined according to memory capacity.

The mode register 4 comprises a register (or, alternatively, settings made by fuses, switches, or wire bonding) for setting data burst lengths in data write and data read operations. This mode register 4 generates burst length information based on burst lengths set externally. Alternatively, if the burst length is set at a fixed value, no burst length settings are performed in the mode register 4.

The data input buffer 11 receives serial data that are write data and buffers those data as serial data capable of being internally processed. The serial-parallel converter circuits 7 and 8 convert the serial data received in the data input buffer 11 to parallel data with prescribed timing. The parallel-serial converter circuits 9 and 10 convert the parallel data read out from the blocks to serial data. The data output buffer 12 receives serial data from the parallel-serial converter circuits and outputs those data after buffering to facilitate external processing.

The internal configuration and functions of the banks selected via the address buffer 3 are described next. The description given here is for the bank-0 circuit 5 diagrammed. The configuration and functions of the bank-1 circuit 6 having the same configuration as the bank-0 circuit 5 are noted by the same symbols and are not further described. In the bank-0 circuit 5, the RAS generator unit 13 generates activation signal RASZ to activate the memory core in the banks. The RAS generator unit 13 generates signal for activating the structures in the blocks, and also automatically precharges the interior after a certain time has elapsed following the start of block activation.

The address latching circuit 14 latches and pre-decodes supplied address signals, and selects single blocks from among the plurality of blocks 16a–16d deployed in the bank. The write amp/sense buffer 15 (hereinafter simply called the sense buffer 15), when data are being read, takes in parallel data read out from selected memory blocks, buffers those parallel data to yield signals capable of processing by circuitry downstream therefrom, and outputs those data onto a read data bus DB-R. When data are being written, on the other hand, the sense buffer 15 buffers the received parallel data to yield signals capable of processing in the blocks and outputs those data onto a global data bus (GDB).

The configuration and functions performed in the blocks selected by the address latching circuit 14 noted in the foregoing are described next. The description given here pertains to block 16a, as diagrammed. The configurations and functions of the blocks 16b, 16c, and 16d having the same configuration as the block 16a are indicated by the same symbols and are not described further. In block 16a, the row decoder 17 generates word line selection signals for selecting word line corresponding to the address signals A0–An. The sense amps 19 are supplied with, via bit lines, the data in all of the memory cells connected to the word line selected by the word line selection signals, and amplify those data. The column decoder 20 generates a column line selection signal CL for selecting the data held in the plurality of sense amps noted earlier, selecting a plurality of bits simultaneously.

The semiconductor memory device diagrammed in FIG. 5 begins a data read operation in response to the clock signal CLK, a combination (active read) of active command ACT, and read command RD, and the input of address signals A0–An.

Basic data read operations (when the burst length BL=4, for example) in the semiconductor memory device in an example of the embodiment are now described with reference to FIG. 5. The clock signal CLK is continually supplied, as the global internal clock signal CLK1, to the configuring internal components in order to synchronously control the operations in the semiconductor memory device. The active command ACT and the read command RD are input as a single command, namely the active read command ACTRD. This is decoded by the command decoder 2, and the RAS generator unit 13 is controlled according to the decoding results. Alternatively, the active command ACT and the read command RD may be received in one packet format which extends across two cycles. The address signals A0–An are supplied to the address latch 14 via the address buffer 3. Portions of the addresses fetched by the address buffer 3 are decoded by a bank decoder (not shown), whereupon a bank is selected for executing a data read operation. The description here assumes the selection of the bank-0 circuit 5.

The RAS generator 13, as soon as an active read command ACT+RD is input, generates a memory core activation signal RASZ that is an internal RAS signal. That is, it generates the signal RASZ based on the timing wherewith the command signal is fetched. The RAS generator unit 13 is also a circuit for executing refresh operations by successively generating, internally, the signal RASZ when a refresh command is input, but generating only a single RASZ signal when the active read command ACT+RD is input. The generated signal RASZ is a signal for activating the memory core and as such is supplied to blocks to be accessed.

With the RAS generator unit 13, furthermore, in response to the signal RASZ, one or other block in the bank-0 circuit 5 is activated, and, simultaneously, the sense amp 19 and sense buffer 15 are activated. Moreover, after a certain time has elapsed following the start of a block activation, the RAS generator unit 13 automatically cause the internal circuit to precharge. This precharge operation resets and precharges the RAS generator unit 13 in the same manner as when a precharge signal is supplied from the outside. This precharging operation that is automatically executed internally is hereinafter called auto-precharging.

In the address latching circuit 14, as soon as address signals A0–An are received, one of the plurality of blocks 16a, 16b, 16c, and 16d deployed inside the bank-0 circuit 5, say block 16a, for example, is selected. With this address buffer circuit 14, furthermore, the row decoder 17 is controlled, and word line is selected with suitable timing. Inside the bank-0 circuit 5, the row decoder 17 is only activated in the selected block 16a, the data in all of the memory cells in the block 16a connected to a selected word line are read out, and those data are individually accommodated in the sense amps 19.

The address latching circuit 14, furthermore, controls the column decoder 20 so that columns are selected with suitable timing. The column decoder 20 supplies a plurality of columns (with fixed bit count) designated for access, such as four columns, for example, with column selection signal CL, so that 4-bit parallel data from the sense amps 19 of those columns are read, and are supplied to the sense buffer 15 via the global data bus (GDB). The sense buffer 15 amplifies the 4-bit parallel data read in and supplies those data via a read data bus (DB-R) to a parallel-serial converter circuit 18a. The amplified 4-bit parallel data are converted to serial data in the parallel-serial converter circuit 9 and read out to the outside via the data output buffer 12.

Thus the semiconductor memory device of the present invention, when data are being read, selects a plurality of columns at one time, and thereby reads out multiple bits of parallel data from the sense amps 19. For this reason, the sense amps 19 need be driven only for a fixed (constant) time period, the time period of sense amp operation is made constant irrespective of the burst length BL (so that, for example, the sense amp operating time will be the same with both BL=1 and BL=4), making it possible to execute smooth row-system pipeline operations. As a consequence, when random read operations are done successively, the command cycle in the FCRAM becomes as short as it can be made.

In the semiconductor memory device of the present invention, moreover, precharging can be effected with optimal timing, immediately after data are read out from the sense amps 19, by executing automatic precharges utilizing the fact that the sense amp operating times are identical. For this reason, it is possible to execute data read operations in high-speed cycles near the operating limits of the sense amps 19.

The basic data read operations in the semiconductor memory device of the present invention are described in the foregoing. When the memory core activation signal RASZ is generated on the basis of the command signal fetch timing, as described, the time from the fetching of a command signal until the signal RASZ becomes active is fixed, wherefore the following factors need to be considered when data are being written.

When the burst length BL=4, for example, although data can be accurately written when the data write operations are performed in synchronization with a clock signal of a certain frequency, it is conceivable that it may not be possible to write data accurately with clock signals having a lower frequency than that clock signal. That is, cases are conceivable wherein, when the frequency wherewith data are fetched is low, due to the fact that the signal RASZ becomes active automatically after a certain time has elapsed, writing to the sense amps 19 will begin before all of the write data in the burst length have been fetched, so that the remaining data do not get written.

Figure 12:
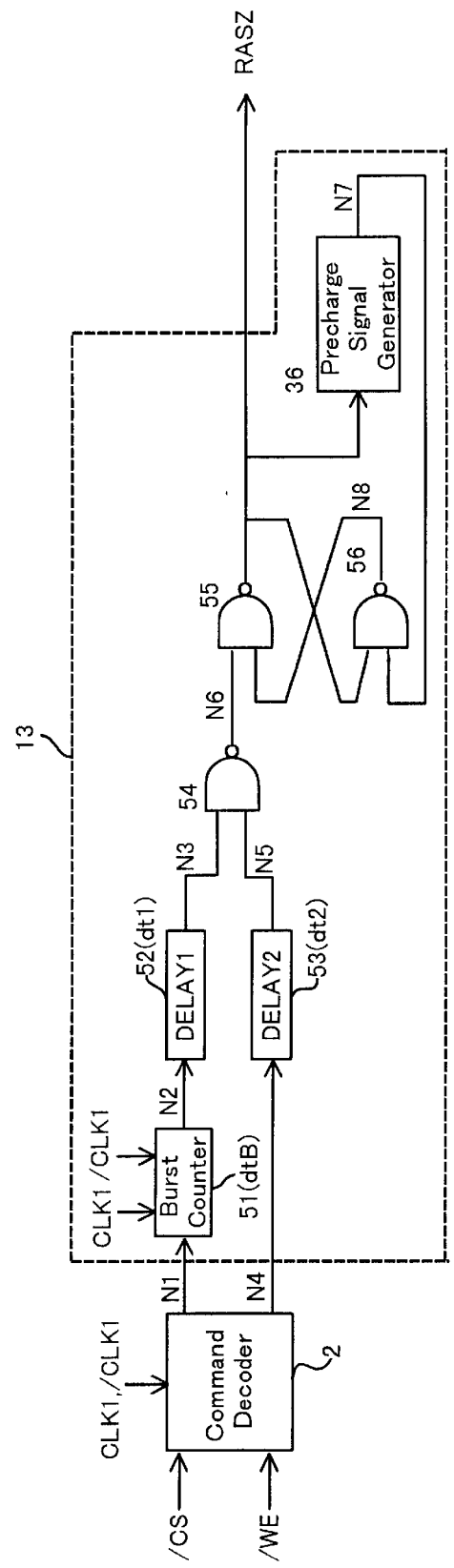
FIG. 12 diagrams an example circuit for an RAS generator unit in a second embodiment.
Figure 18:
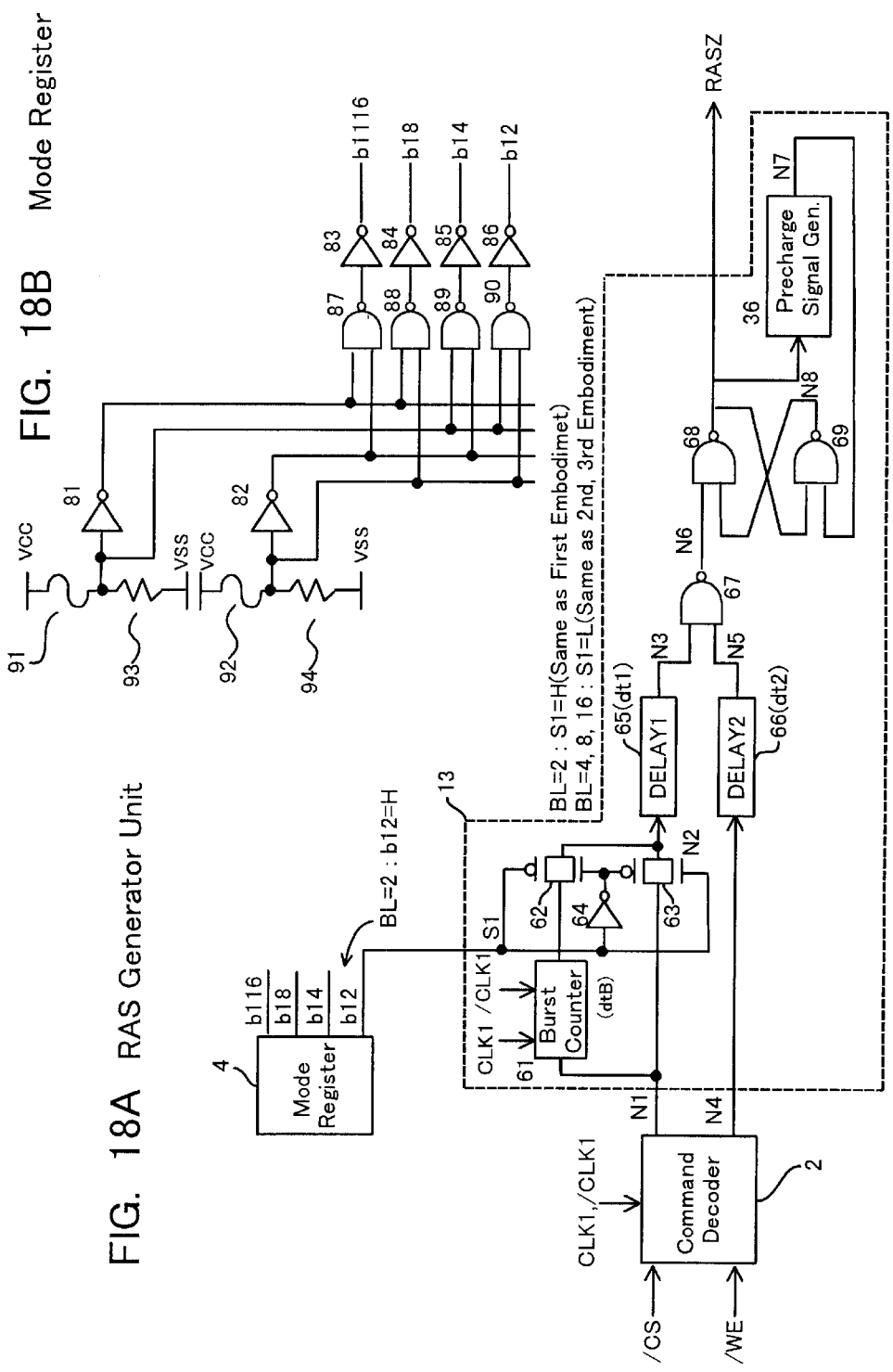
FIG. 18A diagrams an example circuit for an RAS generator unit and FIG. 18B diagrams an example circuit for a mode register in a fourth embodiment.

That being so, in the semiconductor memory device diagrammed in FIG. 5, the RAS generator unit 13 is given the circuit configuration diagrammed in FIG. 6 (first embodiment), FIG. 12 (second and third embodiments), or FIG. 18 (fourth embodiment), so that all write data in the burst length set can be written. These embodiments, from the first to the fourth, are hereinafter described in detail, with reference to the drawings. The memory cells (such as the memory cells 18 diagrammed, for example) in these embodiments exhibit a DRAM-type cell structure, for example, and the memory-cell peripheral circuitry in these embodiments is configured in the same way as diagrammed in FIG. 1, described earlier.

First Embodiment

In FIG. 6A and 6B, respectively, are diagrammed example circuits 1 and 2 for the RAS generator unit 13 in the first embodiment.

In the RAS generator unit 13 diagrammed in FIG. 6A, the signal RASZ generation timing is set separately for data read operations and data write operations, while in the RAS generator unit 13 diagrammed in FIG. 6B, the signal RASZ generation timing is set the same for both data read operation and data write operation. The RAS generator unit 13 diagrammed in FIG. 6A has a configuration that comprises a first delay circuit 31, a second delay circuit 32, NAND gates 33, 34, and 35, and a precharge signal generator circuit 36. This RAS generator unit 13 generates memory core activation signals RASZ based on command signals /CS and /WE fetched in synchronization with clock signals CLK1 and /CLK1 in the command decoder 2. The RAS generator unit 13 diagrammed in FIG. 6B has a configuration that comprises a delay circuit 41, inverter 42, NAND gates 43 and 44, and precharge signal generator circuit 36, and generates memory core activation signals RASZ in the same manner as the RAS generator unit 13 diagrammed in FIG. 6A.

In the FCRAM, as described in the foregoing, the memory circuit is separated into three stages, and, by performing pipeline operations therewith, the command cycle is shortened, so that access times can be shortened even in random access mode. What needs to be given careful consideration, in this case, is the burst length. In read operations, the burst length only influences the operation of the third output stage, and has no effect on the timing of the memory core activation signal RASZ which is the timing of the activation of the second stage that includes the memory core. Accordingly, the memory core activation signal RASZ can be generated in response to the active read command, after a prescribed delay, and the command cycle can be made a short cycle as prescribed.

In write operations, however, the burst length does influence the operation in the input stage, wherefore it is desirable to delay, by that amount, the activation timing for the second stage that includes the memory core. When write operations are done successively, the command cycle can be shortened to the same level as for read operations by effecting pipeline operations, irrespective of the burst length, even when a memory core activation signal is delayed. However, in cases where a read operation is performed after a write operation, the time between the active write command and the active read command becomes longer than a normal short cycle.

That being so, in the first embodiment, the timing wherewith the memory core activation signal RASZ is generated in the FCRAM is either made the same for both read and write operations, or the timings are respectively fixed, and the command cycle is made as short as possible, making the command cycle constant or keeping it within a certain range, regardless of whether a read operation, write operation, or combination operation involving both is being performed.

A first FCRAM which satisfies the conditions noted above is an FCRAM wherein the burst length is set fixedly at a prescribed short value, say BL=2, for example. This example corresponds to the RAS generator unit (2) 13 diagrammed in FIG. 6B. In this case, one specification of the FCRAM is that the frequency of the operating clock signal be no less than a prescribed value. Accordingly, so long as the FCRAM operates within this specification, the burst length may be BL=2 or BL=1.

There is a second FCRAM which satisfies the conditions noted above wherein the settable burst length is limited to burst lengths compatible with the frequency of the operating clock signal, such as BL=4 or shorter. This example corresponds to the RAS generator unit (1) 13 diagrammed in FIG. 6A. In this case, the FCRAM, in terms of its specifications, exhibits some degree of leeway for the selection of burst lengths that are compatible with the operating clock frequency. The delay in the memory core activation signal RASZ during a write operation can be set longer than when performing a read operation, and a burst length and operating clock frequency can be selected to match that delay time. In this case also, the delay time of the first delay circuit 31 is fixed, thus guaranteeing that the command cycle will be within a certain range. When the frequency becomes higher, the usable burst length can be made longer, for example, but when the frequency becomes lower, it will be necessary to shorten the usable burst length. If the clock is running at 100 MHz, for example, and serial data can be fetched into the device with burst lengths up to BL=4, values for BL=4 or less can be set in the mode register 4. Accordingly, when synchronizing with a clock running at 50 MHz, the maximum settable burst length will be BL=2.

In the first embodiment described in the foregoing, the timing wherewith the memory core activation signal RASZ is generated is delayed a fixed amount of time after command input, wherefore the maximum value of the usable burst length is made a fixed value that accords with the frequencies of the clock signals CLK1 and /CLK1. By fixing the timing of the memory core activation signal RASZ, the command cycle in the FCRAM can be made a certain length of maximum shortness.

Figure 10:
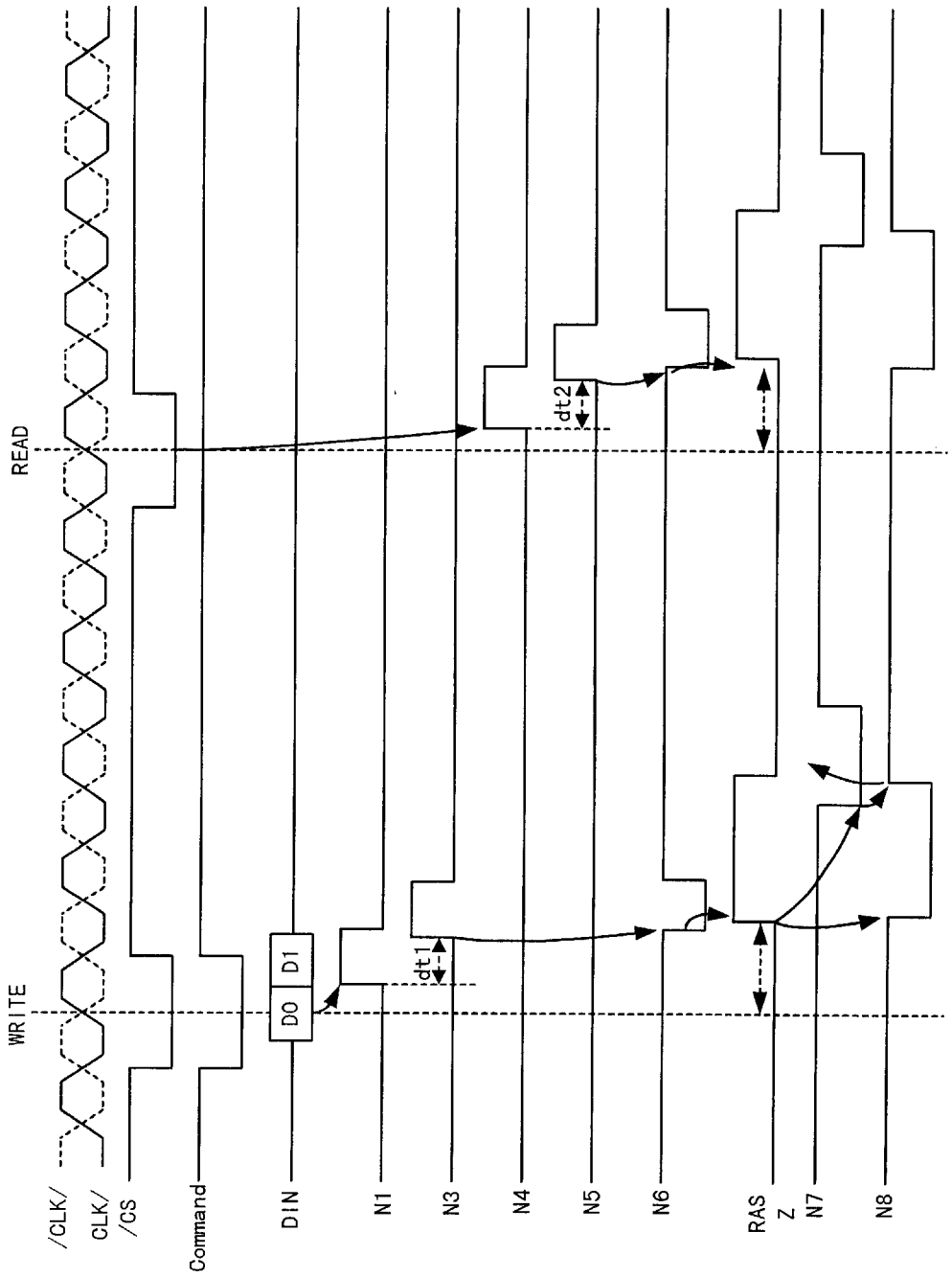
FIG. 10 diagrams internal operation timing in an RAS generator unit (1) in the first embodiment.

FIG. 7 diagrams the operation timing of the semiconductor memory device in the first embodiment. More specifically, it diagrams the operation timing when data read operations are executed successively in a state where the burst length BL=2. FIG. 10 diagrams the operation timing for the RAS generator unit diagrammed in FIG. 6A, and FIG. 11 diagrams the operation timing for the RAS generator unit diagrammed in FIG. 6B. The operation of the first embodiment is now described in conjunction with FIG. 7, FIG. 10, and FIG. 11.

The case of the RAS generator unit diagrammed in FIG. 6A is described first. When an active command ACT and a read command RD are input as a single command, namely the active read command ACTRD, to the command decoder 2, the RAS generator unit 13 generates a memory core activation signal RASZ. In response to this memory core activation signal RASZ, inside the memory core, word line is driven, sense amps are activated, and, last of all, a precharge operation is performed automatically.

First, as diagrammed in FIG. 10, the command decoder 2 outputs a high pulse on the node N4 due to the input of a read command. In the RAS generator unit 13 that receives this high pulse on the node N4, a prescribed delay dt2 is added to that high pulse by the second delay circuit 32, and this is output on the node N5. The NAND gate 33 that receives this high pulse on the node N5 inverts that pulse and outputs the resulting low pulse on the node N6. This low pulse is input on the setting side of an RS-FF configured by the NAND gates 34 and 35, and a high level memory core activation signal RASZ is generated. Simultaneously, the activation signal RASZ is input to the precharge signal generator circuit 36 (see data read operation of READ in FIG. 10). The prechcarge signal generator 36, as will be described subsequently, reset the RS-FF and renders the activation signal RASZ low.

Figure 11:
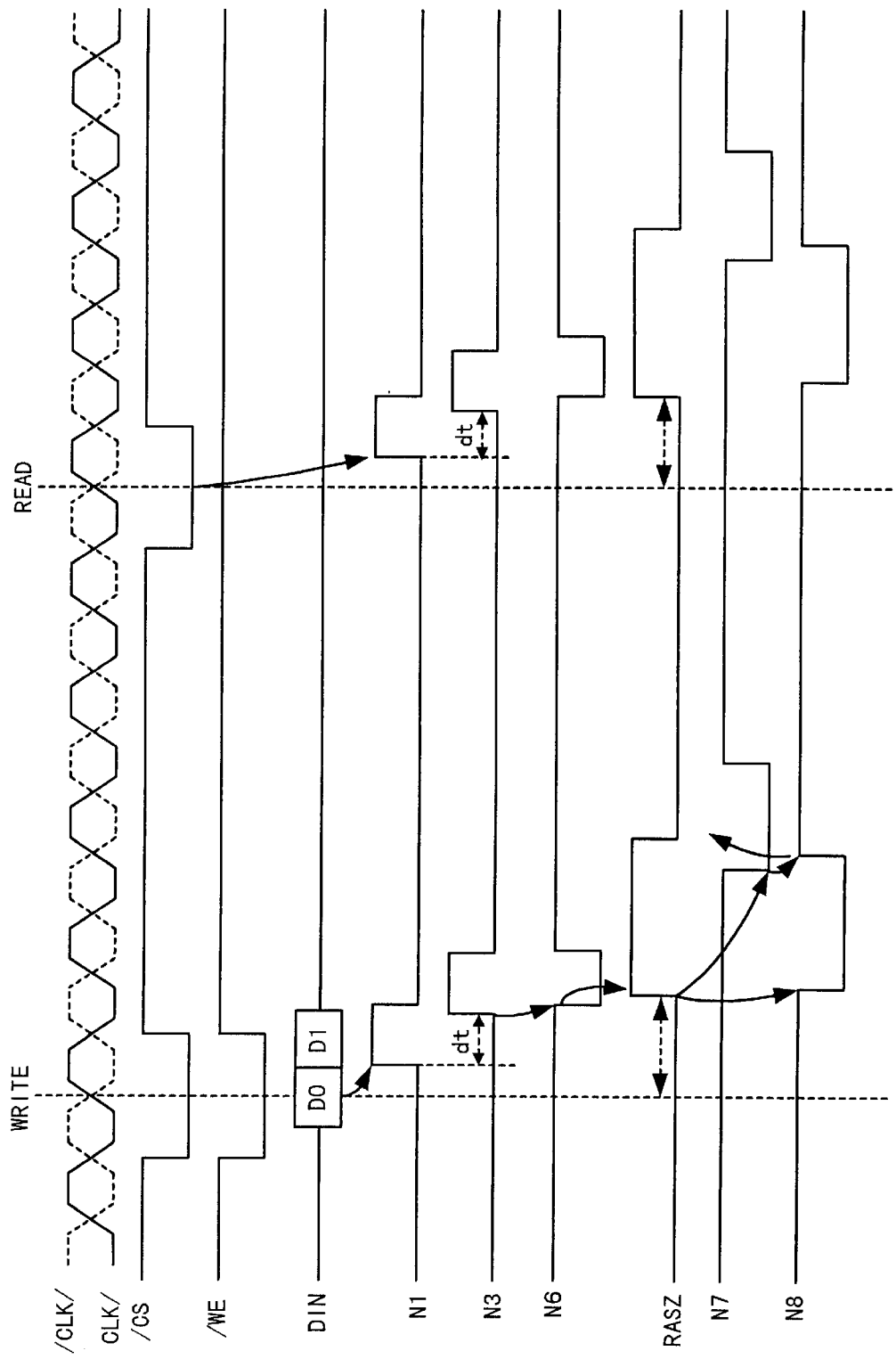
FIG. 11 diagrams internal operation timing in an RAS generator unit (2) in the first embodiment.

The operation of the RAS generator unit 13 diagrammed in FIG. 6B can be described by respectively substituting, in the description of the operation in FIG. 10 noted above, the delay circuit 41 for the first delay circuit 31 and the second delay circuit 32, the node N1 for the node N4, the node N3 for the node N5, and the inverter 42 for the NAND gate 33. However, as indicated in FIG. 11, the delay circuit 41 is a common circuit, wherefore the delay time dt will be the same for both the read command READ and the write command WRITE. Accordingly, the operations thereafter are only described for the RAS generator unit 13 diagrammed in FIG. 6A, and no further description for the RAS generator unit 13 diagrammed in FIG. 6B is given here.

Figure 1:
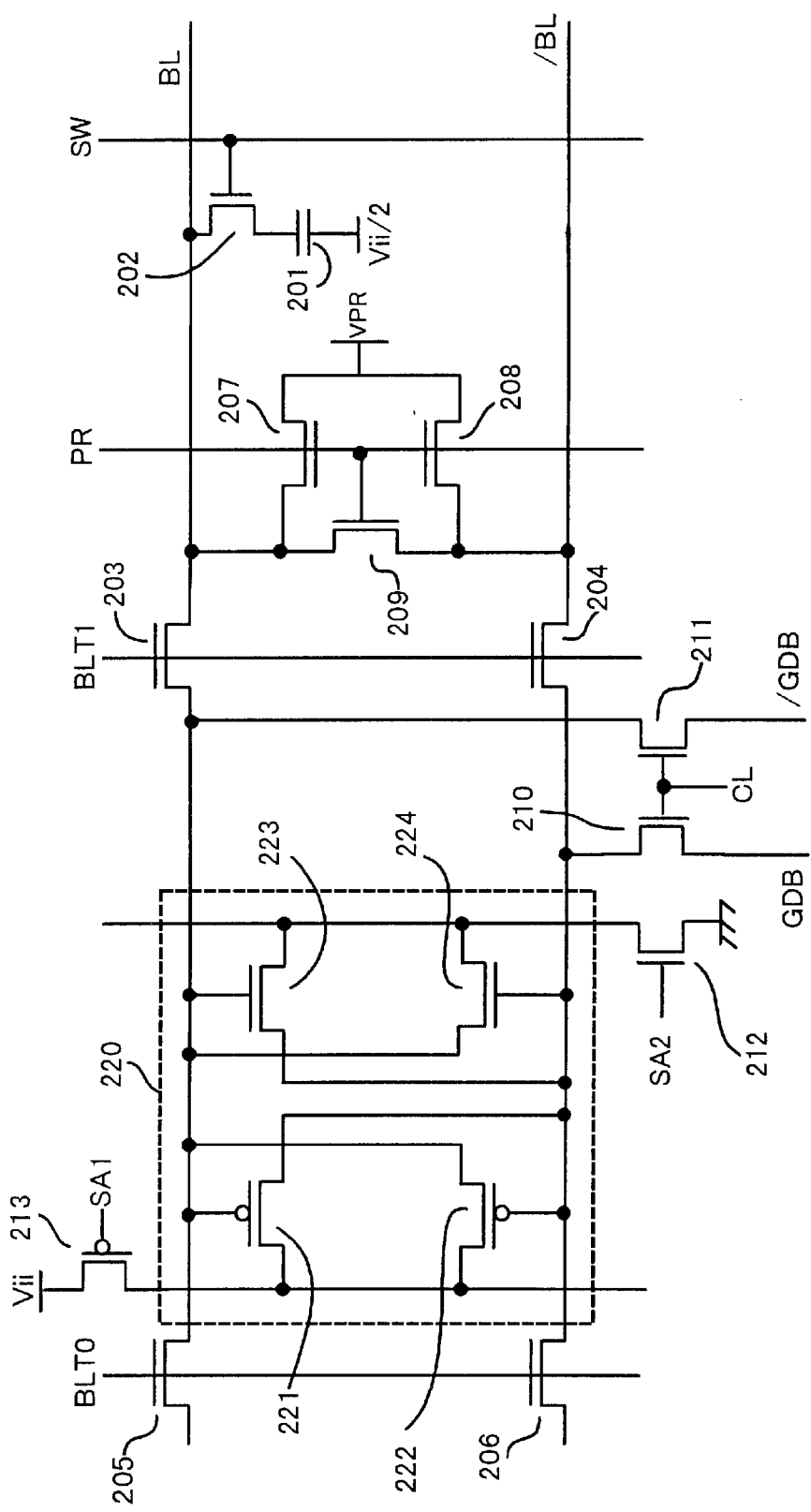
FIG. 1 diagrams an example configuration of memory-cell peripheral circuitry in a conventional DDR-SDRAM.

As described in the foregoing, when the control signal RASZ output from the RAS generator unit 13 goes high, inside the block 16a, the word line selection signals MW and SW, bit line transfer signal BLT, and sense amp drive signals SA1 and SA2 (corresponding to SA in FIG. 7) are generated with suitable timing, as indicated in the memory-cell peripheral circuitry diagrammed in FIG. 1. As a consequence, the data in memory cells 201 (corresponding to the memory cells 18 in FIG. 5) appear on the bit line BL (corresponding to BL in FIG. 7), are fetched to sense amps 220 (corresponding to the sense amps 19 in FIG. 5), and amplified in the sense amps 220.

In the precharge signal generator circuit 36, autoprecharge processing is performed with prescribed timing, based on the high level of the control signal RASZ previously input. More specifically, the precharge signal generator circuit 36 outputs a low pulse on the node N7 with prescribed timing, resets the RS-FF formed by the NAND gates 34 and 35, and restores the control signal RASZ to low (cf. data read operation diagrammed in FIG. 10 and RASZ diagrammed in FIG. 7).

Also, in response to the input of the read command RD, the data in the sense amps 19 selected by the column line selection signal CL corresponding to the column address are read out on the global data bus GDB. The data read out are 2-bit parallel data. These data are output via the sense buffer 15 onto the data bus DB-R, converted to serial data by the parallel-serial converter circuit 9, and output to the outside as read data DOUT 0–7. The read data are defined as 8-bit data for convenience only, and are not limited thereto. In this example, however, the burst length is 2, wherefore only read data DOUT 0 and DOUT 1 are output.

Figure 2:
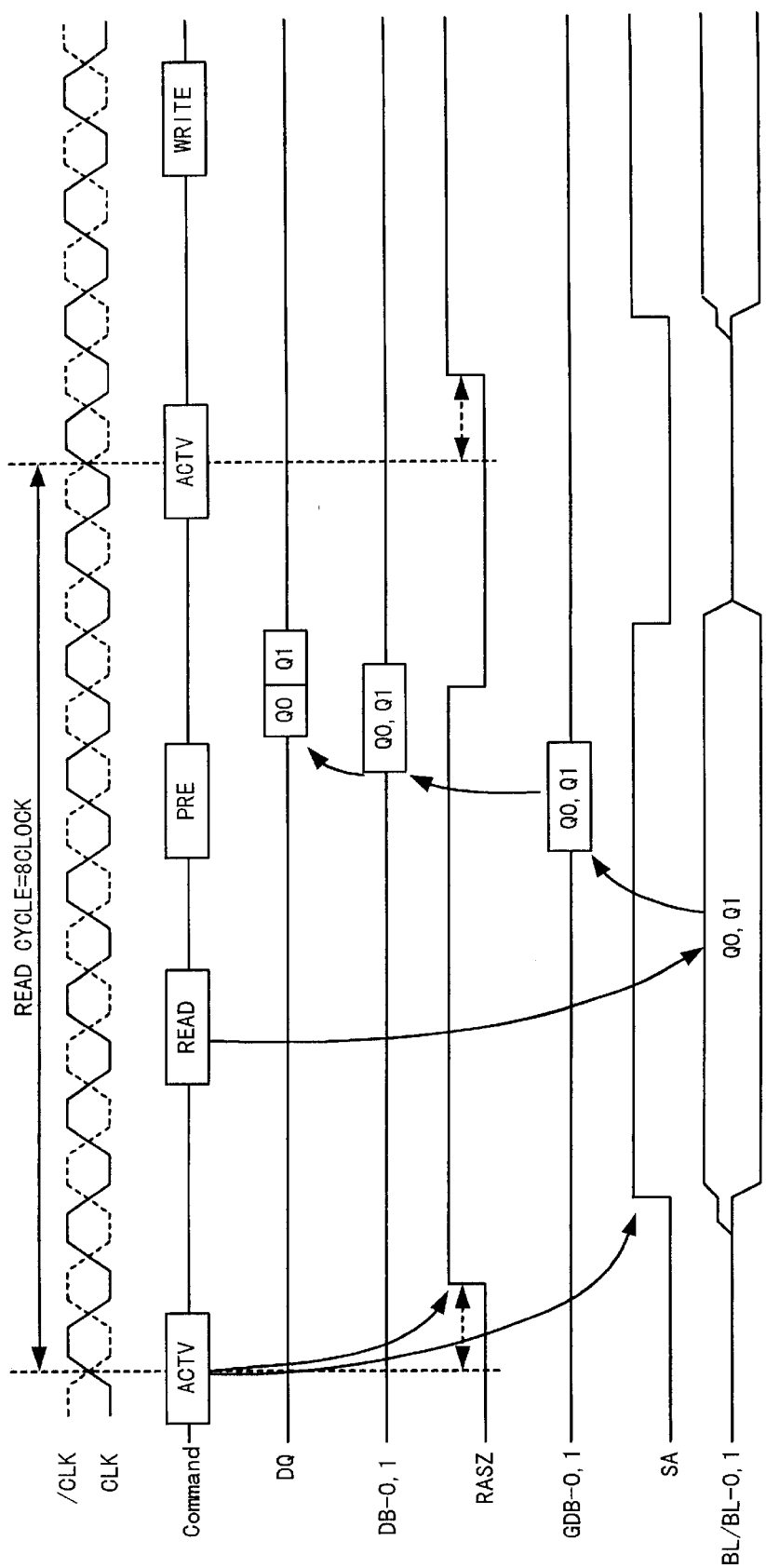
FIG. 2 diagrams data read operation timing in a conventional DDR-SDRAM.

When such data read operations are executed repeatedly, as diagrammed in FIG. 7, for example, the delay time dtR from command input to generation of the memory core activation signal RASZ is fixed. That being so, in the semiconductor memory device of this first embodiment, the random access read cycle, i.e. the time Trc (3 clocks in this case) that is the command signal input interval, is shorter than in the operation of a conventional SDRAM (cf. FIG. 2), whereupon data read processing can always be repeated with a minimum time Trc. Thus, in the semiconductor memory device in this first embodiment, higher-speed data read is realized than in a conventional SDRAM.

Figure 8:
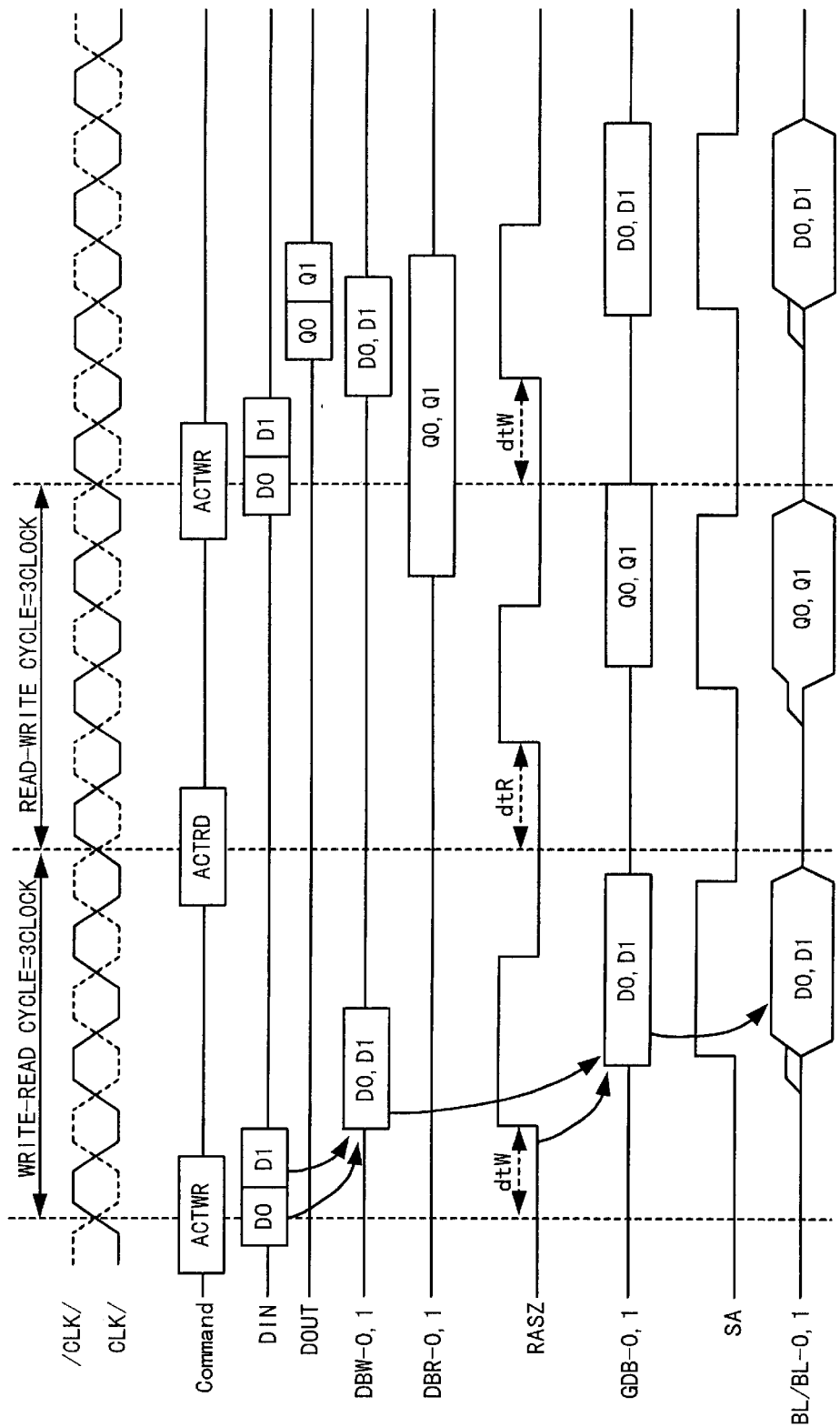
FIG. 8 diagrams operation timing (data write to data read timing with fixed burst length BL=2) in the first embodiment.

FIG. 8 diagrams operation timing when data write operations and data read operations are executed alternately in the first embodiment in a state where the burst length BL=2. These operations are now described in conjunction with FIGS. 8, 6, 10, and 11.

First, the semiconductor memory device in the first embodiment performs a data write operation with the input of a clock signal CLK, active command ACT, write command WR, address signals A0–An, and write data DIN0 to DIN7. The active command ACT and write command WR are provided as an active write command ACTWR which is decoded by the command decoder 2, and the RAS generator unit 13 is controlled according to the results of that decoding. The address signals A0–An are provided to the address buffer 3, and, simultaneously, the write data D0–D7 are supplied to the data input buffer 11. The write data are defined as 8-bit data in the interest of expediency, but are not limited thereto. In this example, the burst length is 2, wherefore only the write data D0 and D1 are input.

When the active write command ACTWR is input to the command decoder 2, the RAS generator unit 13 generates a memory core activation signal RASZ with a delay time dtW. In this case, the RAS generator unit diagramed in FIG. 6A is employed. First, in the command decoder 2, a high pulse is output on the node N1 by the input of the write command. In the RAS generator unit 13 which receives the high pulse on the node N1, a prescribed delay dt1 is added to that high pulse by the first delay circuit 31, and it is output on the node N3. The NAND gate 33 which receives the high pulse on the node N3 inverts this pulse and outputs a low pulse on the node N6. This low pulse is input on the set side of the RS-FF configured by the NAND gates 34 and 35, and a high-level memory core activation signal RASZ is generated. This control signal RASZ is simultaneously input to the precharge signal generator circuit 36 (cf. data write operation diagrammed in FIG. 10).

As described in the foregoing, when the control signal RASZ output by the RAS generator unit 13 goes high, in the block 16a, as in the data read operation diagrammed in FIG. 7, word line selection signals MW and SW and sense amp drive signal SA are generated with suitable timing, the data in the memory cells 18 are read out on the bit lines BL, and those data are fetched to the sense amps 19 and amplified therein.

In the precharge signal generator circuit 36, auto-precharge processing is performed (just as data read processing) with prescribed timing, based on the high level of the control signal RASZ input previously. That is, the precharge signal generator circuit 36 outputs a low pulse on the node N7 with prescribed timing, resets the RS-FF, and restores the control signal RASZ to the low level (cf. data write operation diagrammed in FIG. 10 and RASZ diagrammed in FIG. 8).

The write data DIN input to the data input buffer 11 are serial data based on the set burst length (BL=2 in this case). These serial data are converted to 2-bit parallel data by the serial-parallel converter circuit 7 and sent to the sense buffer 15 via the write data busses DBW-0 and DBW-1. The sense buffer 15 supplies those parallel data, via the global data busses GDB-0 and GDB-1, to the sense amps 19 in the columns designated for access by the command decoder 20. When this is done, the data previously read out from the memory cells and held in the sense amps 19 are overwritten by those parallel data (write data). After that, the write data held in each sense amp are written to and stored in corresponding memory cells, respectively.

When the RAS generator unit diagrammed in FIG. 6B is employed, as diagrammed in FIG. 8, the timings dtw and dtR wherewith the memory core activation signal RASZ is generated are always the same, the data write operation and data read operation have the same command cycle, and the advantages of running the FCRAM at a high operating speed with short command cycle can be maximized. In this case, however, specification limitations are imposed in that either a burst length must be set which is compatible with the fixed timings dtW and dtR, or the burst length must be fixed.

Figure 3:
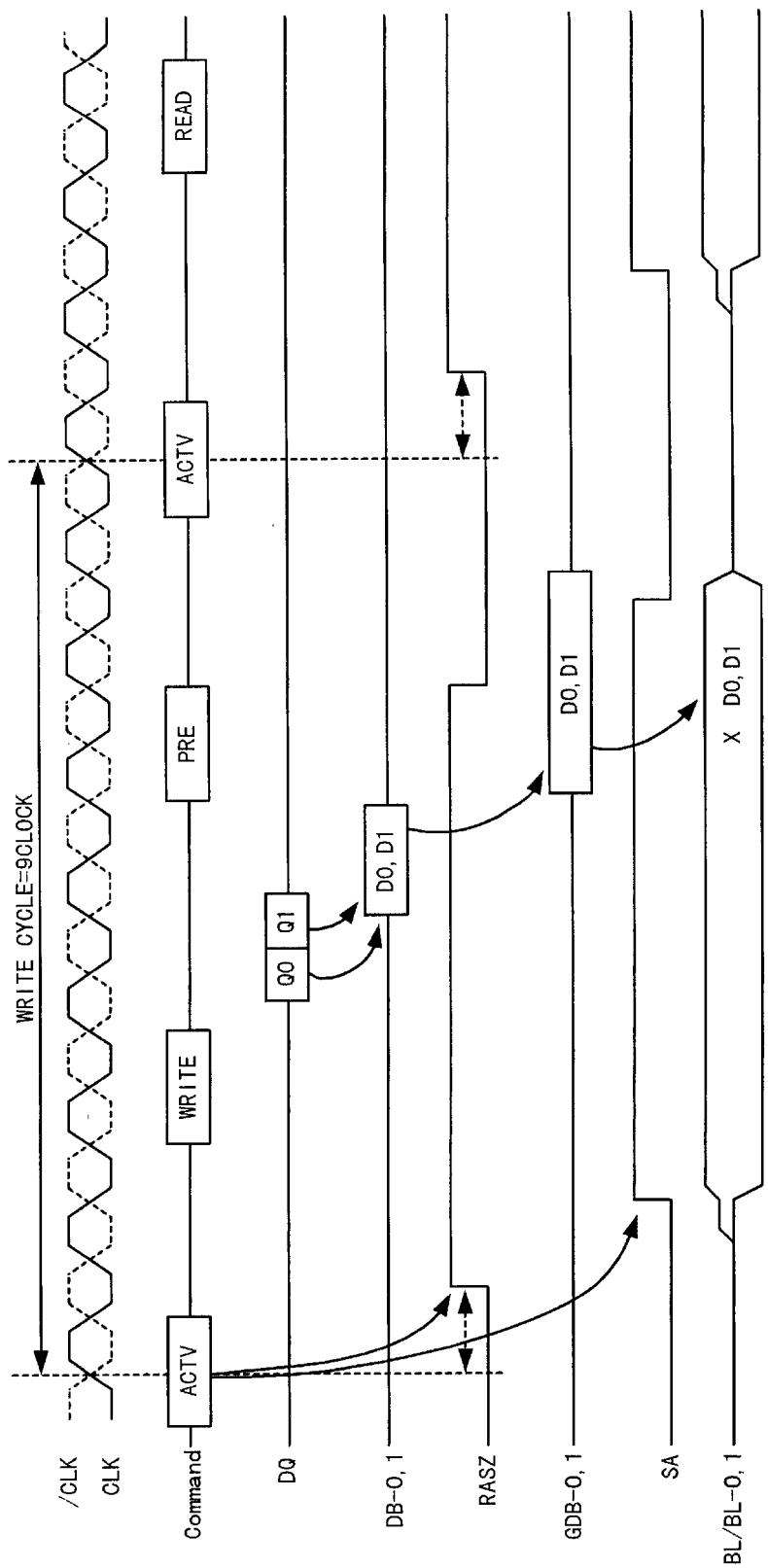
FIG. 3 diagrams data write operating timing in a conventional DDR-SDRAM.
Figure 4:
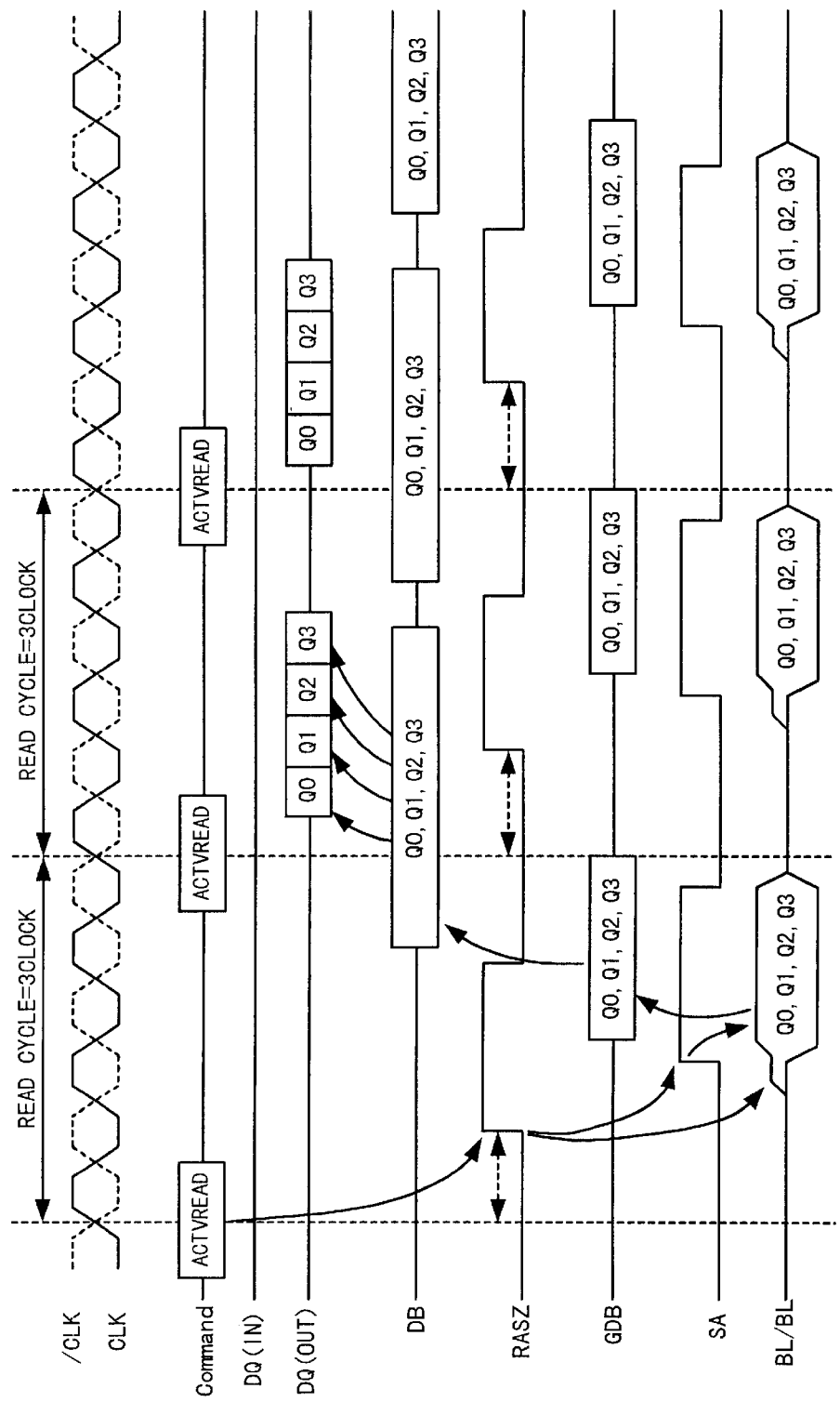
FIG. 4 diagrams data read operation timing (burst length BL=4) in a conventional FCRAM.

When the write and read cycles are repeatedly executed alternately, as diagrammed in FIG. 8, the command cycle Trc (3 clocks in this case) that is the command signal input interval is shorter in the semiconductor memory device of the first embodiment than in conventional SDRAM operations (cf. FIG. 3), whereupon the operations can always be repeated with the minimal time Trc.

Even when the RAS generator unit diagrammed in FIG. 6A is employed, the command cycle can be maintained somewhat short by fixing the delay time dt1 of the first delay circuit for writing to some reasonable time, even when data write operations and data read operations are being repeated.

Figure 9:
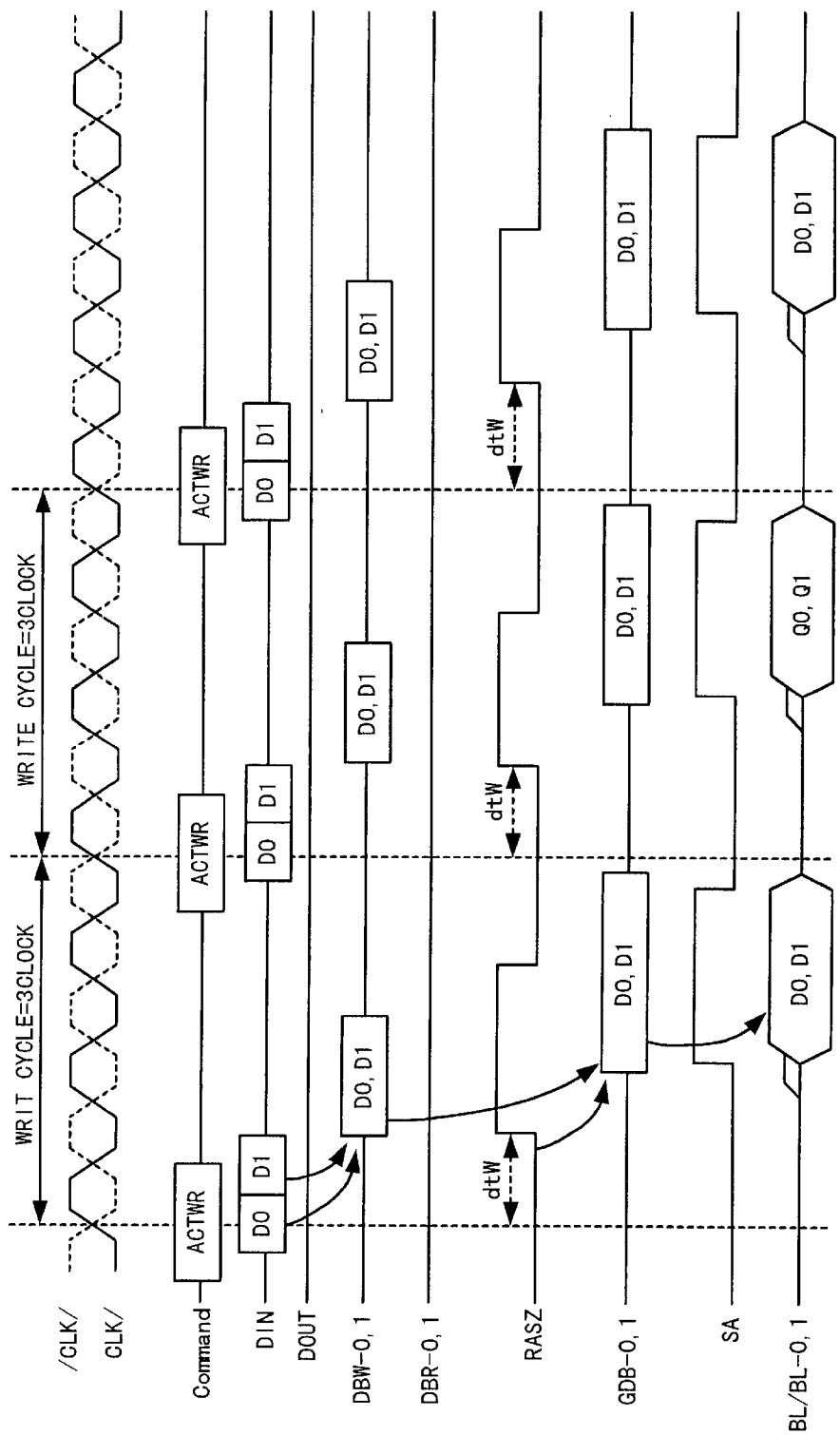
FIG. 9 diagrams operation timing (data write to data write timing with fixed burst length BL=2) in the first embodiment.

In FIG. 9 is given an operation timing chart for the case where data write operations are repeated in the first embodiment. During write operations, the delay time dtW from command input to when the memory core activation signal RASZ goes high is fixed. Also, due to the pipeline structure of the FCRAM, the next active write command ACTWR can be input even when the sense amps in the memory core are in an activated state, wherefore the command cycle during those successive write operations can always be made the minimum time Trc (3 clocks) even though the delay time dtW becomes longer for complying with burst length BL.

Thus, in the first embodiment, as may be seen from the operation timing diagrammed in FIG. 7, FIG. 8, and FIG. 9, by enforcing the specification limitation that the maximum value of the settable burst length be made a fixed value determined according to the frequency of the clock signals CLK and /CLK, the control signal RASZ can be output after a specific time has elapsed since the command signal (ACTRD or ACTWR) was fetched. Due to this configuration, operations are achieved in the memory circuits in the first embodiment with a command cycle that is short at all times, that is, when performing successive read operations, successive write operations, or alternate write and read operations. Also, due to the specification limitation, the memory circuits in the first embodiment can fetch all the serial data in the set burst length, and the problem of the write operation to the sense amps 19 starting before all of the serial data has been fetched, so that the remaining data do not get written, does not arise.

In the semiconductor memory device in the first embodiment, furthermore, the command cycle time Trc that is the command signal (ACTRD or ACTWR) input interval is always constant at the minimum value, thereby facilitating easy control of the RAS generator unit 13.

In the data read and write operations, moreover, because the memory circuits exhibit a pipeline structure, the next command can be fetched, even in the sense amp activation state from the previous cycle, wherefore the command cycle Trc essentially becomes a short time that is in accord with the sense amp activation cycle. That being so, the time from the command fetch during a read operation until data are read out on the output signal DOUT becomes longer than the command cycle time Trc. Also, the time from command fetch during a write operation until data are written to the memory cells is longer than the command cycle time Trc.

In the first embodiment, when the burst length is fixed at BL=2 and the delay times dtR and dtW until memory core activation signal RASZ generation during write and read operations are also fixed, the command cycle Trc can be always maintained constant at 3 clocks, in all possible operation combinations, as shown in FIGS. 7, 8, and 9. As a consequence, the feature of the FCRAM being able to shorten the command cycle can be exploited.

Second Embodying Form Example

FIG. 12 diagrams an example circuit for an RAS generator unit 13 in a second embodiment. The RAS generator unit 13 configured as diagrammed in FIG. 12 comprises a burst counter 51, first delay circuit 52, second delay circuit 53, NAND gates 54, 55, and 56, and precharge signal generator circuit 36. This RAS generator unit 13 generates memory core activation signals RASZ based on command signals ICS and /WE fetched into a command decoder 2 in synchronization with clock signals CLK1 and /CLK1. The provision of the burst counter 51 is a point of difference with the circuit diagrammed in FIG. 6A.

In this second embodiment, unlike in the first embodiment, the maximum value of the burst length set in the mode register 4 is not made a fixed value set according to the frequency of the clock signals CLK1 and /CLK1. That is, it is possible to write all the serial data in whatever burst length is set discretionarily in the mode register 4, irrespective of the clock frequency. Thereupon, in the second embodiment, during a read operation, the control signal RASZ is output after a certain time has elapsed following the timing wherewith the read command ACTRD is fetched, as in the first embodiment. During a write operation, however, the control signal RASZ is output after all of the write data in the discretionarily set burst length has been fetched. For this reason, the RAS generator unit diagrammed in FIG. 12 is provided with a burst counter 51 which counts the time required to fetch all the write data in the burst length. That is, the control signal RASZ is output after a delay time based on the burst length, from the active write command ACTWR fetch.

Figure 13:
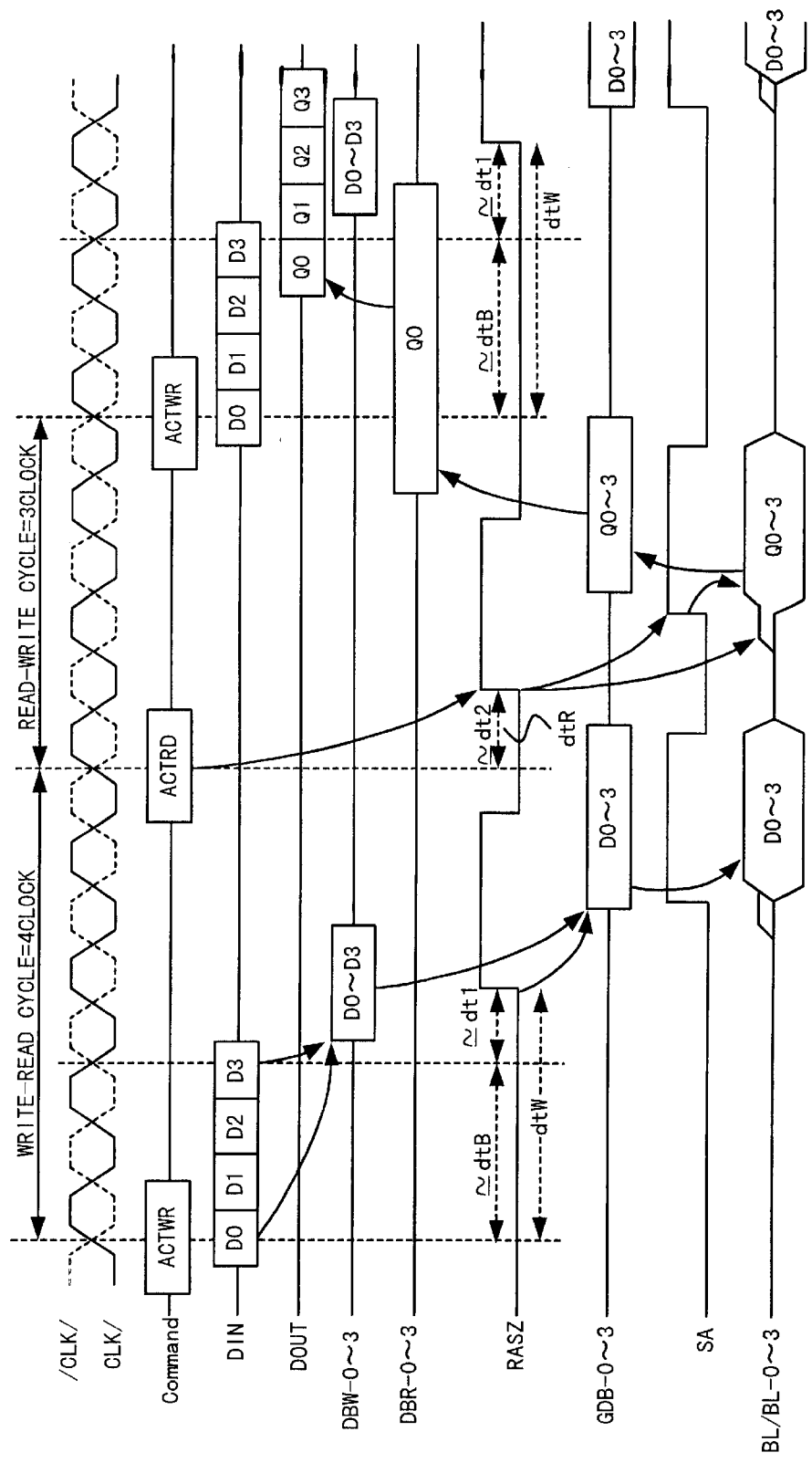
FIG. 13 diagrams operation timing (data write to data read timing with variable burst length) in the second embodiment.
Figure 14:
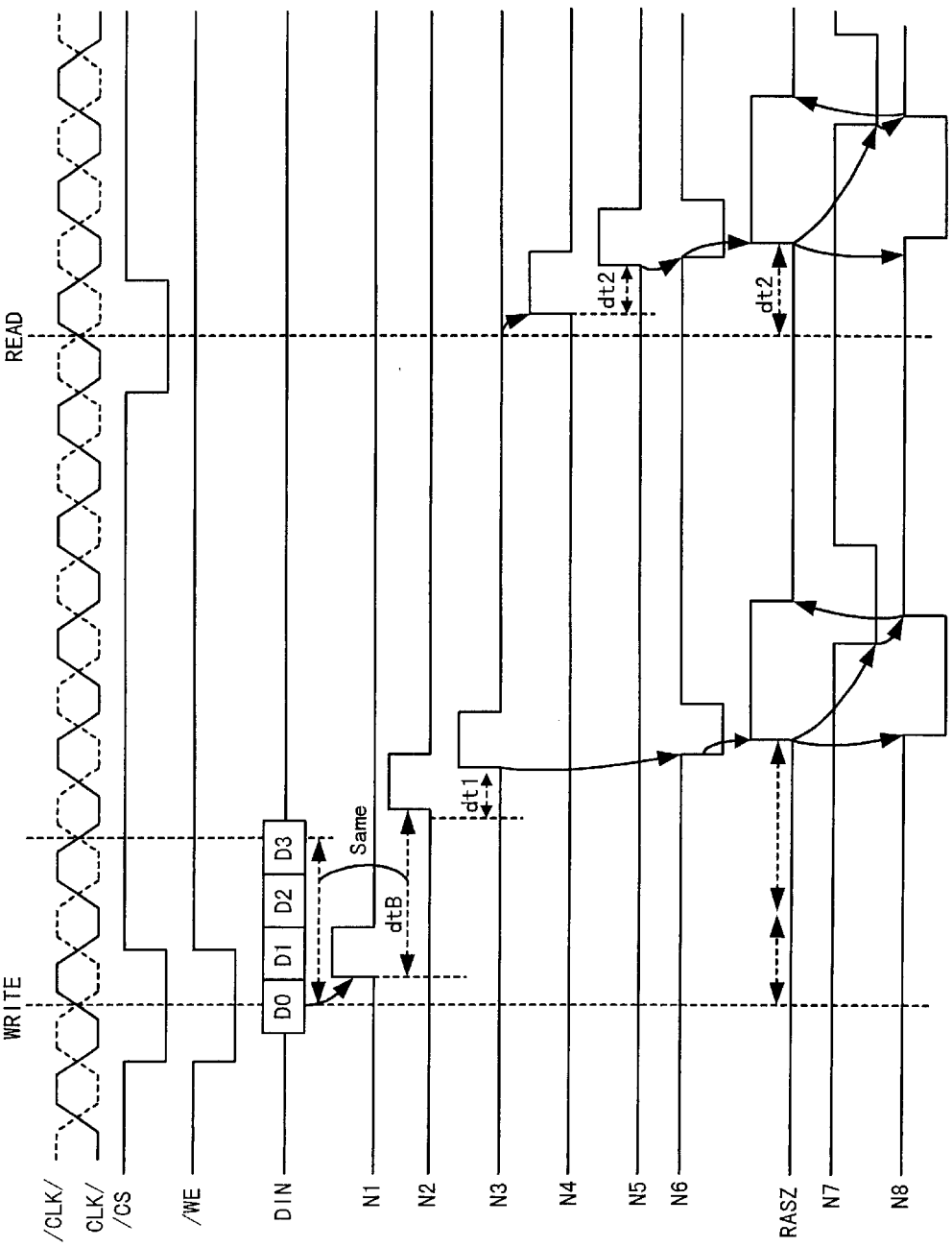
FIG. 14 diagrams internal operation timing in an RAS generator unit in the second embodiment.

FIG. 13 diagrams the operation timing of the semiconductor memory device in the second embodiment. More specifically, FIG. 13 diagrams the operation timing when data write and data read operations are alternately executed successively, in a state wherein the burst length BL=4. FIG. 14 diagrams the operation timing of the RAS generator unit. The operations from a read operation to a write operation in the second embodiment are now described in conjunction with FIGS. 13 and 14.

As in the first embodiment, the semiconductor memory device in this second embodiment starts a data write operation with the input of a clock signal CLK, active write command ACTWR, address signals A0–An, and write data DIN0 to DIN7.

When the active write command ACTWR is input to the command decoder 2, the RAS generator unit 13 generates a control signal RASZ after counting out a number of clock pulses corresponding to the burst length. First, upon the input of the write command ACTWR, the command decoder 2 outputs a high pulse on the node N1. In the RAS generator unit 13 that receives the high pulse on the node N1, the burst length that is the number of bits of write data input serially is counted by the burst counter 51 in synchronization with the clock signals CLK1 and /CLK1. Here BL=4,wherefore the clock signals CLK1 and /CLK1 are counted four times. As soon as the burst counter 51 has counted the timing clock beat for the 4th serial datum D3, it outputs a high pulse on the node N2, thereby delaying the high pulse by a delay time dtB. That high pulse is output on the node N3 after a prescribed delay dt1 has been added thereto by the first delay circuit 52 which received that high pulse on the node N2. The NAND gate 42 which receives the high pulse on the node N3 inverts the pulse and outputs the resulting low pulse on the node N6. This low pulse is input on the set side of the RS-FF configured by the NAND gates 54 and 56, and a high-level memory core activation signal RASZ is generated. The control signal RASZ is simultaneously input to the precharge signal generator circuit 36, as diagrammed in FIG. 14.

As described in the foregoing, when the control signal RASZ output by the RAS generator unit 13 goes high, inside block 16a in the memory core, as in the data write operation diagrammed in FIG. 8 (first embodiment), word line selection signals MW and SW, and a sense amp drive signal SA, are generated with suitable timing, the data in the memory cells 18 are read out on the bit lines BL, and those data are fetched to the sense amps 19 and therein amplified.

In the precharge signal generator circuit 36, autoprecharge processing is performed (in the same way as data read processing) with prescribed timing, based on the high level of the control signal RASZ previously input. More specifically, as diagrammed in FIG. 12 and 14, the precharge signal generator circuit 36 outputs a low pulse on the node N7, resets the RS-FF, and restores the control signal RASZ to the low level.

The write data DIN input to the data input buffer 11, meanwhile, are 4-bit serial data based on the set burst length (BL=4 in this case). These serial data are converted to 4-bit parallel data by the serial-parallel converter circuit 7 and sent to the sense buffer 15 via write data busses DBW-0 to DBW-3. The sense buffer 15 provides those parallel data to the sense amps 19 of the columns designated for access by the column decoder 20, via global data busses GDB-0 to GDB-3. When this is done, the data previously read out from the memory cells and held in the sense amps 19 are overwritten by those parallel data (write data). After that, the write data held in the sense amps are written to and stored in the corresponding memory cells, respectively.

As diagrammed in FIG. 13, during write operations, the delay time dtW from command input to the generation of the memory core activation signal RASZ is roughly equal to the sum of the delay dtB produced by the burst counter 51 and the delay dt1 produced by the delay circuit 52. Also, the delay time dtR during the read operation is roughly equal to the delay dt2 produced by the second delay circuit 53. Then, during write operations, the memory core activation signal RASZ is generated after all of the write data D0–D3 in the burst length have been fetched, wherefore the write data are written without a problem. However, due to the delay dtB produced by the burst counter, the period of 4 clock beats from the write command WR to the read command RD becomes longer than the period of 3 clock beats from the read command RD to the write command WR.

However, due to the pipeline structure of the FCRAM, it is possible while the sense amps are activated from the previous cycle to input commands in the next cycle, wherefore the command cycle becomes shorter than in a conventional SDRAM.

Figure 15:
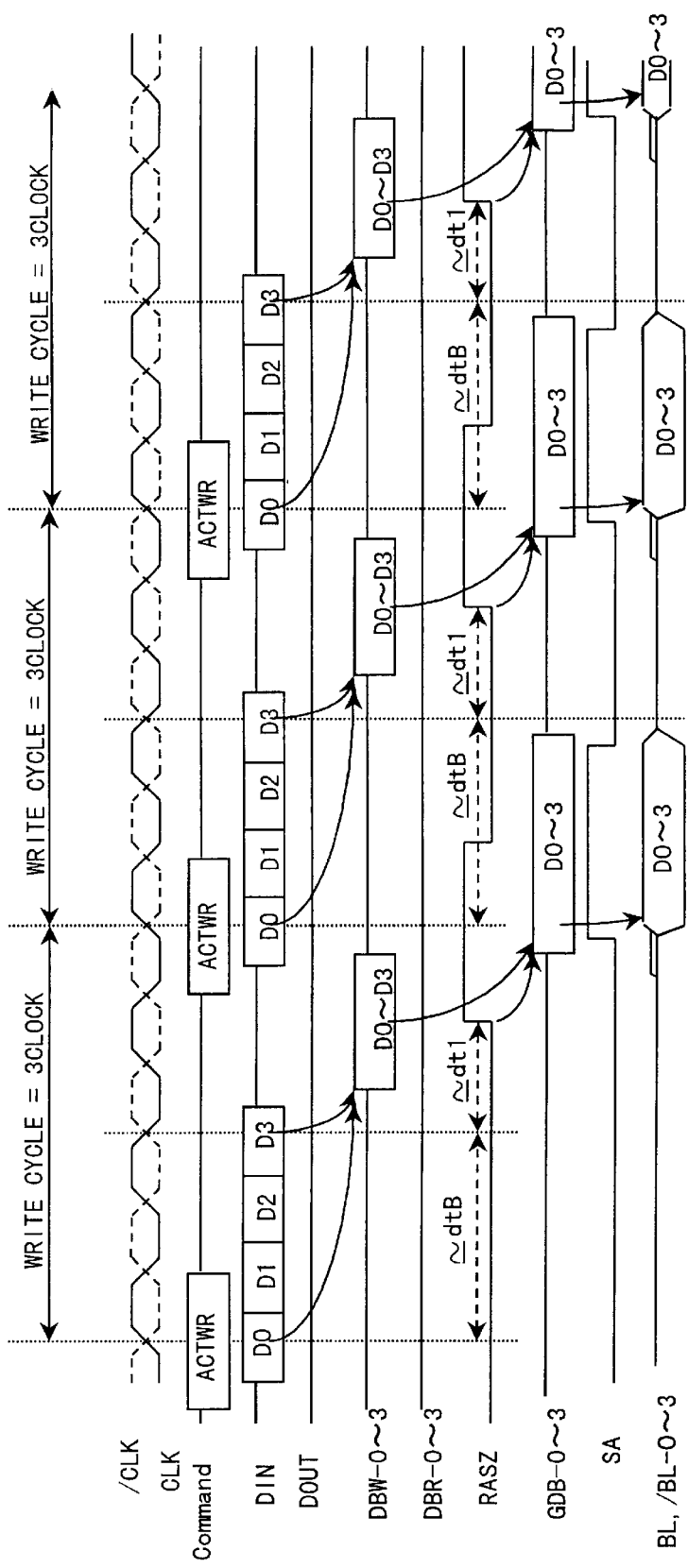
FIG. 15 is an operation timing chart for successive write operations in an example form of the second embodiment.

FIG. 15 is an operation timing chart for successive write operations in the second embodying form example. In this case, the burst length BL is set to 4. In the respective write operations, as in the case diagrammed in FIG. 13, the delay time dtW from the supply of the write command ACTWR to the generation of the memory core activation signal RASZ is roughly equal to the sum of the delay dtB produced by the burst counter and the delay dt1 produced by the first delay circuit. Due to the pipeline structure of the FCRAM, however, it is possible during the sense amp activation from the previous cycle (i.e. the interval wherein the activation signal SA is high) to begin supplying commands and write data D0 to D3 for the next cycle. Accordingly, when write operations are being successively executed, for example, the command cycle Trc is shortened to 3 clock beats, even if the delay dtB for the burst length is added.

In the second embodiment, although not diagramed in the drawings, the command cycle is shortened to 3 clock beats, even when read operations are performed successively, as diagrammed in FIG. 7.

Thus, in the second embodiment, as may be understood from the operation timing diagrammed in FIGS. 13 and 15, during write operations, all of the write data in the discretionarily set burst length are fetched, and then the memory core activation signal RASZ is generated. As a consequence of this configuration, in the semiconductor memory device of the second embodiment, it becomes possible to fetch into the device all of the serial data in a set burst length, and the problem of a write operation to the sense amps 19 beginning before all of the serial data have been fetched, causing the remaining data not to get written, does not arise.

In the semiconductor memory device of this second embodiment, as in the first embodiment, during data read operations, during data write operations, and when those operations are being repeated alternately, both the time from command fetch to when data are read out on the output signal DOUT and the time from command fetch to when data are written to the memory cells, respectively, are longer than the command cycle time Trc. This is because of the fact that, due to the FCRAM pipeline structure, command input and write data fetching can be started in the first stage, even during second-stage sense-amp activation.

Third Embodiment

In the second embodiment, the burst counter 51 counts the number of burst lengths in synchronization with the clock signal and generates a delay time dtW in accord with the burst length. For the purpose of generating this delay time dtW in accord with the burst length, however, the burst counter 51 counts a number that is smaller than the number of burst lengths, in synchronization with the clock signal. That is, depending on the delay time dt1 produced by the first delay circuit 52 and/or any delay in subsequent stages, the number that the burst counter 51 is to count need not necessarily be equal to the number of burst lengths. It is only necessary that the total delay resulting from the delay dtB produced by the burst counter 51 and the delay dt1 in a later stage be a delay dtw that accords with the burst length. That being so, in a third embodiment, the burst counter 51 outputs a high-level pulse at N2 after counting a number that is fewer by a prescribed number than the number of burst lengths.

In both the second and third embodiments, the delay time dtw from the supply of the write command ACTWR to the generation of the memory core activation signal RASZ becomes a time that accords with the burst length. In that respect there is no difference.

In the third embodiment, the RAS generator unit 13 is implemented with the same configuration as the example circuit diagrammed in FIG. 12 pertaining to the second embodiment. The third embodiment differs from the second embodiment, however, in that, during data write operations, the burst counter 51 outputs a high level at a point in time where some of the write data in the discretionarily set burst length has been fetched, and the control signal RASZ is output after a certain time dt1 determined by the first delay circuit has elapsed thereafter. It should be noted that all operations excepting the operation of generating the control signal RASZ in data write operations are the same as in the second embodiment. In that sense, the third embodiment may be considered an example application of the second embodiment. Accordingly, only the points of difference with the second embodiment are described here, and no further description is given of like operations.

In the semiconductor memory device of the third embodiment, when it is possible to fetch all of the bits in the write data in the burst length set discretionarily in the mode register 4 within a certain time dt1 (a fixed time) from the timing wherewith the first bit in the write data is fetched, the RAS generator unit 13 outputs the control signal RASZ after that specific time dt1 has elapsed since the fetching of that first bit. When, on the other hand, it is not possible so to fetch within that certain time dt1, the RAS generator unit 13 confirms the fetching into the device of write data that are a prescribed number of bits fewer than the number of write data in the burst length, by the count value in the burst counter 51, and outputs the control signal RASZ after a certain time dt1 has elapsed thereafter. It is assumed, moreover, that the write data are fetched into the device in synchronization with the clock signals CLK1 and /CLK1.

In a case where, for example, a burst length of BL=4 is set in the mode register 4 and 4 bits of write data can be fetched within the fixed time dt1 noted above, the RAS generator unit 13 outputs the control signal RASZ after the certain time dt1 has elapsed from the timing wherewith that first bit of data D0 was fetched, that is, from the same timing point as in the first embodiment. In a case where a burst length of BL=4 is set in the mode register 4 but only 2 bits out of the 4 bits of write data can be fetched within the fixed time dt1 noted earlier, on the other hand, the RAS generator unit 13 confirms, by the burst counter 51, that the 3rd bit of the write data D3 has been fetched, that is, that 1 bit fewer than the 4 bits of write data in the burst length have been fetched, and outputs the control signal RASZ after the certain time dt1 has elapsed thereafter.

Moreover, the burst length that can be set in the mode register 4 is a discretionary value, wherefore, in a case where, for example, the burst length is set to BL=8, and only 4 bits out of the 8 bits of write data can be fetched within the fixed time dt1, the RAS generator unit 13 confirms, by the burst counter 51, that the 5th bit (i.e. n'th bit) of the write data has been fetched, that is, that 3 bits fewer than the 8 bits of write data in the burst length have been fetched, and outputs the control signal RASZ after the certain time dt1 has elapsed thereafter.

Figure 16:
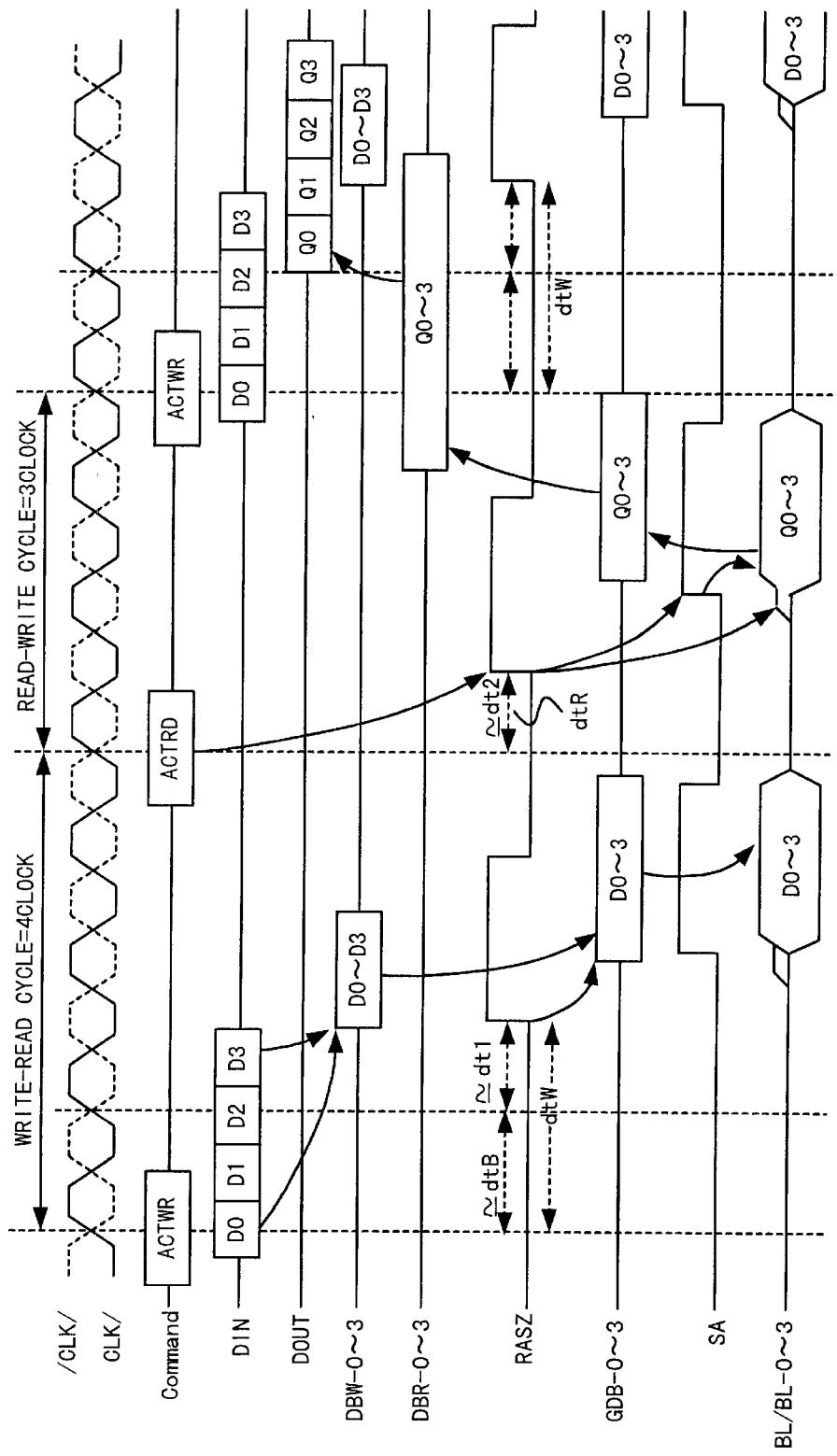
FIG. 16 diagrams operation timing (data write to data read timing with variable burst length) in a third embodiment.
Figure 17:
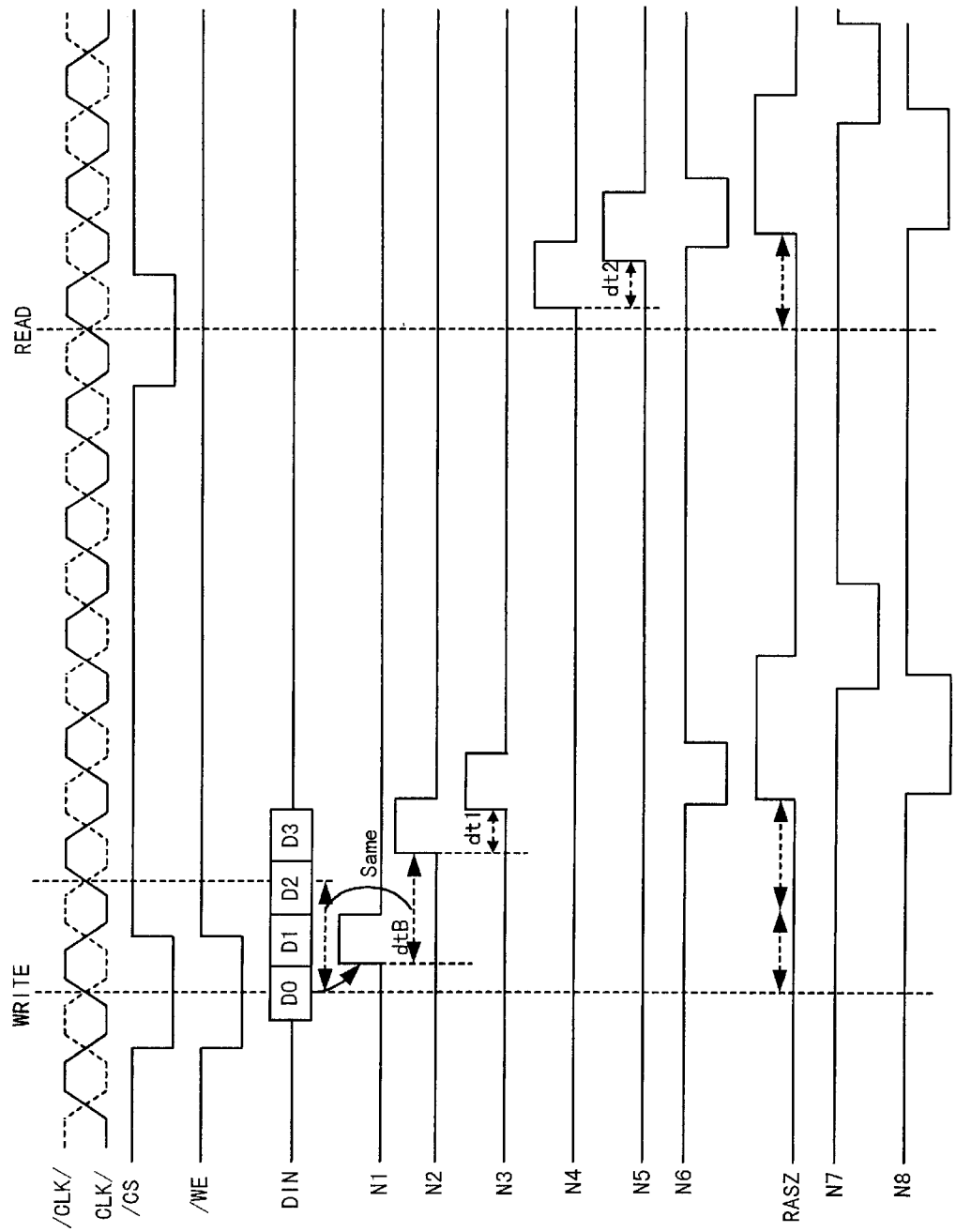
FIG. 17 diagrams internal operation timing in an RAS generator unit in the third embodiment.

FIG. 16 diagrams operation timing in the semiconductor memory device in the third embodiment. More specifically, FIG. 16 diagrams the operation timing in cases where, in a state where the burst length BL=4, only 2 bits of the 4 bits of write data can be fetched within the fixed time dt1. FIG. 17 diagrams the operation timing of the RAS generator unit. The operations in this third embodiment are now described in conjunction with FIGS. 16 and 17.

When the active write command ACTWR is input in packet format into the command decoder 2, the RAS generator unit 13 counts a number that is fewer than the value of the burst length BL by a prescribed number, and generates the control signal RASZ after the fixed time dt1 thereafter (i.e. after dtB). First, in the command decoder 2, with the input of the write command, a highlevel pulse is output onto the node N1. In the RAS generator unit 13 that receives the high-level pulse on that node N1, the burst counter 51 counts a number corresponding to the burst length. In this example, for the burst length BL=4, the count number is 3. The burst counter 51, as soon as it counts the timing clock pulse for the 3RD bit D3 of the serial data, outputs a highlevel pulse on the node N2. Thus the burst counter 51 imparts a delay dtB to the high-level pulse. Then the delay circuit 52 that receives that high-level pulse on the node N2 adds the prescribed delay dt1 to that high-level pulse and outputs that on the node N3. The NAND gate 54 that receives that high-level pulse on the node N3 inverts that pulse and outputs the resulting low-level pulse on the node N6. This low-level pulse is input on the set side of the RS-FF configured by the NAND gates 54 and 56, and a high-level memory core activation signal RASZ is generated. That high-level memory core activation signal RASZ is simultaneously input to the precharge signal generator circuit 36.

As described in the foregoing, when the control signal RASZ output by the RAS generator unit 13 after a delay time dtW following command input goes high, inside the block 16a in the memory core, as in the data write operation diagrammed in FIG. 13 (second embodiment), the word line selection signals MW and SW and the sense amp drive signal SA are generated with suitable timing, the data in the memory cells 18 are read out on the bit lines BL, and those data are fetched into the sense amps 19 and therein amplified. The operations from that point on are the same as in the second embodiment and so are not described further here.

Thus, in the third embodiment, the burst counter 51 generates the memory core activation signal RASZ after counting a number determined according to the burst length. Accordingly, the memory core activation signal RASZ is generated after a delay time, determined according to the burst length, following command input. Therefore, the sense amps are activated after the write data in the burst length set discretionarily have definitely been fetched, and the occurrence of write errors is prevented. With the third embodiment, the same benefits are realized as with the second embodiment, and high-speed data write operations can be performed.

Fourth Embodiment

FIG. 18 diagrams an example circuit for an RAS generator unit 13 in a fourth embodiment.

The RAS generator unit 13 configured as diagrammed in FIG. 18A comprises a burst counter 61, transfer gates 63 and 63, inverter 64, first delay circuit 65, second delay circuit 66, NAND gates 67, 68, and 69, and precharge signal generator circuit 36. This RAS generator unit 13 generates control signals RASZ for writing data contained in memory cells to sense amps, based on command signals /CS and /WE fetched by a command decoder 2, in synchronization with clock signals CLK1 and /CLK1.

The fourth embodiment comprises the configurations both of the first embodiment and of either the second or third embodiment, and is capable of being switched therebetween according to the clock frequency and the set burst length.

For example, as diagrammed in FIG. 18A, since the transfer gates 62 and 63 are connected to the output node b12 of the mode register 4, if the burst length is set to BL=2, the transfer gate 63 conducts, and control signals RASZ are output after a certain time dt1 has elapsed from the fetching of the command signals RD and WR in both read and write operations. In other words, the operations of the first embodiment are performed.

When, on the other hand, the burst length is set to some other value than BL=2, such as BL=4, 8, or 16, for example, the transfer gate 62 conducts, the fetching of all or part of the write data in the discretionarily set burst length is confirmed by the burst counter 61, during data write operations, and after that the control signal RASZ is output after the specific time dt1 has elapsed. That is, dtB+dt1. During data read operations, moreover, the control signal RASZ is output after a specific time dt2 has elapsed following the timing wherewith the read command RD was fetched. In other words, the operations of either the second or the first embodiment are performed.

In the fourth embodiment, furthermore, the operations are the same as in the first, second, or third embodiments, except for the control of the transfer gates, so descriptions of the data read operation and data write operation are here omitted. In FIG. 18A, moreover, to simplify the description, the output signal b12 from the mode register 4 is supplied to the RAS generator unit 13, but this does not constitute a limitation, and any of the output signals b12, b14, b18, or b116 may be supplied, according to the frequency of the clock signals CLK1 and /CLK1. Also, the burst length settable in the mode register 4 is not limited to BL=2, 4, 8, or 16. In FIG. 18B, furthermore, an example circuit is diagrammed for a mode register 4 that is not an electrically settable register. FIG. 18B diagrams a configuration comprising inverters 81–86, NAND gates 87–90, fuses 91 and 92, and resistors 93 and 94, whereupon, for example, when both fuses are connected the burst length is fixed at BL=2, when fuse 91 is connected and fuse 92 is disconnected the burst length is fixed at BL=4, when fuse 92 is disconnected and fuse 92 is connected the burst length is fixed at BL=8, and when both fuses are disconnected the burst length is fixed at BL=16.

Figure 19:
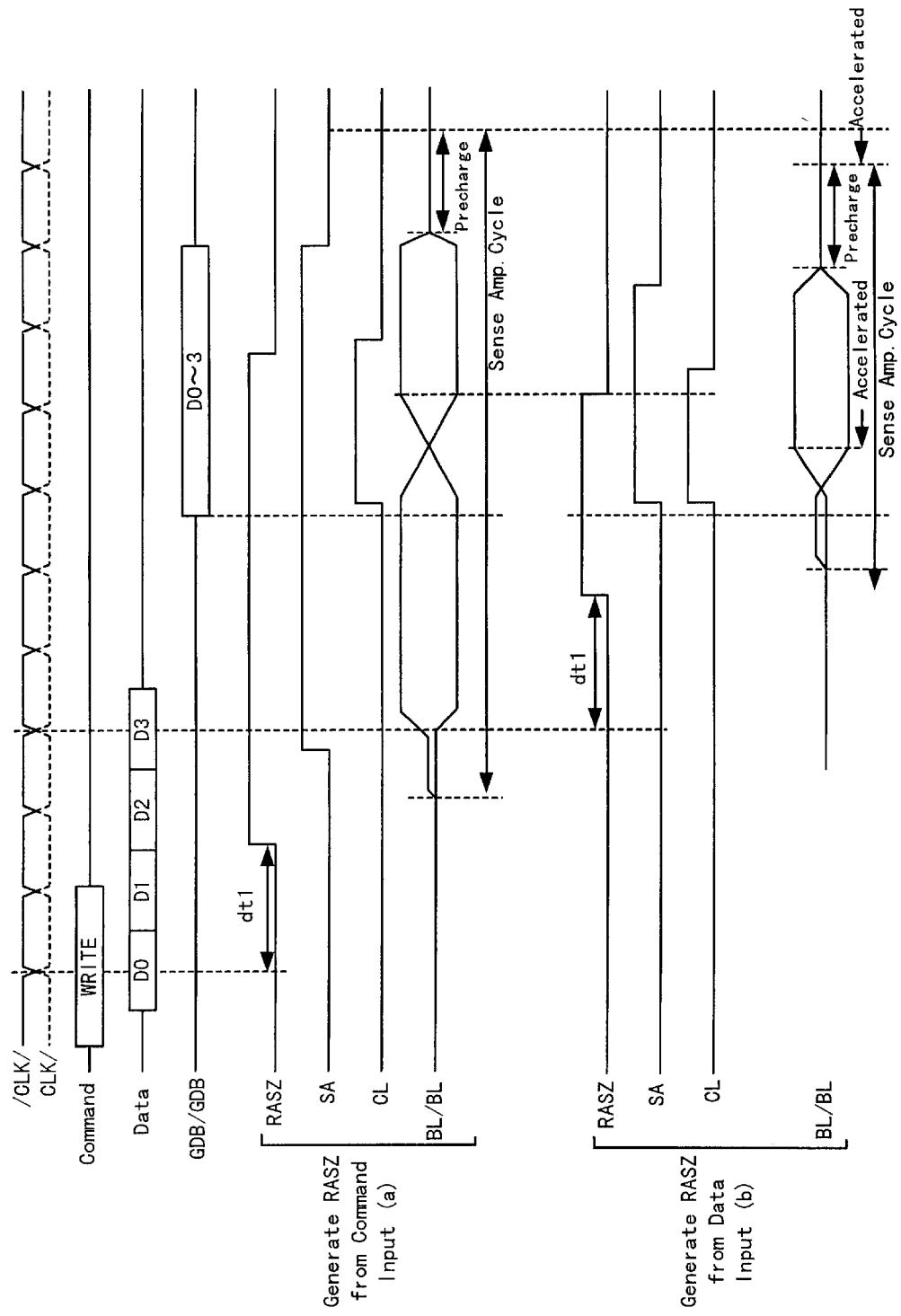
FIG. 19 diagrams operation timing for sense amps in the embodiments.

FIG. 19 is a diagram that compares the operations of the sense amps 19 in the data write operations in the first to fourth embodiments. The example described here is a case where the burst length is set to BL=4. The (a) portion of FIG. 19 diagrams the sense amp operation in the first embodiment and in the fourth embodiment when it is switched to the first embodiment configuration. The (b) portion of FIG. 19 diagrams the sense amp operation in the second embodiment and in the fourth embodiment when it is switched to the second embodiment configuration. The other portions therein diagram operation timing that is common to all the embodiments.

The (a) portion in FIG. 19 which performs the data write operation in the first embodiment outputs the control signal RASZ after a certain time dt1 has elapsed since the fetching of the write command WRITE, and thereafter outputs the sense amp drive signal SA with suitable timing. Simultaneously therewith, the data on the bit lines BL and /BL are amplified by and held in the sense amps. After that, the write data D0–D3 are latched in the sense buffer 15 and those data are output on the global data busses GDB and /GDB. When in that state the column selection signal CL is output, the data on the global data busses GDB and /GDB are written to the corresponding sense amps, and then those data are stored in corresponding memory cells. Then auto-precharging is performed with suitable timing, and the data write operation is finished.

The (b) portion in FIG. 19 that performs the data write operation in the second embodiment, on the other hand, outputs the control signal RASZ after the certain time dt1 has elapsed since the fetching of the 4th bit of write data D3, and thereafter outputs the sense amp drive signal SA with suitable timing. At this time, in a state wherein the data on the bit lines BL and /BL have not been amplified by the sense amps, the column selection signal CL is output, the data on the global data busses GDB and /GDB are written to the corresponding sense amps, and those data are then stored in corresponding memory cells. After that, auto-precharging is performed with suitable timing, and the data write operation is finished. Hence, when the burst length is set to BL=4, data write operations can be executed at a somewhat higher speed in the second embodiment, wherein data on the bit lines BL and /BL are written without being amplified by the sense amps, than in the first embodiment, wherein data are written after being amplified by the sense amps. In other words, the configuration diagrammed (a) in FIG. 19 is faster than that diagrammed (b) in FIG. 19 inasmuch as, in the former, it is not necessary to invert the sense amp state.

Furthermore, in the case of (b) in FIG. 19, the period during which the sense amps are activated becomes shorter. This means that, as diagrammed in FIG. 15, when write operations are performed successively, by making the sense amp activation period shorter as (b) in FIG. 19, the command cycle can be made short just as the command cycle during read operations. Due to the FCRAM pipeline operation, if the sense amp activation period is short, the operation period in the second stage can be shortened, making it possible to shorten the command cycles overall.

Figure 20:
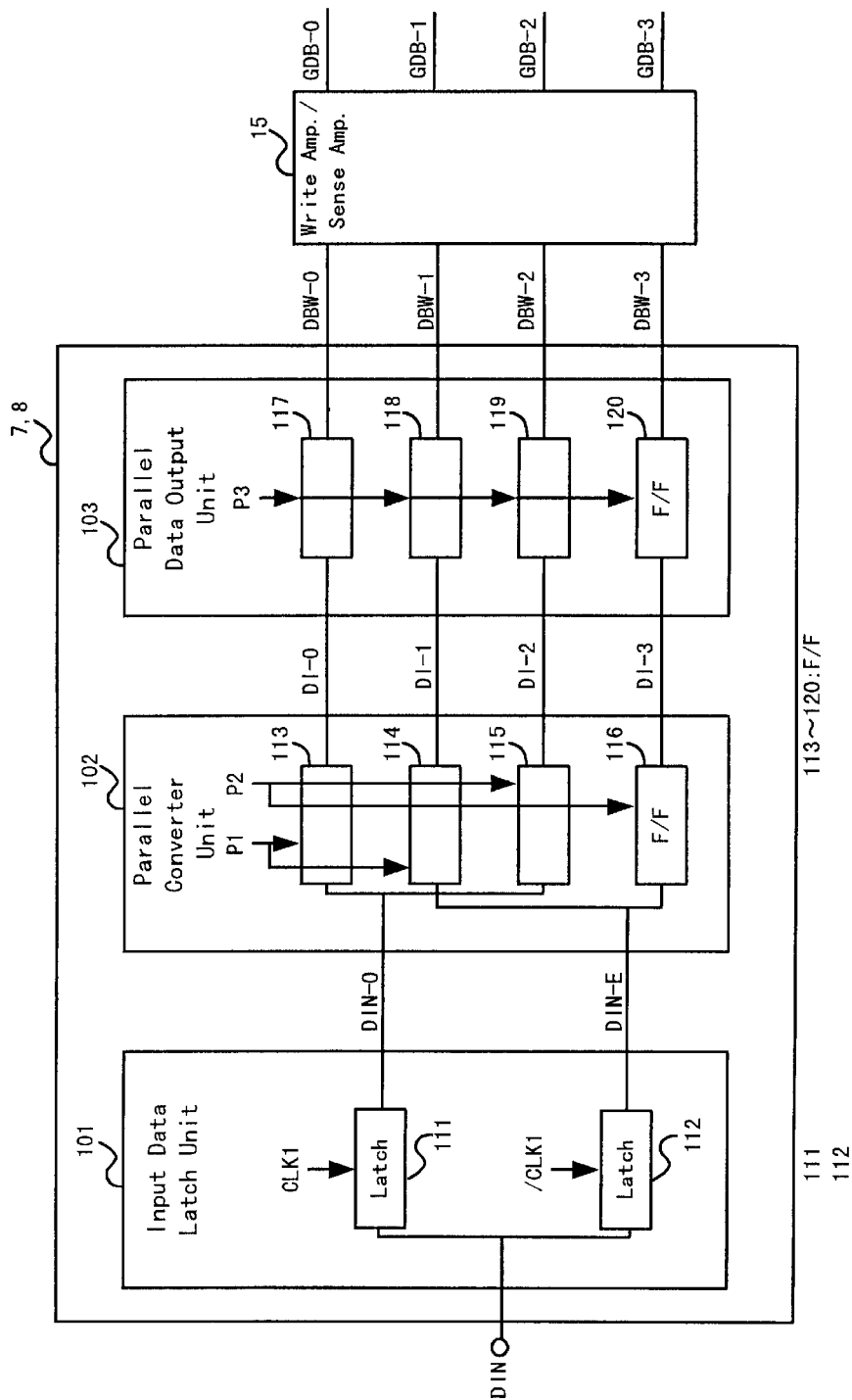
FIG. 20 diagrams the configuration of a series-parallel converter circuit.

FIG. 20 diagrams an example configuration for the serial-parallel converter circuits 7 and 8 inside the semiconductor memory device of the present invention. Because the configuration is the same in both the serial-parallel converter circuit 7 and the serial-parallel converter circuit 8, the same symbols are applied to the serial-parallel converter circuit 8 and that circuit is not further described.

The serial-parallel converter circuit 7 has a configuration that comprises an input data latching unit 101, a parallel converter unit 102, and a parallel data output unit 103. This serial-parallel converter circuit 7 functions to convert the serial data that are input based on the burst length set in the mode register 4 to parallel data based on prescribed reference clock signals. Those prescribed reference clock signals are generated by frequency-dividing an externally provided clock signal CLK by a clock buffer 1, and refer to a clock signal CLK1 that is in phase with the clock signal for fetching the command signals, etc., and a clock signal /CLK1 that is a half period out of phase with the clock signal CLK1.

The input data latching unit 101 noted above alternately latches the serial data successively input according to the set burst length with a first latching circuit 111 that latches in synchronization with the clock signal CLK1 and a second latching circuit 112 that latches in synchronization with the clock signal /CLK1, thus dividing those serial data into two streams of serial data. The parallel converter unit 102 latches these two streams of serial data with separate F/Fs (flip-flops) 113, 114, 115, and 116, at specific time intervals, and generates n-bit parallel data where n corresponds to the burst length. In FIG. 20, to simplify the description, there are four F/Fs, and the maximum number of bits that can be converted is set at 4. The actual number of F/Fs, however, is a suitable number matched with the settable burst length. The parallel data output unit 103 fetches the generated parallel data with F/Fs 117, 118, 119, and 120, and outputs these simultaneously with prescribed timing.

The basic operations of the serial-parallel converter circuit 7 configured in this manner are diagrammed at FIG. 21A and FIG. 21B. These basic operations of the serial-parallel converter circuit 7 are briefly described using FIG. 21.

In a case where the burst length set in the mode register 4 is BL=2 (cf. FIG. 21A), for example, when a write command WRITE is input and 2-bit-formatted serial-parallel D0 and D1 are input on the node DIN of the data input buffer 11, those serial data are fetched into the serial-parallel converter circuit 7.

In the serial-parallel converter circuit 7 that receives the serial data D0 and D1, the first latching circuit 111 latches the datum D0 in synchronization with the rise of the clock signal CLK1. Following thereupon, the second latching circuit 112 latches the datum D1 in synchronization with the rise of the clock signal /CLK1. These data D0 and D1 are output to the nodes DIN-O and DIN-E, respectively.

The datum D0 on the node DIN-O and the datum D1 on the node DIN-E are fetched by F/F 113 and F/F 114, respectively, at the rise of a prescribed timing signal P1, whereupon 2-bit parallel data are there generated and output to the nodes DI-0 and DI-1, respectively.

Last of all, the F/F 117 and F/F 118 that received the data D0 and D1 on the nodes DI-0 and DI-1 output those parallel data to the write data bus DBW at the rise of a prescribed timing signal P3.

In a case where the burst length set in the mode register 4 is BL=4 (cf. FIG. 21B), when a write command WRITE is input and 4-bit-formatted serial data D0, D1, D2, and D3 are input on the node DIN of the data input buffer 11, those serial data are sent to the serial-parallel converter circuit 7.

In the serial-parallel converter circuit 7 that received those serial data D0, D1, D2, D3, the first latching circuit 111 latches the data D0 and D2, respectively, in synchronization with successive rises of the clock signal CLK1. The second latching circuit 112 latches the data D1 and D3, respectively, in synchronization with successive rises of the clock signal /CLK1. Thus the serial data D0, D1, D2, D3 are latched in the sequence CLK1→/CLK1→CLK1→/CLK1, whereupon the data D0 and D2 are output to the node DIN-O and the data D1 and D3 are output to the node DIN-E.

The datum D0 on the node DIN-O and the datum D1 on the node DIN-E are respectively fetched to F/F 113 and F/F 114 on the rise of the prescribed timing signal P1, and, following thereupon, the datum D2 on the node DIN-O and the datum D3 on the node DIN-E are respectively fetched to F/F 115 and F/F 116 on the rise of a prescribed timing signal P2. In this state 4-bit parallel data are generated and respectively output to the nodes DI-0, DI-1, DI-2, and DI-3.

Last of all, the flip-flops F/F 117, F/F 118, F/F 119, and F/F 120 which received the data D0, D1, D2, D3 on the nodes DI-0 to DI-3 output those parallel data on the write data bus DBW on the rise of the prescribed timing signal P3.

Thus the serial-parallel converter circuit diagrammed in FIG. 20 can convert serial data input in accord with a discretionary burst length to parallel data with suitable timing.

In this serial-parallel converter circuit 7, the configuration described in the foregoing is adopted to cope with the speeds of the clock signal CLK input to the semiconductor memory device that are becoming faster year by year. If the frequency of the clock signal CLK is 400 MHz, for example, the clock beat period will be 2.5 ns. When serial data are input in synchronization with such a fast clock signal CLK, it is extremely difficult to fetch those data with ordinary shift registers. That being so, the semiconductor memory device of the present invention is configured so that, by internally frequency-dividing the clock signal CLK and halving the frequency, two clock signals are generated, namely CLK1 and /CLK1, which are 180° out of phase with each other, and serial data are sequentially fetched in synchronization with these two clock signals.

However, command signals and write data (serial data) can be input with any timing whatever so long as they are synchronized with an external clock signal. That is, internally, it is not known whether the input is synchronized with the clock signal CLK1 or the clock signal /CLK1. In the serial-parallel converter circuit 7 diagrammed in FIG. 20, the 1st bit of serial data D0 must always be fetched in synchronization with the clock signal CLK1. If that 1st bit D0 should be input in synchronization with the clock signal /CLK1, D1 would be output on DBW-0, D0 on DBW-1, D3 on DBW-2, and D2 on DBW-3. This is not appropriate.

Figure 22:
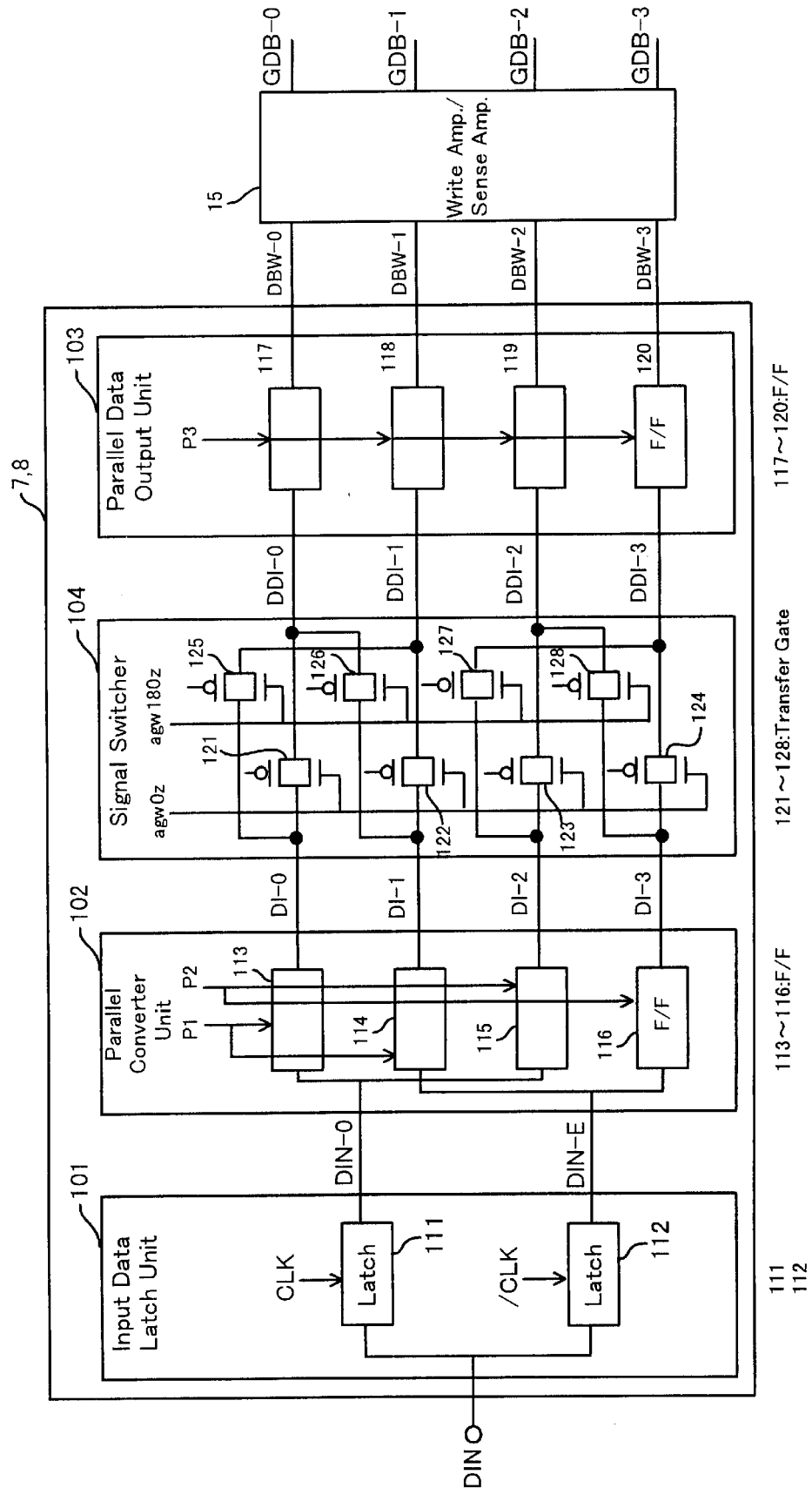
FIG. 22 diagrams the configuration of a series-parallel converter circuit.

That being so, in FIG. 22 is diagrammed a configuration for the serial-parallel converter circuit 7 that takes into consideration the fact of not knowing whether the 1st bit of serial data is input in synchronization with the clock signal CLK1 or the clock signal /CLK1. The serial-parallel converter circuit 7 diagrammed in FIG. 22 is configured so that a signal switcher 104 is inserted between the parallel converter unit 102 and the parallel data output unit 103 in the configuration diagrammed in FIG. 20. With the signal switcher 104, when the 1st bit of serial data is fetched in synchronization with the clock signal CLK1, those data are output as is, but when that 1st bit is fetched in synchronization with the clock signal /CLK1, the data are output after switching D0 with D1 and D2 with D3, respectively.

FIG. 23 diagrams the operation timing for the serial-parallel converter circuit 7 configured as in FIG. 22. FIG. 23(a) diagrams the operation timing when the 1st bit is fetched in synchronization with the clock signal CLK1, and FIG. 23(b) diagrams the operation timing when the 1st bit is fetched in synchronization with the clock signal /CLK1.

The operation timing in the serial-parallel converter circuit 7 is now described for cases where the clock is running at 400 MHz and the burst length set in the mode register 4 is BL=4.

When, for example, the 1st bit of serial data is input in synchronization with the clock signal CLK1 (cf. FIG. 23A), in the serial-parallel converter circuit 7, the first latching circuit 111 latches the data D0 and D2, respectively, in synchronization with successive rises of the clock signal CLK1. The second latching circuit 112 latches the data D1 and D3, respectively, in synchronization with successive rises of the clock signal /CLK1. At this time, a signal AGW0Z which indicates that the 1st bit of serial data was input in synchronization with the clock signal CLK1 goes high (active status), and the transfer gates 121 to 124 are turned on. This signal remains high until the parallel data output unit 103 outputs data, that is, until triggered by the timing signal P3.

The operations whereby the parallel converter unit 102 outputs data D0 to D3 on the nodes DI-0 to DI-3 are the same as the operations described earlier in conjunction with FIG. 21B and so are not further described here.

In the parallel converter unit 102, 4-bit parallel data are generated and the data D0, D1, D2, D3 are output respectively on the nodes DI-0, DI-1, DI-2, DI-3. In the signal switcher 104 which has received D0–D3 on the nodes DI-0 to DI-3, because the signal AGW0Z has been sent high, datum D0 is output on node DDI-0, D1 on DDI-1, D2 on DDI-2, and D3 on DDI-3, respectively, through the transfer gates 121 to 124.

Last of all, the flip-flops F/F 117, F/F 118, F/F 119 and F/F 120 that receive the data D0–D3 on the nodes DDI-0 to DDI-3 output those parallel data to the write data bus DBW on the rise of the prescribed timing signal P3.

When, on the other hand, the 1st bit of serial data is input in synchronization with the clock signal /CLK1 (cf. FIG. 23B), in the serial-parallel converter circuit 7, the second latching circuit 112 latches the data D0 and D2 in synchronization with successive rises in the clock signal /CLK1. The first latching circuit 111 latches the data D1 and D3 in synchronization with successive rises in the clock signal CLK1. The serial data D0, D1, D2, D3 are thus latched in the order /CLK1→CLK1→/CLK1→CLK1, whereupon the data D0 and D2 are output on the node DIN-E, and the data D1 and D3 are output on the node DIN-O.

At this time, in the signal switcher 104, the signal AGW180Z indicating that the 1st bit of serial data was input in synchronization with the clock signal /CLK1 is sent high (active status), and the transfer gates 125 to 128 are turned on. This signal remains high until the parallel data output unit 103 outputs data, that is, until triggered by the timing signal P3.

The datum D0 on the node DIN-E is fetched to F/F 114 on the rise of the prescribed timing signal P1, and, simultaneously, the datum D1 on the node DIN-O is fetched to F/F 113. Following thereupon, the datum D2 on the node DIN-E is fetched to F/F 116 on the rise of the prescribed timing signal P2, and, simultaneously, the datum D3 on the node DIN-O is fetched to F/F 115. In this state, 4-bit parallel data are generated and the data D1, D0, D3, and D2, respectively, are output to the nodes DI-0, DI-1, DI-2, and DI-3, respectively.

The signal switcher unit 104 that receives the data D1, D0, D3, D2 on the nodes DI-0, DI-1, DI-2, and DI-3, because the signal AGW180Z has been sent high, performs data switching, via the transfer gates 125 to 128. As a result, datum D0 is output on node DDI-0, D1 on DDI-1, D2 on DDI-2, and D3 on DDI-3.

Last of all, the flip-flops F/F 117, F/F 118, F/F 119 and F/F 120 that receive the data D0–D3 on the nodes DDI-0 to DDI-3 output those parallel data to the write data bus DBW on the rise of the prescribed timing signal P3.

Thus, in the serial-parallel converter circuit 7 diagrammed in FIG. 22, unlike that diagrammed in FIG. 20, datum D0 will always be output on data bus DBW-0, D1 on DBW-1, D2 on DBW-2, and D3 on DBW-3, both when the 1st bit of serial data is fetched in synchronization with the clock signal CLK1 and when that 1st bit is fetched in synchronization with the clock signal /CLK1.

By employing a serial-parallel converter circuit configured as diagrammed in FIG. 20 and FIG. 22 in the semiconductor memory device diagrammed in FIG. 5, the semiconductor memory device of the present invention can easily cope with the speeds of the clock signal CLK that are becoming higher every year, so that faster data write operations can be realized.

Modification in Second and Third Embodiments

An example of a modification in the second and third embodiments is described next. In the second and third embodiments, the RAS generator unit has a delay circuit that, during write operations, generates a memory core activation signal RASZ after a delay time dtW that accords with the burst length following command input. In contrast thereto, in the modification example described below, a number that is according to the burst length is counted by a counter, and, thereafter, a pipeline gate between the FCRAM first stage and second stage is opened. In response thereto, the second stage memory core is activated.

Figure 24:
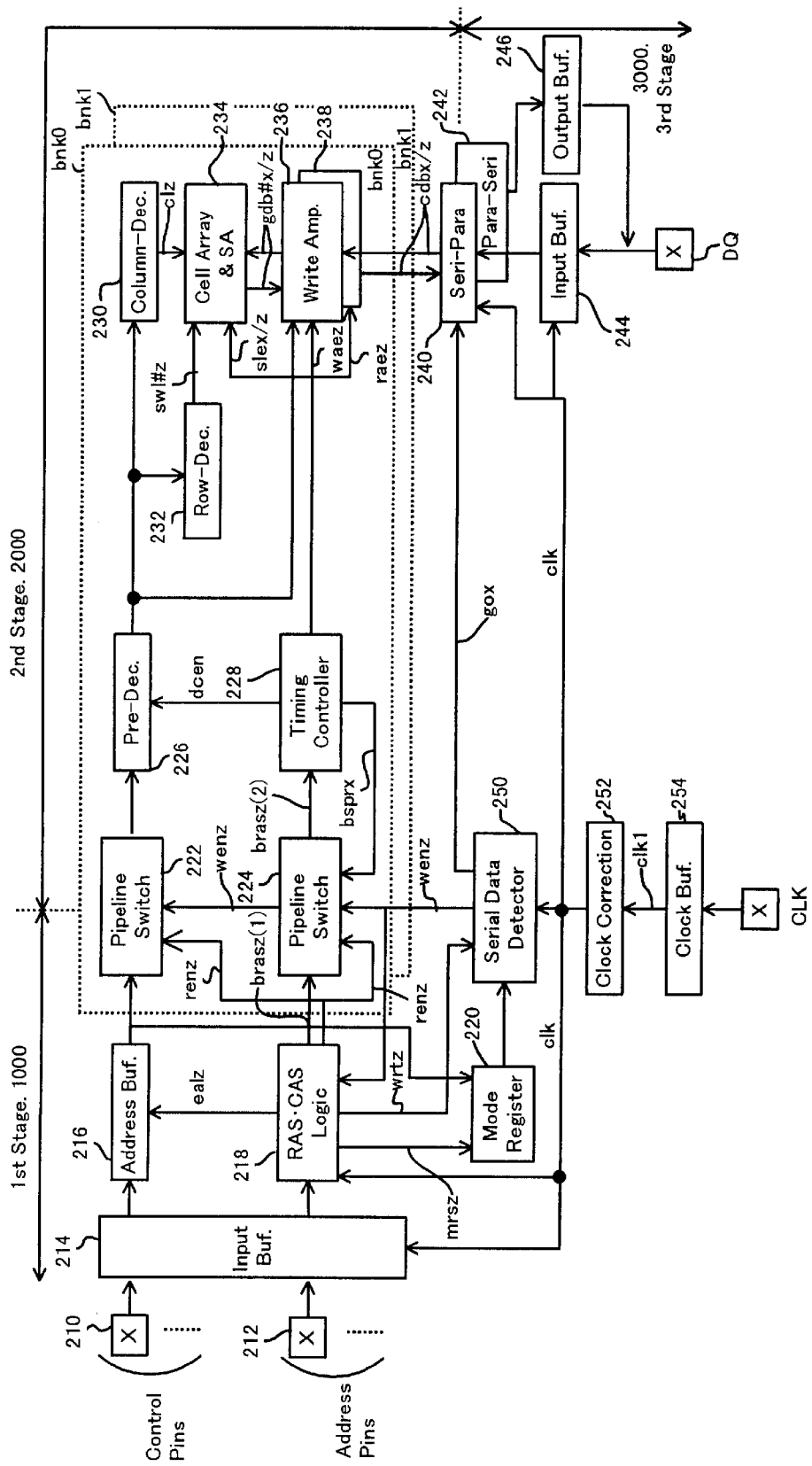
FIG. 24 is an overall configuration diagram for a memory device in an example embodiment form.

FIG. 24 provides an overall configuration diagram for the memory device in the modified embodiment. The memory device diagrammed in FIG. 24 has control pins 210 to which control signals are supplied, and address pins 212 to which address signals are supplied, an I/O terminal DQ to which data are supplied, and a clock terminal CLK to which a clock signal is supplied. This memory device also has a first stage 1000 for inputting and holding addresses and commands formed by combinations of control signals, and a second stage 2000, connected via pipeline switches 222 and 224 to the first stage 1000, having memory cores bnk0 and bnk1 wherein row addresses and column addresses are decoded and wherein the activation of sense amps and word lines (not shown) is performed.

This memory device also has a third stage 3000 which as an input buffer for inputting and holding write data, a serial-parallel converter circuit 240 for converting the write data to a parallel input, a parallel-serial converter circuit 242 for inputting read data from the memory cores in parallel and converting those data to a serial output, and an output buffer 246 for outputting that serial output.

When a write command is supplied, a serial data detection circuit 250 detects that a prescribed plural number of bits of write data has been input, by counting a number of synchronizing clock beats that accords with the burst length, generates a write-pipeline control signal wenz that turns on the pipeline switches 222 and 224, and sends that control signal wenz to the pipeline switches 222 and 224. After a prescribed time delay, in response to the write-pipeline control signal wenz, an RAS/CAS logic circuit 218 is reset. When a read command is supplied, on the other hand, the RAS/CAS logic circuit 218 generates a read-pipeline control signal renz and supplies it to the pipeline switches 222 and 224 to open those switches 222 and 224.

Thereupon, an input buffer 214 inside the first stage 1000 fetches a command on the control pins 210 in synchronization with a clock signal clk and simultaneously fetches a row address and column address on the address pins 212. Provided inside the first stage 1000 are an address buffer 216 for holding address signals, and the RAS/CAS logic circuit 218 for decoding control signals supplied on the control pins 210 and for generating a write mode signal wrtz, read mode signal rdz, and row access signal brasz(1), etc. A mode register set signal mrsz together with various mode setting values are recorded in a mode register 220. The mode setting values set in the mode register 220 include, for example, the burst length that is the number of data handled in a consecutive read or write operation, and the latency that is the number of clock beats from command supply to data output.

In the example diagrammed in FIG. 24, the memory core is configured in the two memory banks bnk0 and bnk1. The second stage 2000 that contains this memory core is connected via the pipeline switches 222 and 224 to the first stage 1000, forming a pipeline structure with that first stage 1000.

Row addresses and column addresses supplied through the pipeline switch 222 are pre-decoded by a pre-decoder 226 and sent respectively to a row decoder 232 and column decoder 230. The row decoder 232 selects and drives a word line swl#z, while the column decoder 230 selects a column selection signal clz, opening a column gate (not shown). Inside the cell array and sense amps 234 are deployed a plurality of word lines swl#Z and a plurality of bit line pairs, at each point of intersection between which is formed a memory cell comprising one transistor and one capacitor. The cell array and the sense amps 234 are connected via a write amp 236, read amp 238, and global data busses GDB#X/Z. Connections are effected between the write amp 236 and serial-parallel converter circuit 240 and between the read amp 238 and the parallel-serial converter circuit 242 by common data busses cdb#x/z that are common to the plurality of memory banks bnk0 and bnk1.

A timing controller 228, in response to the row access signal brasz that is in an activating state during write or read operations, provided from the first stage 1000, generates various timing control signals such as a sense amp activation signal slex/z for activating the sense amps, a write amp activation signal waez for activating the write amp 236, read amp activation signal raez for activating the read amp (sense buffer) 238, and decoder activation signal dcez for activating the pre-decoder 226. The timing controller 228 also generates a self-precharge signal bsprx for controlling the timing of resettings made inside the memory banks, and controls the timing of the resetting of the pipeline switch 224, etc., and the resettings made inside the memory banks.

The clock signal CLK that is supplied as a strobe signal from the outside is fetched in a clock buffer 254. A clock correction circuit 252 that is a DDL (delay locked loop), for example, generates an internal clock signal clk in phase with the supplied clock signal CLK, supplies that clock signal clk to the input buffer 214, input buffer 244, and output buffer 246, and, at the same time, to the serial data detection circuit 250 and the RAS/CAS logic circuit 218.

The configuration of the cell array and sense amps 234 are, for example, as disclosed in detail in Japanese Patent Application No. H10-240722/1998 (filed Aug. 26, 1998) filed separately by the applicant. However, this is the same as the configuration in an ordinary DRAM as respecting the word lines and bit line pairs, the one transistor and one capacitor at the points of intersection therebetween, and the sense amps connected to the bit line pairs.

Figure 25:
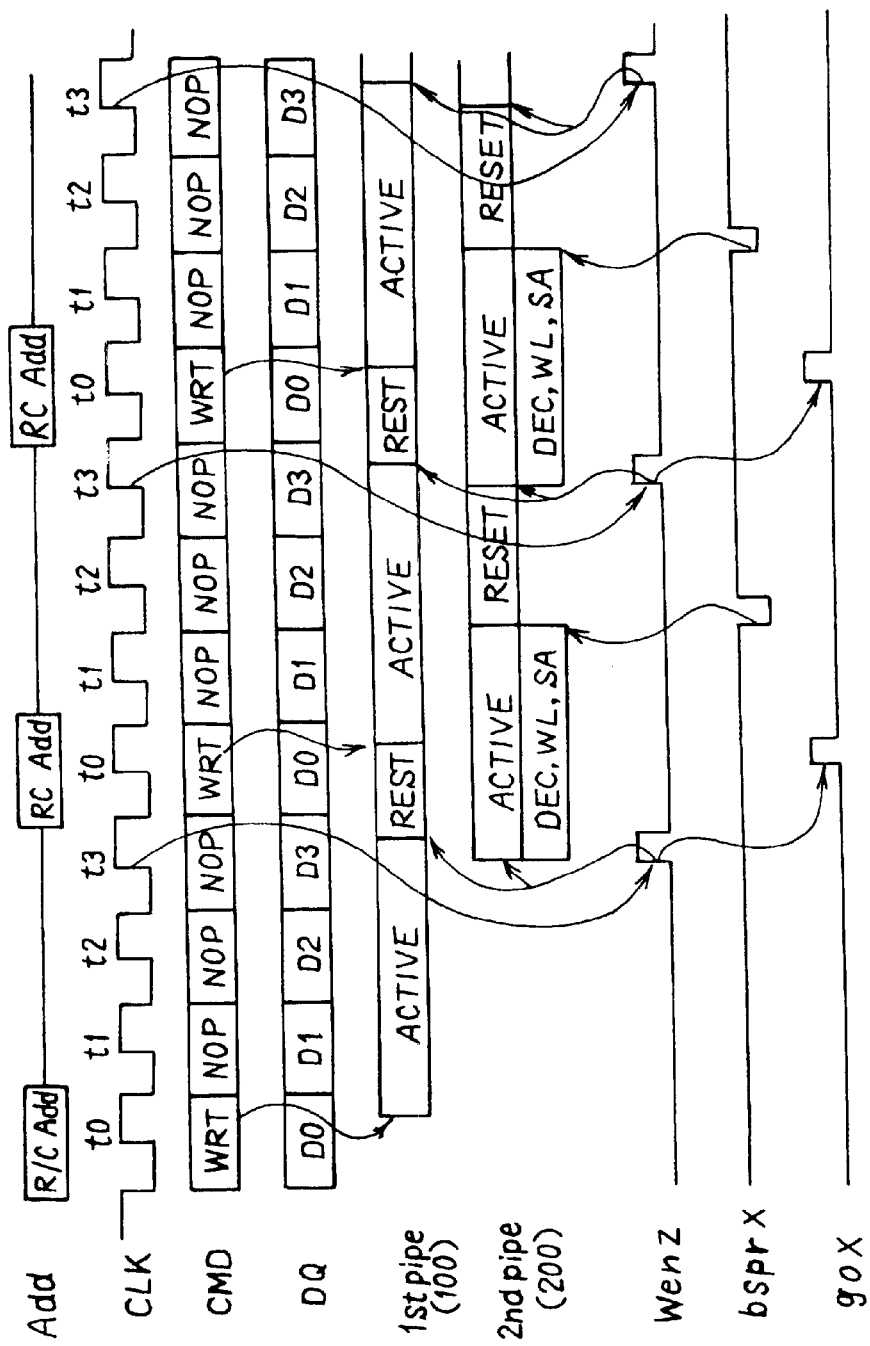
FIG. 25 is an operation timing chart for the memory device diagrammed in FIG. 24 when in write mode.

FIG. 25 is a timing chart for operations in the write mode of the memory device diagrammed in FIG. 24. This write mode pertains to an example where the burst length is 4 bits. Therein, 4-bit data D0–D3 are supplied in serial for one write command WRT (or for one active write command ACTWR, and so hereinafter), and the data D0–D3 are written in parallel to the memory cells corresponding to row and column addresses provided simultaneously with the write command WRT. In other words, the common data busses cdbx/z and the global data busses gdbx/z in FIG. 24 also exhibit a 4-bit parallel structure.

As diagrammed in FIG. 25, the memory device diagrammed in FIG. 24 is configured in a non-multiplexed scheme wherein row addresses RAdd and column addresses CAdd are provided simultaneously. The write command WRT is fetched into the input buffer 214 as the command CMD at the rising edge t0 of the clock signal CLK, and, simultaneously, row and column addresses R/CAdd are fetched into the input buffer 214. Simultaneously with this write command WRT, the first write datum D0 is fetched to the input buffer 244 connected to the I/O terminal DQ and, following immediately thereupon, the remaining write data D1, D2, and D3 are fetched at the rising edges t1, t2, and t3 of the clock signal CLK.

In response to the write command WRT, the first stage 1000 becomes active. More specifically, the RAS/CAS logic circuit 218 generates a write mode signal wrtz and sends it to the serial data detection circuit 250. Then an activation signal ealz for the address buffer 216 is generated, and an address is latched in the address buffer 216. In response to the write mode signal wrtz, the serial data detection circuit 250 counts off beats of the internal clock clk for the burst length (4 in this case) and, when the rising edge at time t3 is counted, counting is terminated, whereupon the write-pipeline control signal wenz is generated.

In response to the write-pipeline control signal wenz, the pipeline switches 222 and 224 are opened and the interior of the second stage 2000 is activated. The address in the address buffer 216 is sent to the predecoder 226 via the pipeline switch 222, and the row access signal brasz(1) generated by the RAS/CAS logic circuit 218 in response to the write mode signal wrtz is sent via the pipeline switch 224 to the timing controller 228. Thereupon, address signal decoding, word line driving, and SA activation are sequentially performed.

At the same time, as soon as the serial input of the 4 bits of write data D0–D3 is finished, the serial data detection circuit 250 generates a serial-parallel control signal gox, causing the serial-parallel converter circuit 240 to perform serial-parallel conversion, and outputs the 4 bits of write data D0–D3 onto the common data busses cdbx/z. Thereupon, the column decoder outputs a column selection signal clz, with timing not diagrammed in the drawings, and the write data D0–D3 on the data busses are written to the memory cells.

And, the timing controller 228 generates a self-precharge signal bsprx at the timing of write completion so as to make the row-access signal brasz (2) reset which is latched in the pipeline switch 224. According to that, the timing controller 228 reset the circuits in the second stage 2000.

In response to the write-pipeline control signal wenz, also, the first stage 1000 is reset, after a prescribed delay time, and the operations of fetching and latching the next addresses and command signals are begun. Accordingly, even when the second stage 2000 is in the active state, the first stage 1000 is reset and begins fetching addresses and command signals for the next cycle. The serial-parallel converter circuit 240, moreover, in response to the serial-parallel control signal gox, upon outputting the 4-bit write data in parallel onto the data busses, begins serially inputting write data for the next write mode.

As described in the foregoing, in the write mode, row addresses and column addresses are supplied simultaneously with the write command, and the write data in the previously set burst length are fetched. At the stage where this fetch has been completed, the pipeline switches between the first stage and the second stage are opened, the second stage is made active, and, concurrently therewith, the serial-parallel converted data are output to the data buses. The subsequent operation of writing to the memory cells is performed in the second stage. While writing is being performed in the second stage, the first stage 1000 and third stage 3000 are reset, addresses and commands are fetched in correspondence with the next write command, and write data are serially fetched. Accordingly, the time from the first write command WRT to the next write command WRT becomes shorter than in the prior art. In other words, the command cycle can be shortened in random access operations where the row and column addresses are changed.

Figure 26:
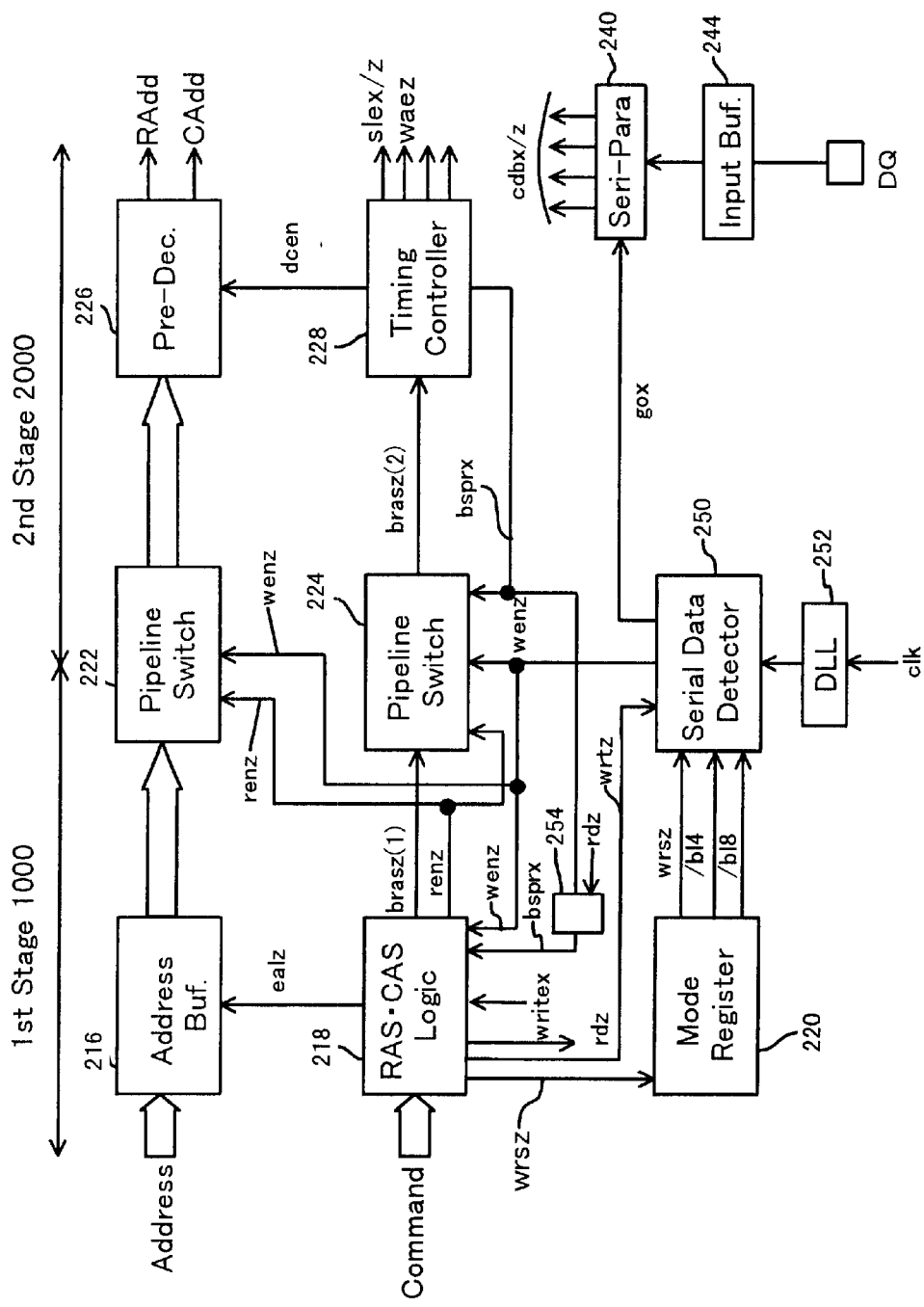
FIG. 26 is a partial detailed diagram of the memory device diagrammed in FIG. 24.
Figure 27:
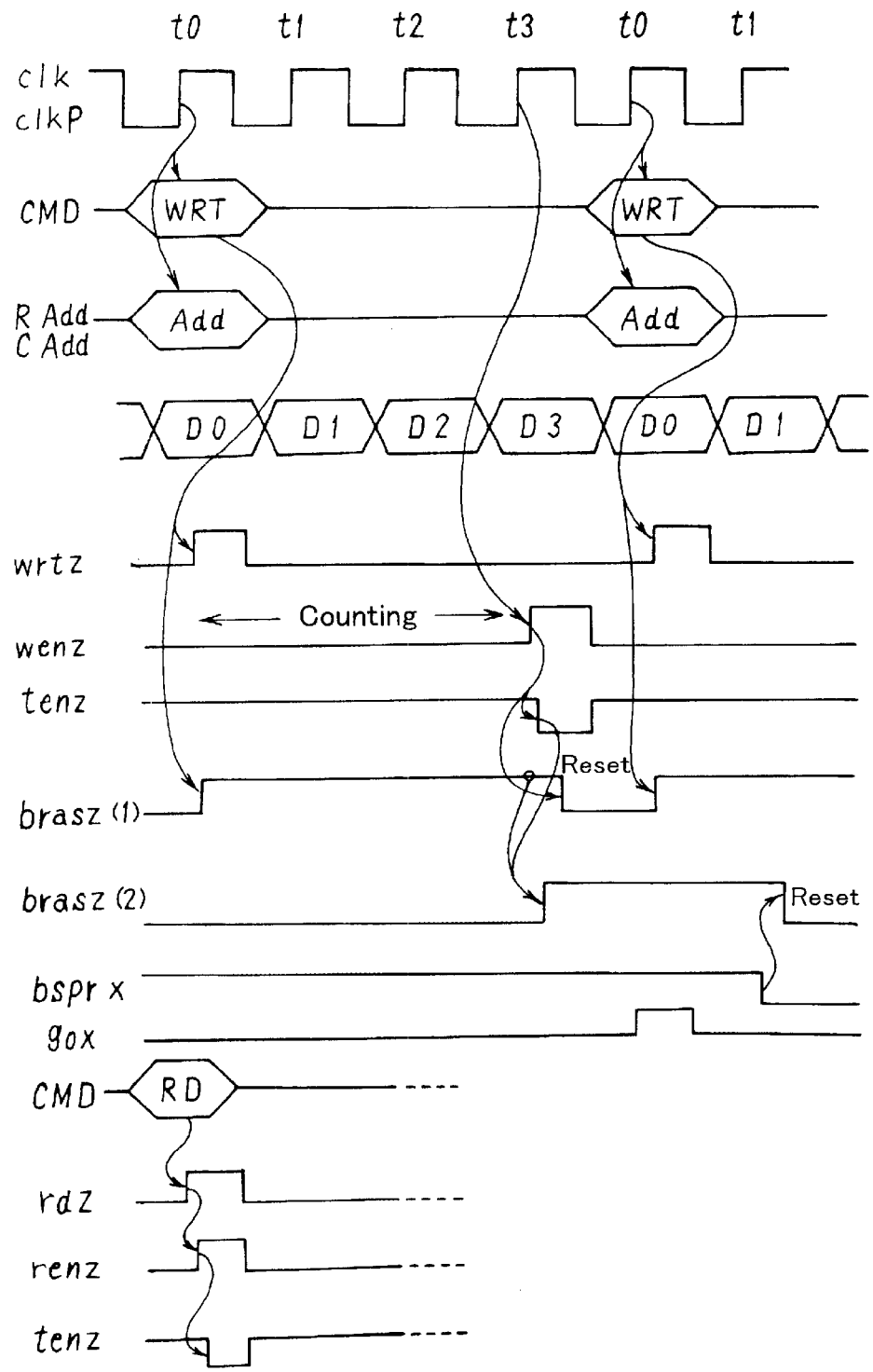
FIG. 27 is a timing chart representing operations in FIG. 26.

In FIG. 26 is given a partial detail of the memory device diagrammed in FIG. 24, with the same components indicated by the same reference numbers. In FIG. 26, however, various control signals not diagrammed in FIG. 24 have been added. FIG. 27 is a timing chart representing the operations performed in the memory device diagrammed in FIG. 26. In FIG. 27 is diagrammed a timing chart for read and write operations. The configurations of the RAS/CAS logic circuit 218, serial data detection circuit 250, pipeline switches 222 and 224, and serial-parallel converter circuit 240 are described below, making reference to FIG. 26 and FIG. 27.

Figure 28:
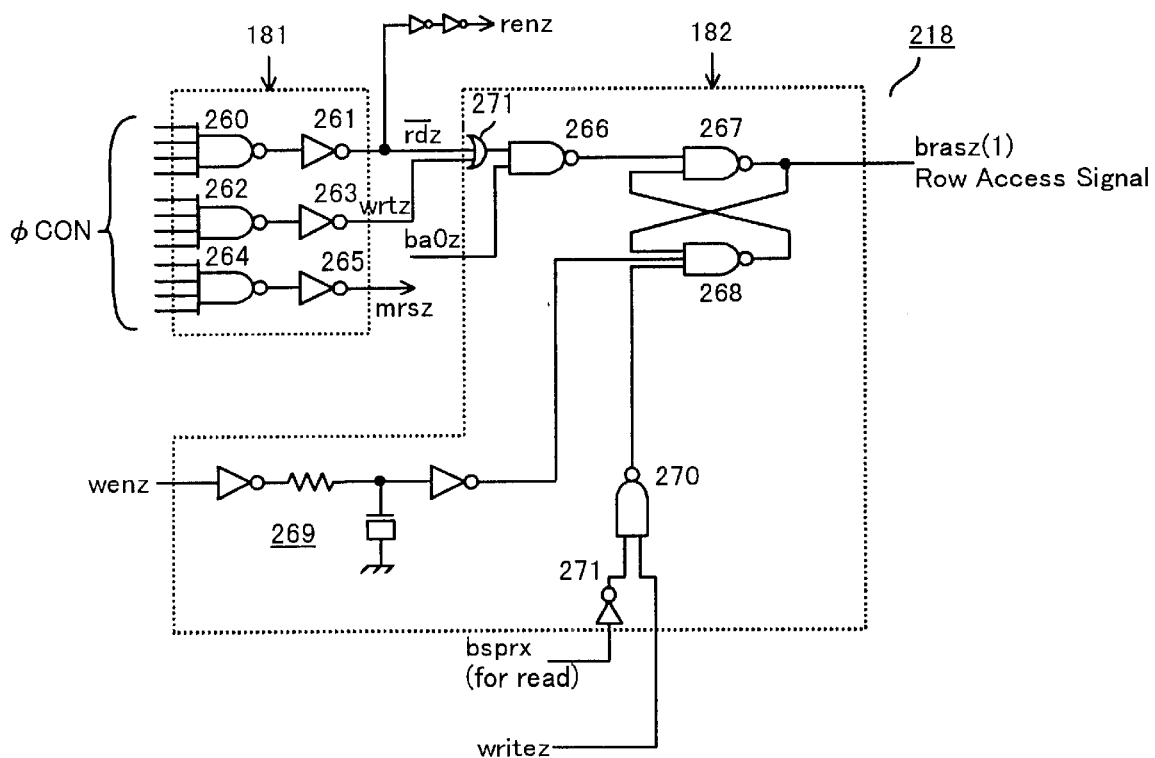
FIG. 28 is a schematic diagram of an RAS-CAS logic circuit.

FIG. 28 is a schematic diagram of an RAS/CAS logic circuit. The RAS/CAS logic circuit 218 has a command decoder 181 and a row access signal generator circuit 182. The command decoder 181 decodes a control signal ICON supplied from outside and fetched to the input buffer 214 to obtain internal mode signals. In the circuitry diagrammed in FIG. 28, a decoder comprising NAND gate 260 and inverter 261 generates a read mode signal rdz, a decoder comprising NAND gate 262 and inverter 263 generates a write mode signal wrtz, and a decoder comprising NAND gate 264 and inverter 265 generates a mode register setting signal mrsz. From the read mode signal rdz is generated the read-pipeline control signal renz described subsequently.

The row access signal generator circuit 182 in the RAS/CAS logic circuit 218 generates the active-state (high-level) row access signal brasz(1) from the write mode signal wrtz, the read mode signal rdz, and also a bank selection signal ba0z. When either the write mode signal wrtz or the read mode signal rdz is high and the bank selection signal ba0z is high, an RS-FF circuit comprising the NAND gates 267 and 268 is put into a set state by a low-level output from the NAND gate 266, and maintains the row access signal brasz(1) at the high level.

The set state in the RS-FF circuit in the row access signal generator circuit 182, in the write mode, follows the delay produced by a delay circuit 269, in response to the write-pipeline control signal wenz generated by the serial data detection circuit 250, and is reset after a prescribed delay time from when the pipeline switch is turned on. This same set state, in the read mode, is reset in response to a self-precharge signal bsprx generated by the second stage 2000, described subsequently. However, in the write mode, the resetting operation induced by the self-precharge signal bsprx is disabled by the signal writez, by the NAND gate 270. This self-precharge signal bsprx, as diagrammed in FIG. 26, is generated taking the logic in the logic circuit 254 and the read mode signal rdz. Accordingly, during a read operation, the self-precharge signal bsprx generated by the timing controller 228 in the second stage 2000 is supplied to the logic circuit 218.

Figure 29:
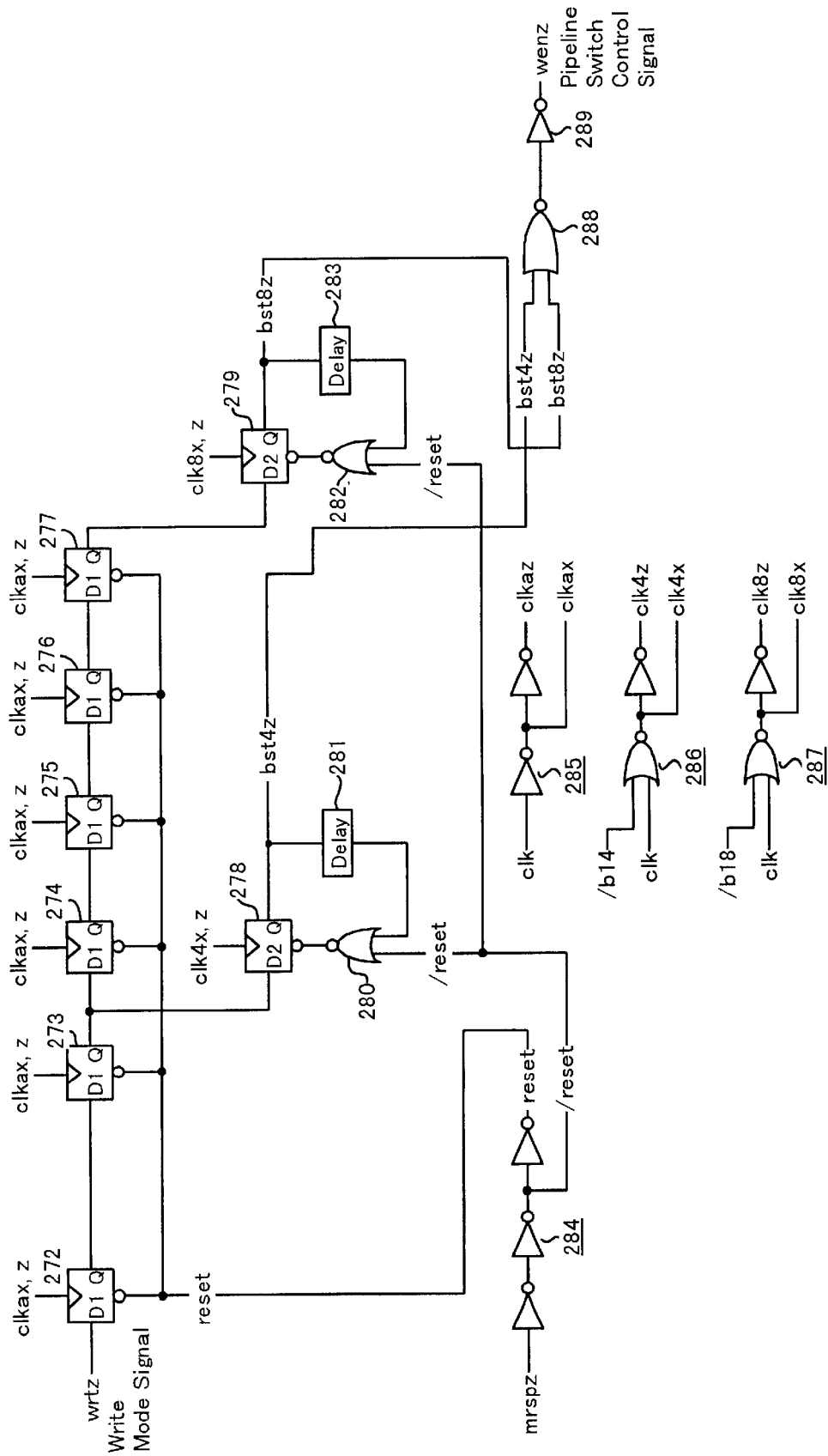
FIG. 29 is a schematic diagram of a serial data detection circuit.

FIG. 29 is a schematic diagram of a serial data detection circuit. The serial data detection circuit 250, in response to a write mode signal wrtz generated by the RAS/CAS logic circuit 218, counts out the beats in the clock signal clk corresponding to the burst length, and generates a write-pipeline control signal wenz. The example diagrammed in FIG. 29 is compatible with a burst length of either 4 or 8. The write mode signal wrtz is provided to the first-stage flip-flop in the chain of delaying flip-flops 272–279. The delaying flip-flops 272–277 fetch and output signals from the previous stage, according to complementary clock signals clkaz and clkax generated from the internal clock signal clk by a complementary clock signal generator unit 285. The delaying flip-flop 278, meanwhile, fetches and outputs signals from the previous stage, according to complementary clock signals clk4z and clk4x generated from a burst length setting signal /b14 and the internal clock signal clk by a complementary clock signal generator unit 286 when the burst length is 4. Similarly, the delaying flip-flop 279 fetches and outputs signals from the previous stage, according to complementary clock signals clk8z and clk8x generated from a burst length setting signal /b18 and the internal clock signal clk by a complementary clock signal generator unit 287 when the burst length is 8.

Accordingly, when the burst length is set at 4, the burst length setting signal /b14 goes high, making the complementary clock signals clk4z and clk4x effective. As a result, the chain of delaying flip-flops 272, 273, and 278, in response to the write mode signal wrtz, count off 3 beats of the internal clock signal clk and then generate the burst length signal bst4z. In response to this burst length signal bst4z, a synthesizing circuit comprising NOR gate 288 and inverter 289 generates a write-pipeline control signal wenz.

When the burst length is set at 8, on the other hand, the burst length setting signal /b18 goes high, making the complementary clock signals clk8z and clk8x effective. As a result, the 7-stage chain of delaying flip-flops 272, 273, 274, 275, 276, 277, and 279, in response to the write mode signal wrtz, count off 7 beats of the internal clock signal clk and then generate the burst length signal bst8z. In response to this burst length signal bst8z, the synthesizing circuit comprising NOR gate 288 and inverter 289 generates a write-pipeline control signal wenz.

As diagrammed in FIG. 25 and 27, the serial data detection circuit 250 begins counting clock beats in response to the write mode signal wrtz following the fetching of the first write datum D0 in response to the rising edge of the clock signal clk, wherefore the clock count value is 1 less than the burst length. The delaying flip-flops 272–279 are reset by set signals and reset signals generated by a set/reset signal generator unit 284. The burst length setting signals /b14z and /b18z can be set in the memory device by a mode register sequence, metal option, bonding option, or fuse option, etc. In the example diagrammed in FIG. 26, this is set in the mode register 220 by a mode register sequence.

Figure 30:
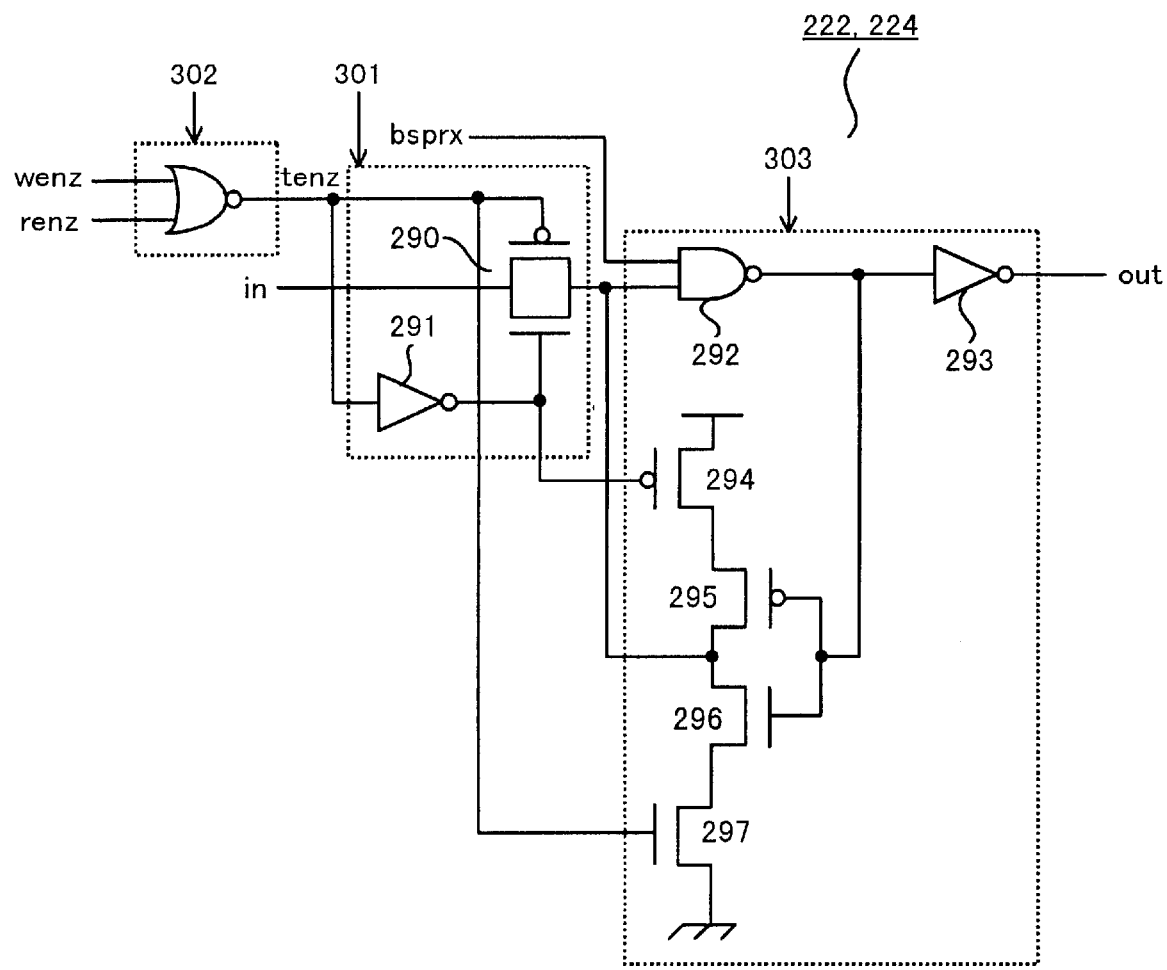
FIG. 30 is a schematic diagram of a pipeline switching circuit.

FIG. 30 is a schematic diagram for a pipeline switch. The pipeline switches 222 and 224 each have a transfer switch 301, a transfer controller 302, and a data latching unit 303. The transfer controller 302, configured by a NOR gate, inputs read-pipeline control signals renz and write-pipeline control signals wenz and, in response to one or other of these control signals, generates a low-level transfer control signal tenz. The transfer switch 301 has a CMOS transfer gate 290 and an inverter 291. When the transfer control signal tenz is low, the CMOS transfer gate 290 opens and the signal on the input terminal "in" is latched by the data latching unit 303.

In the data latching unit 303, a latching circuit is configured by a NAND gate 292 and an inverter comprising transistors 295 and 296. When the transfer control signal tenz is low, the transfer switch 301 opens, a P-channel transistor 294 and an N-channel transistor 297 turn off, and the latching state of the latching circuit is released. Accordingly, the output of the NAND gate 292 is determined according to the signal on the input terminal "in." Then, when the transfer control signal tenz goes high and the transfer switch 301 closes, the transistors 294 and 297 turn on and the latching state of the latching circuit is maintained.

In the data latching unit 303, moreover, the latching state is reset in response to the low level of the self-precharge signal bsprx supplied as a reset signal, and the signal level is forced to high on the output terminal "out."

On the address side of the pipeline switch 222, the NAND gate 292 is configured simply with an inverter, and no reset operation is performed by the supply of the self-precharge signal bsprx.

In this modification example, the serial-parallel converter circuit 240 can be implemented with the serial-parallel converter circuits 7 and 8 already described.

According to the first aspect of the present invention, a maximum value for the burst length settable in the burst length setting circuit is defined according to the clock frequency wherewith serial write data are fetched. That is, a control signal RASZ is generated after a certain fixed time has elapsed from the fetching of the command signal, and the maximum value of the settable burst length is limited according to the clock frequency so that all of the serial data are fetched into the device by the time that data in the memory cells are read into the sense amps. Accordingly, the semiconductor memory device of the present invention can accurately write all data in a burst length set under the limitation noted above.

The second aspect of the present invention makes it possible, furthermore, to write all the serial data in a burst length set discretionarily in the burst length setting circuit, irrespective of the clock frequency. More specifically, in this invention, during a data read operation, the control signal generator circuit outputs the control signal RASZ after a certain time has elapsed from the fetching of the read command, whereas, during a data write operation, a part or all of the write data in the burst length set discretionarily are fetched, and the control signal RASZ is output after a certain time based on burst length has elapsed thereafter. Accordingly, all of the data in the discretionarily settable burst length can be written, irrespective of the clock frequency. Also, high-speed data write and data read processing can be realized without imposing limitations on the settable burst length or on the clock frequency for fetching write data.

In the third aspect of the present invention, furthermore, when operating with the first circuit, a maximum value for the settable burst length is defined, compatible with the clock frequency, in the burst length setting circuit, so that all serial data are fetched into the device by the time that the control signal RASZ is generated after a specific fixed time has elapsed since the timing wherewith the command signal was fetched, and the memory core has been activated. When operating with the second circuit, on the other hand, during a data read operation, the control signal generator circuit outputs the control signal RASZ after a certain fixed time has elapsed from the fetching of the read command, whereas, during a data write operation, a part or all of the write data in the burst length set discretionarily are fetched, and the control signal RASZ is output after a certain time based on burst length has elapsed thereafter. Accordingly, with either circuit, all of the data-in the set burst length can be accurately written.

As based on the present invention, moreover, by making the time from command input to memory core activation the same during both read and write operations, the command cycle during both operations can be made a certain number of clock beats that is as short as it is possible to make it.

What is claimed is:

1. A semiconductor memory device operating in synchronization with a clock signal, comprising:

a control signal generator circuit for generating a control signal for activating a memory core, in response to fetched command signal; and a burst length setting circuit for setting a burst length; wherein:

said control signal generator circuit outputs said control signal in response to timing wherewith said command signal is fetched, during data read and data write operations, with substantially the same timing irrespective of said burst length.

2. A semiconductor memory device operating in synchronization with a clock signal, comprising:

a control signal generator circuit for generating a control signal for activating a memory core, based on fetched command signal; wherein said control signal generator circuit, when said command signal is a read command signal, outputs said control signal in response to timing wherewith the read command signal is fetched, and when said command signal is a write command signal, outputs said control signal in response to timing wherewith n'th write datum in sequence of write data corresponding to a burst length is fetched.

3. The semiconductor memory device according to claim 2, further comprising a burst length setting circuit for setting burst length, wherein:

said control signal generator circuit outputs said control signal with timing that accords with set burst length.

4. The semiconductor memory device according to claim 3, wherein:

said control signal generator circuit, when fetching all write data in set burst length within a prescribed certain time is possible, outputs said control signal after said certain time from timing wherewith 1st bit of said write data was fetched.

5. The semiconductor memory device according to claim 3, wherein:

said control signal generator circuit has a burst counter for counting numbers of bits of write data fetched, and, when fetching all write data in set burst length within a prescribed certain time is not possible, outputs said control signals in response to timing wherewith write data after 2nd datum of write data in said burst length are fetched.

6. The semiconductor memory device according to claim 4, wherein:

interval from timing wherewith a write command signal is fetched until timing wherewith next read command signal is fetched is made identical to interval from timing wherewith a read command signal is fetched until timing wherewith next read command signal is fetched.

7. The semiconductor memory device according to claim 6, wherein:

when said command signal is a read command signal, time from timing wherewith said read command signal is fetched until data are read is longer than said interval.

8. A semiconductor memory device operating in synchronization with a clock signal, comprising:

a control signal generator circuit for generating control signal for activating a memory core, in response to fetched command signal; and a burst length setting circuit for setting burst length; wherein:

said control signal generator circuit has:

a first circuit for outputting said control signal during data read and data write operations in response to timing wherewith said command signal is fetched, with timing unrelated to said burst length; and a second circuit for outputting said control signal during data read operation in response to timing wherewith said command signal is fetched, and for outputting said control signal during data write operation in response to timing wherewith n'th write datum in sequence of write data is fetched; and said first circuit and said second circuit are switched, according to frequency of said clock signal and set burst length.

9. The semiconductor memory device according to claim 8, wherein:

said burst length setting circuit, when operating with said first circuit, makes maximum value of said burst length a fixed value that accords with frequency of said clock signal.

10. A memory circuit having a prescribed burst length and operating in synchronization with a clock signal, comprising:

a memory core having a plurality of memory cells and a sense amp group connected to those memory cells via bit lines; and a control signal generator circuit for generating control signal for activating said memory core in response to fetched command signal; wherein:

said control signal generator circuit, during data read and data write operations, outputs said control signal in response to timing wherewith said command signals are fetched, after a fixed delay time, irrespective of said burst length; and command cycle therein is a constant number of clocks when said data read and data write operations are performed in random fashion.

11. A memory circuit having a prescribed burst length and operating in synchronization with a clock signal, comprising:

a first stage for decoding command signal;

a second stage, including a memory core having a plurality of memory cells and a sense amp group connected to those memory cells via bit lines, for performing pipeline operation with said first stage; and a control signal generator circuit for generating control signal for activating said memory core, based on fetched command signal; wherein:

said control signal generator circuit, when said command signal is a read command signal, outputs said control signal after a certain delay time following fetch of that read command signal, and, when said command signal is a write command signal, outputs said control signal after a delay time determined according to said burst length, following fetch of that write command signal.

12. A memory circuit for writing prescribed numbers of bits of write data, determined according to burst length, in response to write command, comprising:

a first stage for inputting, and then holding, row addresses and column addresses simultaneously with said write command;

a second stage having a memory core, connected to said first stage via a pipeline switch, wherein said row addresses and column addresses are decoded, and wherein word line and sense amps are activated;

a third stage for inputting said write data serially and supplying said write data to said memory core in parallel; and a serial data detection circuit for generating write-pipeline control signal for making said pipeline switch conduct, after said prescribed number of bits of write data has been inputted.

13. The memory circuit according to claim 12, wherein:

said first stage generates write mode signal in response to said write command, and said serial data detection circuit, in response to said write mode signal, counts clocks for controlling input timing of said write data, and, after counting a specified number of said clocks, generates said write-pipeline control signal.

14. The memory circuit according to claim 13, wherein:

said first stage generates read-pipeline control signal in response to read command, and said pipeline switch conducts in response to said read-pipeline control signal.

15. The memory circuit according to claim 12, wherein:

in response to said write-pipeline control signal, said first stage is reset after a prescribed delay time.

16. The memory circuit according to claim 12, wherein:

said pipeline switch opens in response to said write-pipeline control signal, and, in conjunction therewith, said third stage outputs said prescribed number of bits of write data to said memory core, in response to serial-parallel conversion signal generated by said serial-parallel detection circuit.

17. A memory device for performing read operation and write operation in response to read command and write command, comprising:

a first stage for inputting and holding row addresses and column addresses simultaneously with said write command, and decoding said command;

a second stage, connected to said first stage via a pipeline switch, having a memory core wherein said row addresses and column addresses are decoded, and wherein word line and sense amps are activated;

a third stage for inputting write data serially, supplying said write data to said memory core in parallel, outputting read data in parallel from said memory core in response to said read command, and outputting said read data serially; and a serial data detection circuit for generating write-pipeline control signal for making said pipeline switch conduct, after prescribed number of bits of write data has been input, in response to said write command.

* * * * *